(12) United States Patent
Pan et al.

(10) Patent No.: US 11,569,234 B2
(45) Date of Patent: Jan. 31, 2023

(54) SEMICONDUCTOR DEVICE STRUCTURE AND METHODS OF FORMING THE SAME

(71) Applicant: TAIWAN SEMICONDUCTOR MANUFACTURING CO., LTD., Hsinchu (TW)

(72) Inventors: Kuan-Ting Pan, Taipei (TW); Kuo-Cheng Chiang, Hsinchu County (TW); Shi-Ning Ju, Hsinchu (TW); Yi-Ruei Jhan, Keelung (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 173 days.

(21) Appl. No.: 17/027,322

(22) Filed: Sep. 21, 2020

(65) Prior Publication Data
US 2022/0093595 A1    Mar. 24, 2022

(51) Int. Cl.
*H01L 27/092* (2006.01)
*H01L 29/417* (2006.01)
(Continued)

(52) U.S. Cl.
CPC ........ *H01L 27/0924* (2013.01); *H01L 21/743* (2013.01); *H01L 21/8238* (2013.01); *H01L 21/823418* (2013.01); *H01L 21/823481* (2013.01); *H01L 21/823878* (2013.01); *H01L 29/41791* (2013.01); *H01L 29/6653* (2013.01); *H01L 29/6656* (2013.01);
(Continued)

(58) Field of Classification Search
CPC .......... H01L 27/0924; H01L 29/41791; H01L 29/66795; H01L 29/785; H01L 29/6656; H01L 21/823431; H01L 21/823821; H01L 21/823468; H01L 21/823418; H01L 21/823814; H01L 21/823481; H01L 21/823878; H01L 21/823828
See application file for complete search history.

(56) References Cited

U.S. PATENT DOCUMENTS 9,093,530 B2   7/2015   Huang et al.
9,171,929 B2   10/2015  Lee et al.
(Continued)

*Primary Examiner* — Tuan A Hoang
(74) *Attorney, Agent, or Firm* — NZ Carr Law Office

(57) ABSTRACT

A semiconductor device structure, along with methods of forming such, are described. The structure includes a semiconductor fin including a first surface, a second surface opposite the first surface, a third surface connecting the first surface and the second surface, and a fourth surface opposite the third surface. The semiconductor device structure further includes a gate electrode layer disposed adjacent the first, third, and fourth surfaces of the semiconductor fin, a first source/drain epitaxial feature in contact with the semiconductor fin, and a first inner spacer disposed between the first source/drain epitaxial feature and the gate electrode layer. The first inner spacer is in contact with the first source/drain epitaxial feature, and the first inner spacer comprises a first material. The semiconductor device structure further includes a first spacer in contact with the first inner spacer, and the first spacer comprises a second material different from the first material.

20 Claims, 60 Drawing Sheets

(51) Int. Cl.
*H01L 29/78* (2006.01)
*H01L 29/66* (2006.01)
*H01L 21/8238* (2006.01)
*H01L 21/74* (2006.01)
*H01L 21/8234* (2006.01)
*H01L 21/768* (2006.01)

(52) U.S. Cl.
CPC .. *H01L 29/66545* (2013.01); *H01L 29/66795* (2013.01); *H01L 29/785* (2013.01); *H01L 21/76895* (2013.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 * | 2/2017 | Yeo ................... H01L 29/42392 |
| 9,576,814 B2 | 2/2017 | Wu et al. |
| 9,601,342 B2 | 3/2017 | Lee et al. |
| 9,608,116 B2 | 3/2017 | Ching et al. |
| 10,573,755 B1 * | 2/2020 | Frougier ........... H01L 29/66742 |
| 2019/0067120 A1 * | 2/2019 | Ching ................ H01L 27/0924 |

* cited by examiner

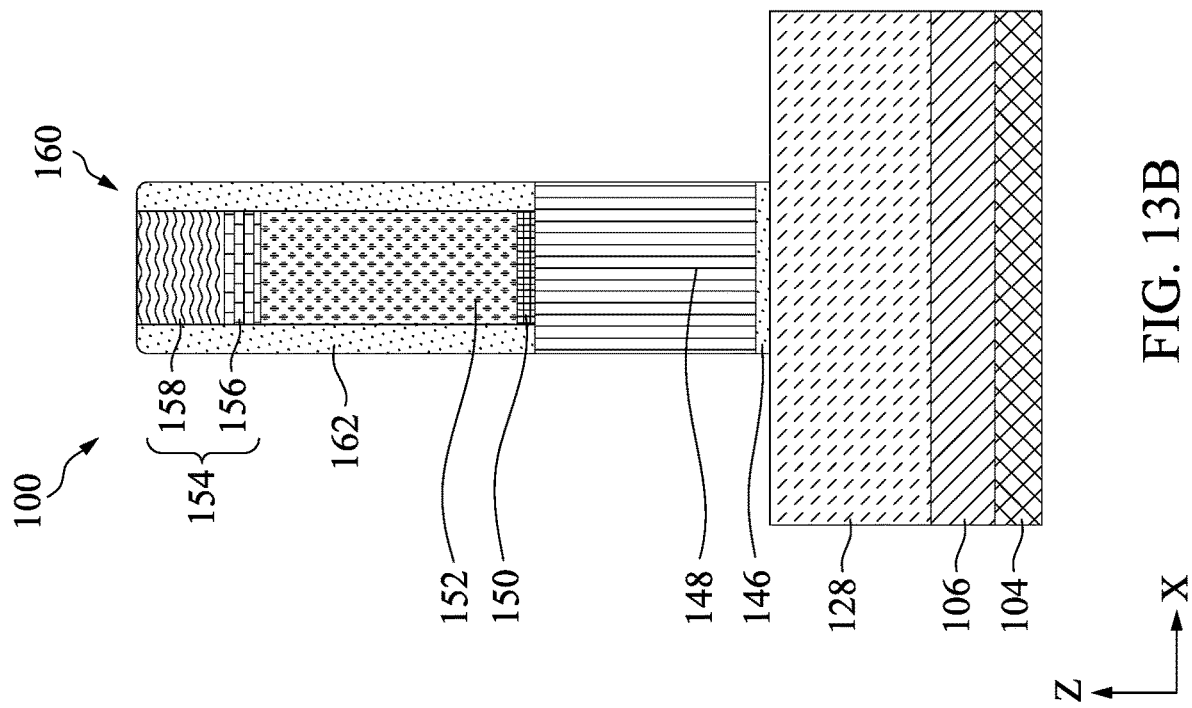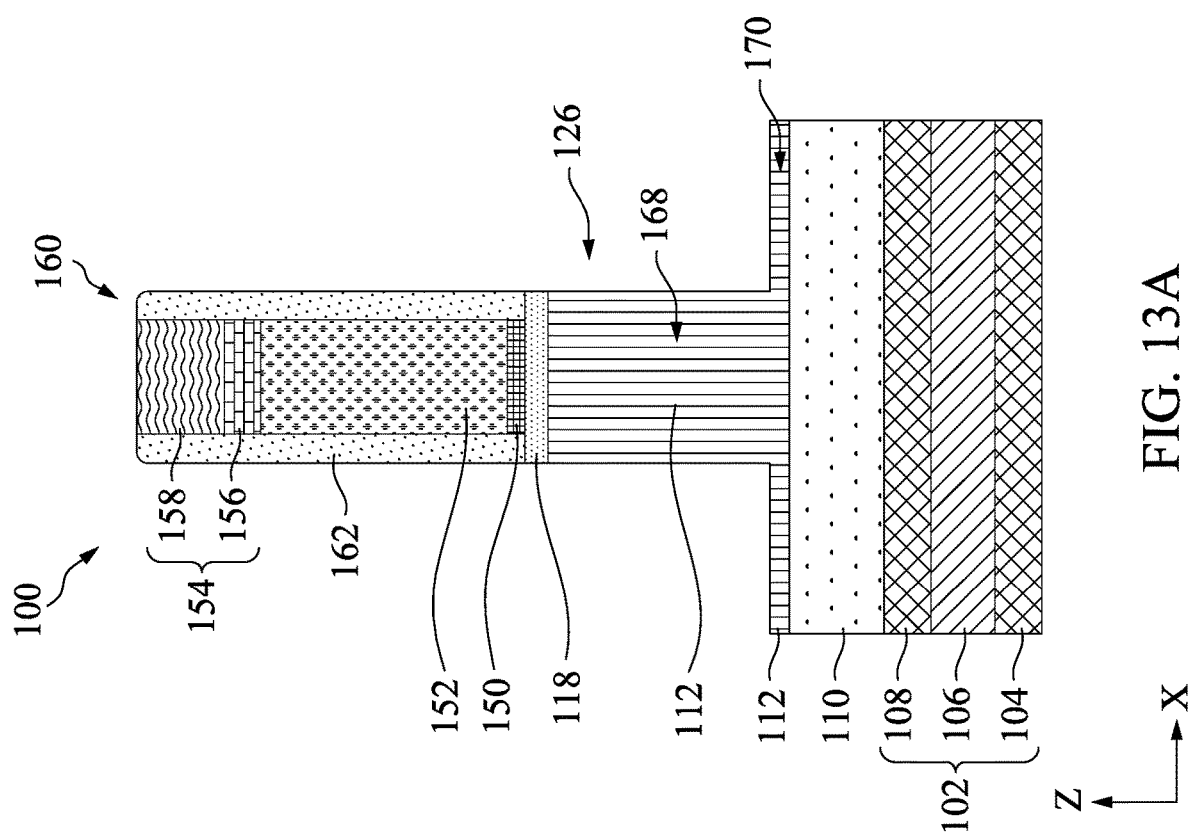

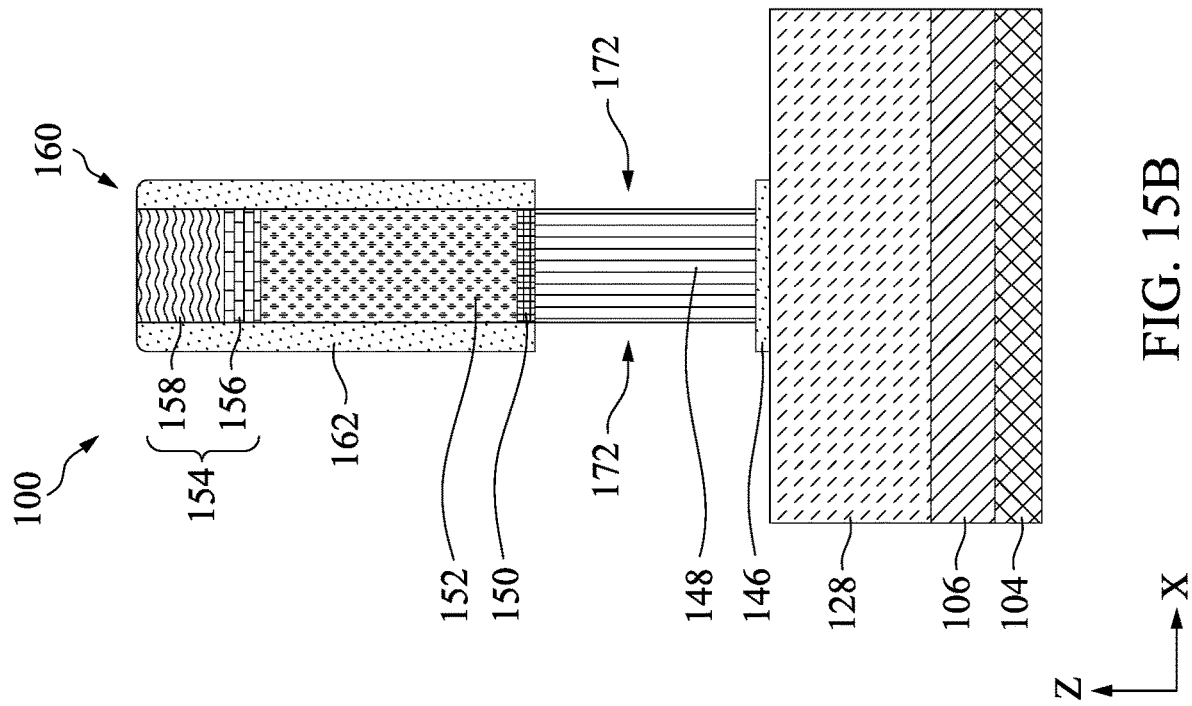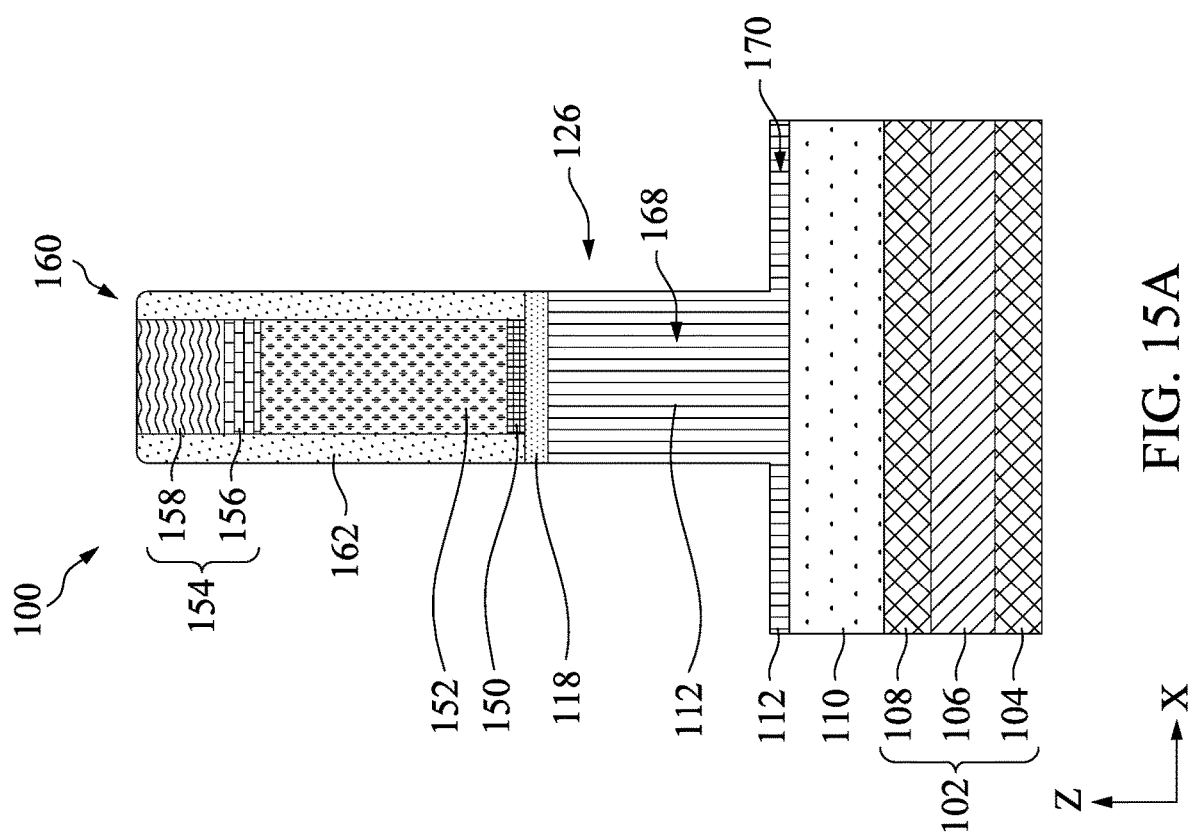

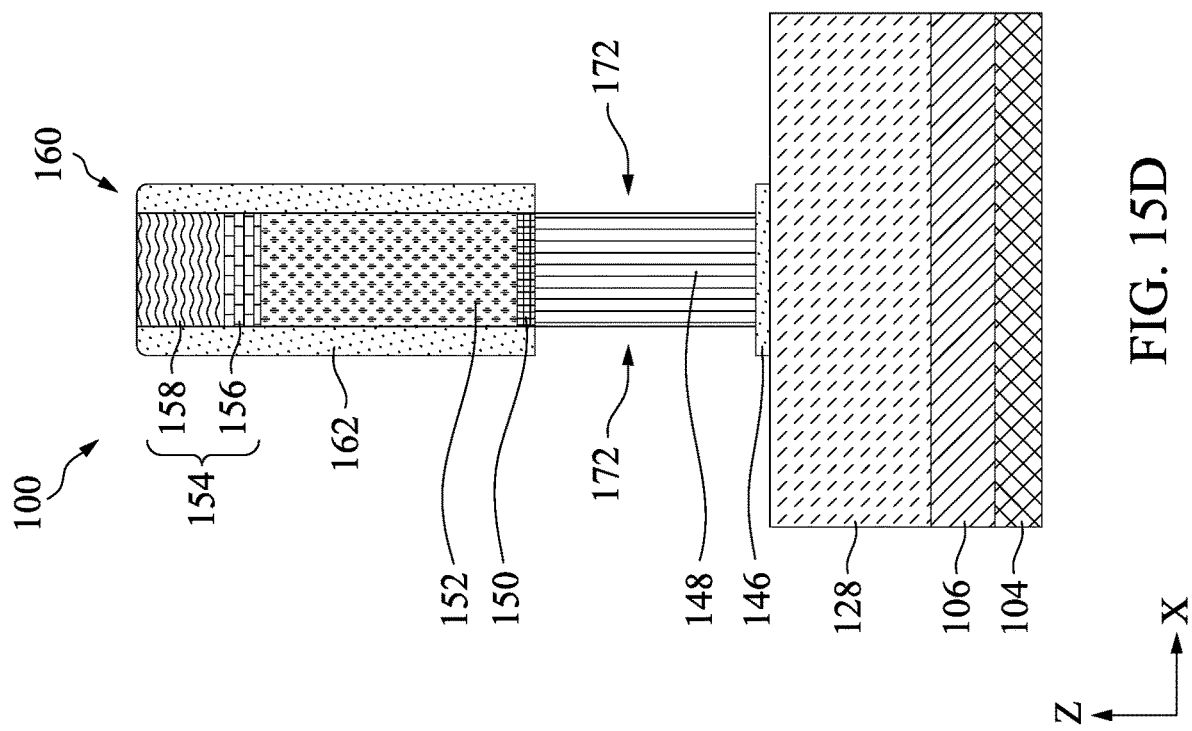
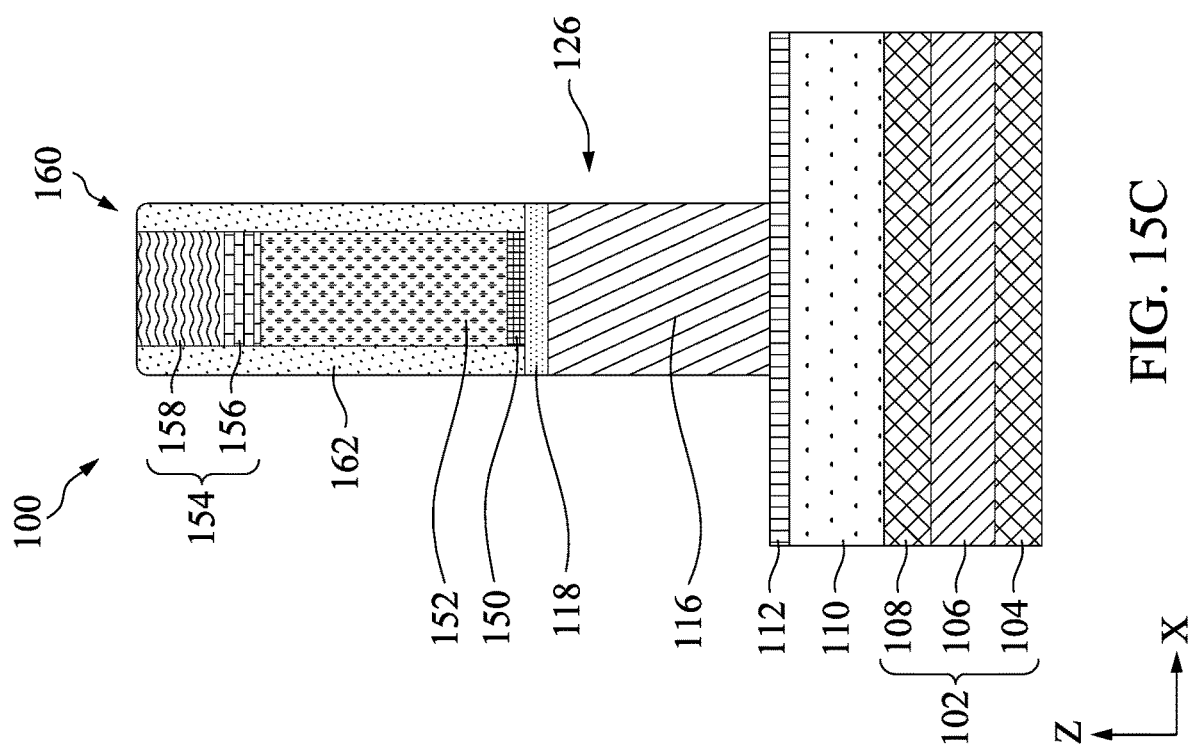

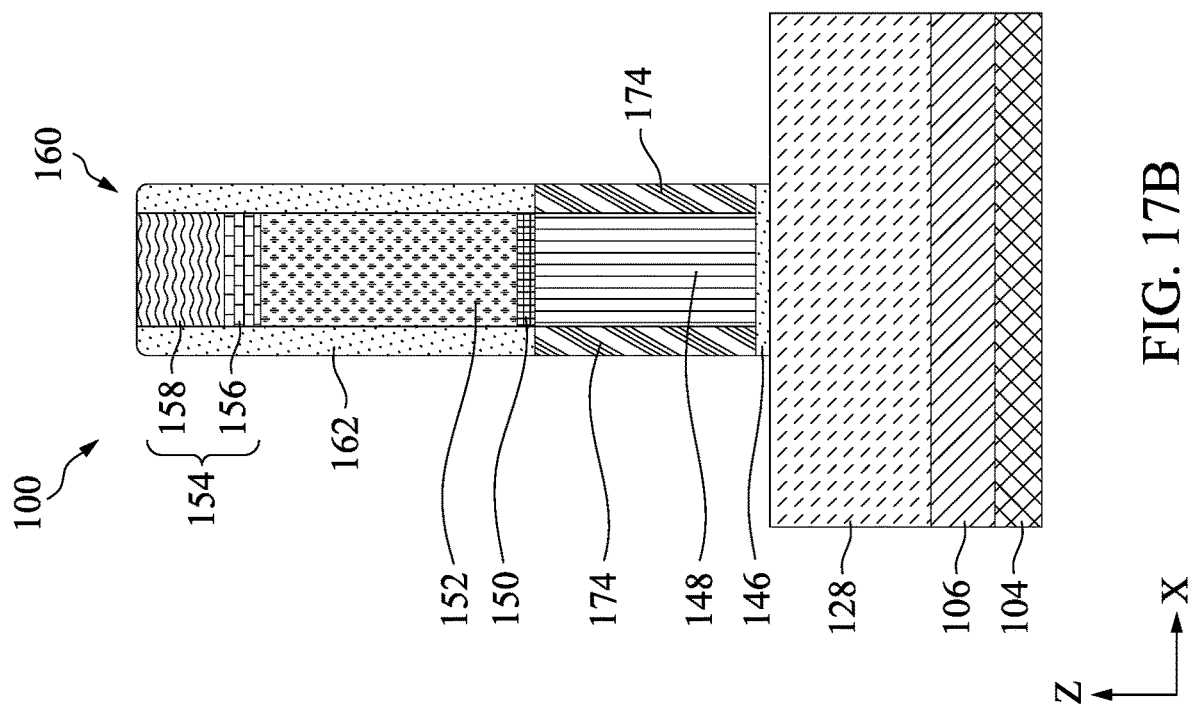
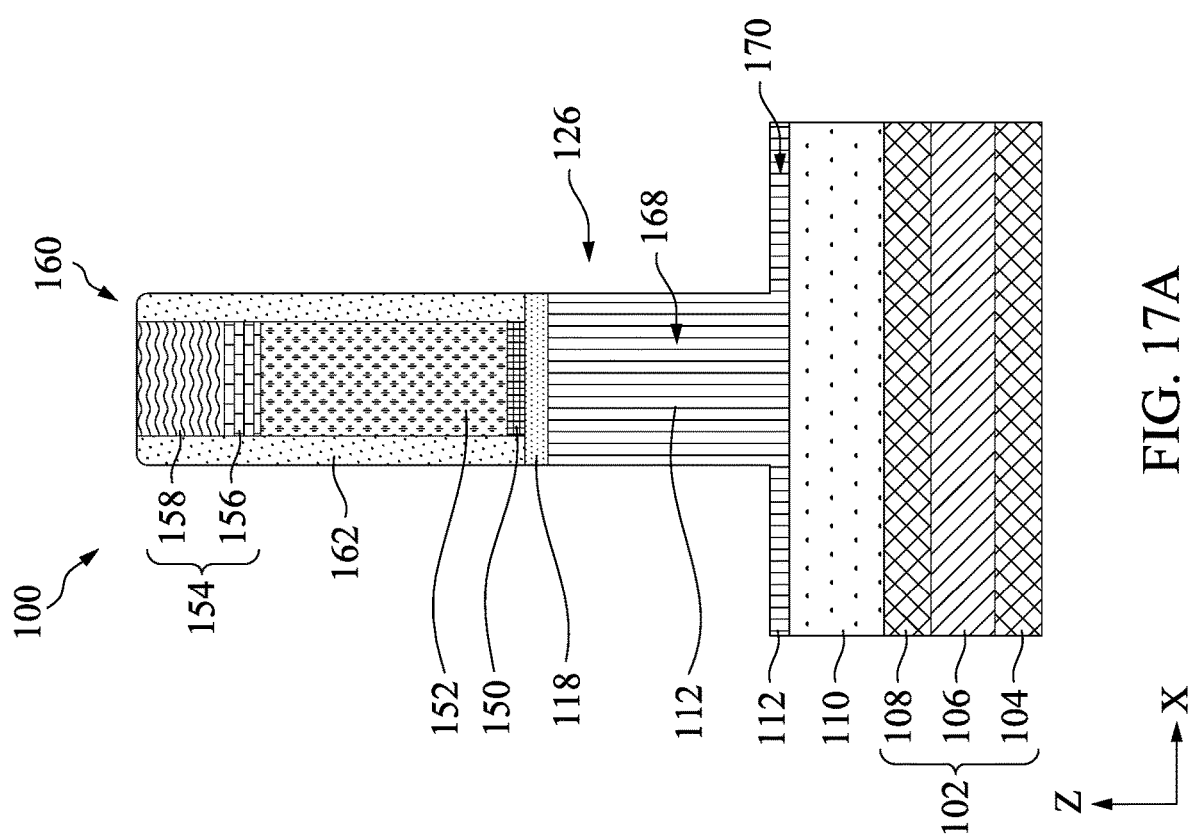
FIG. 17B
FIG. 17A

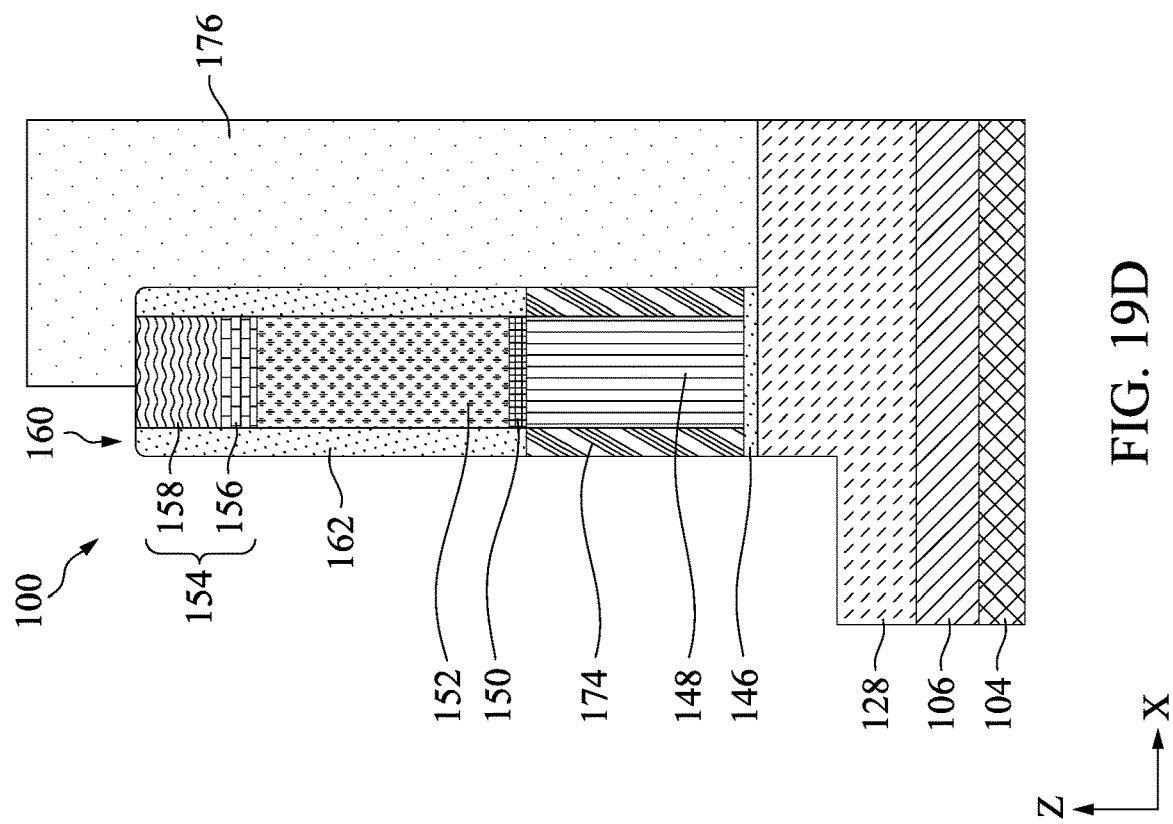
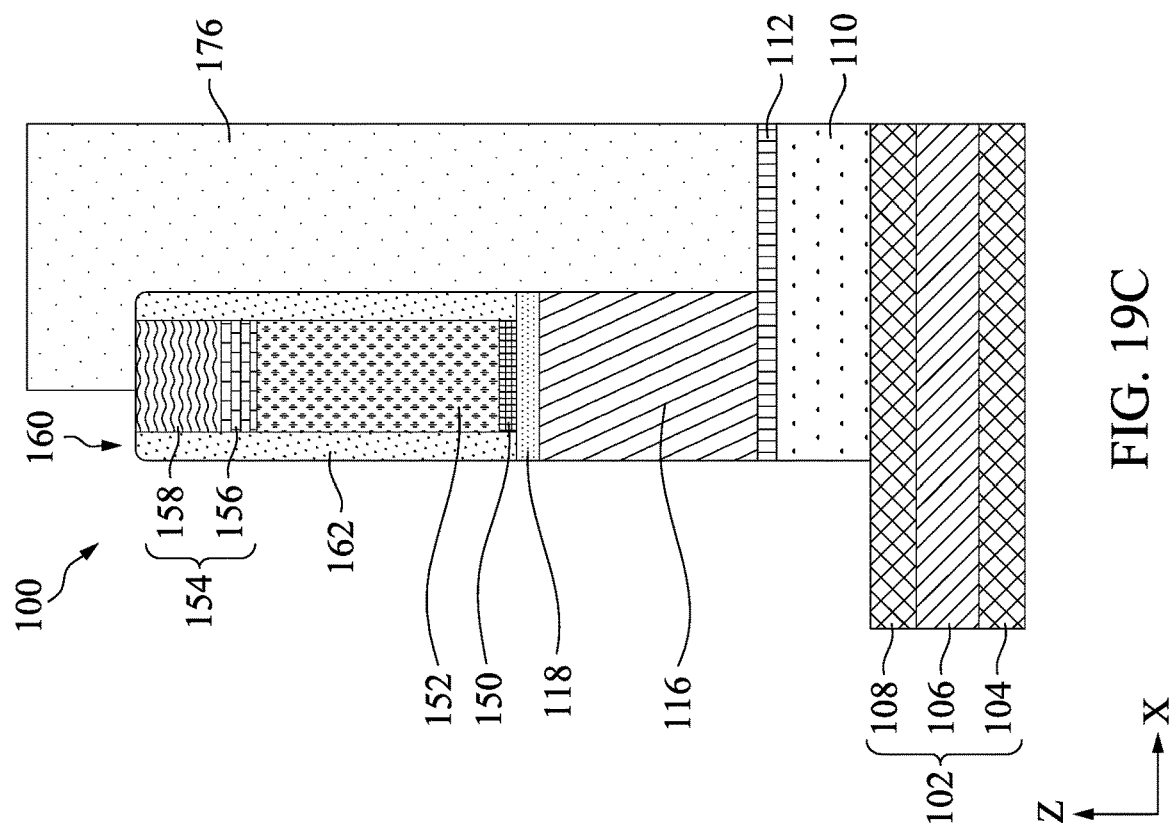
FIG. 19D
FIG. 19C

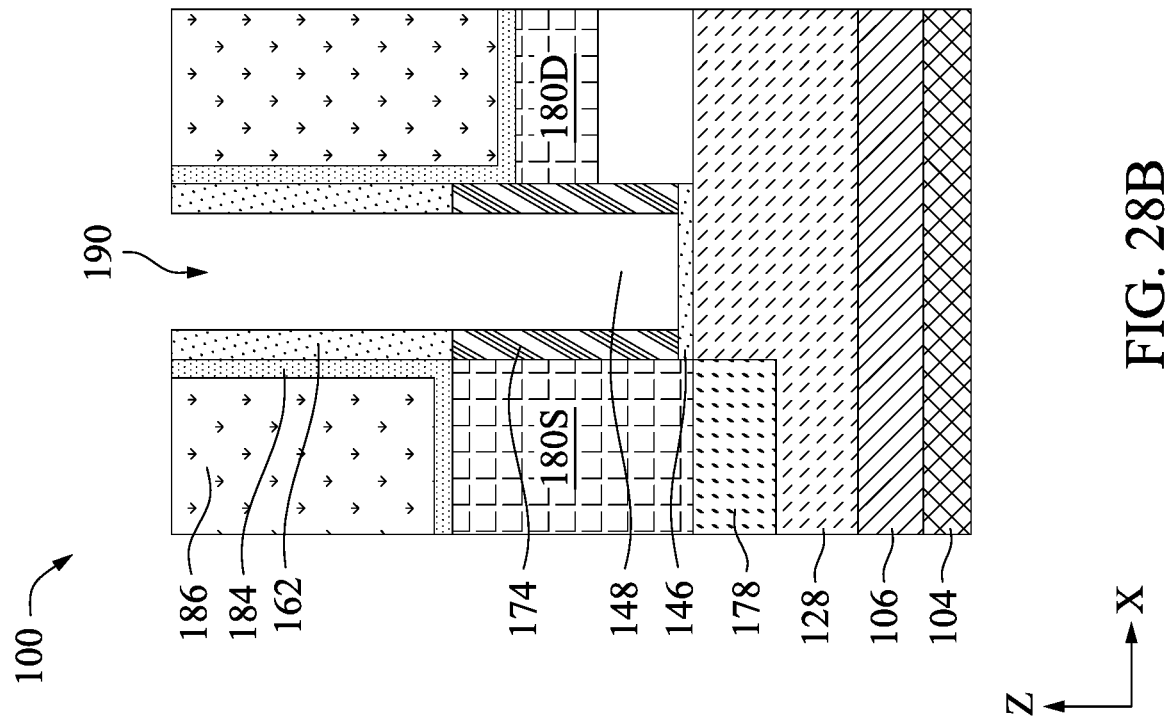
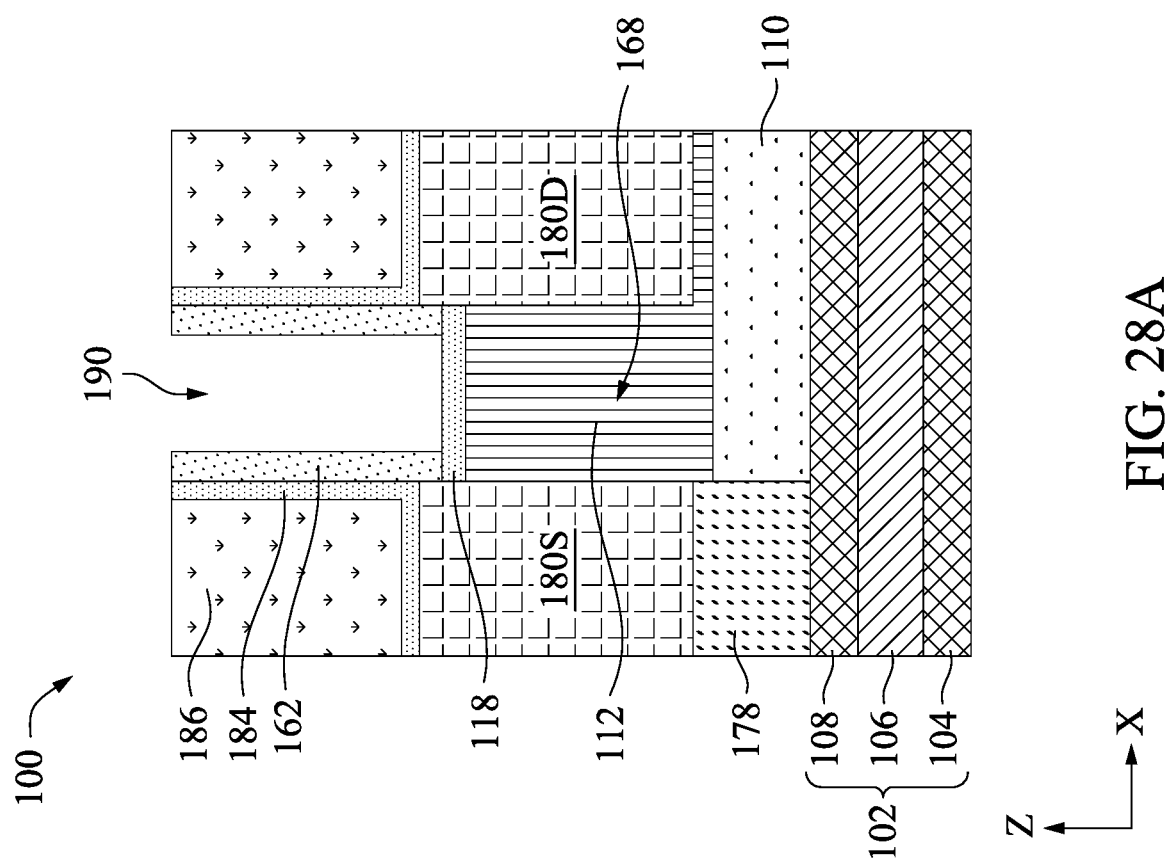
FIG. 28B
FIG. 28A

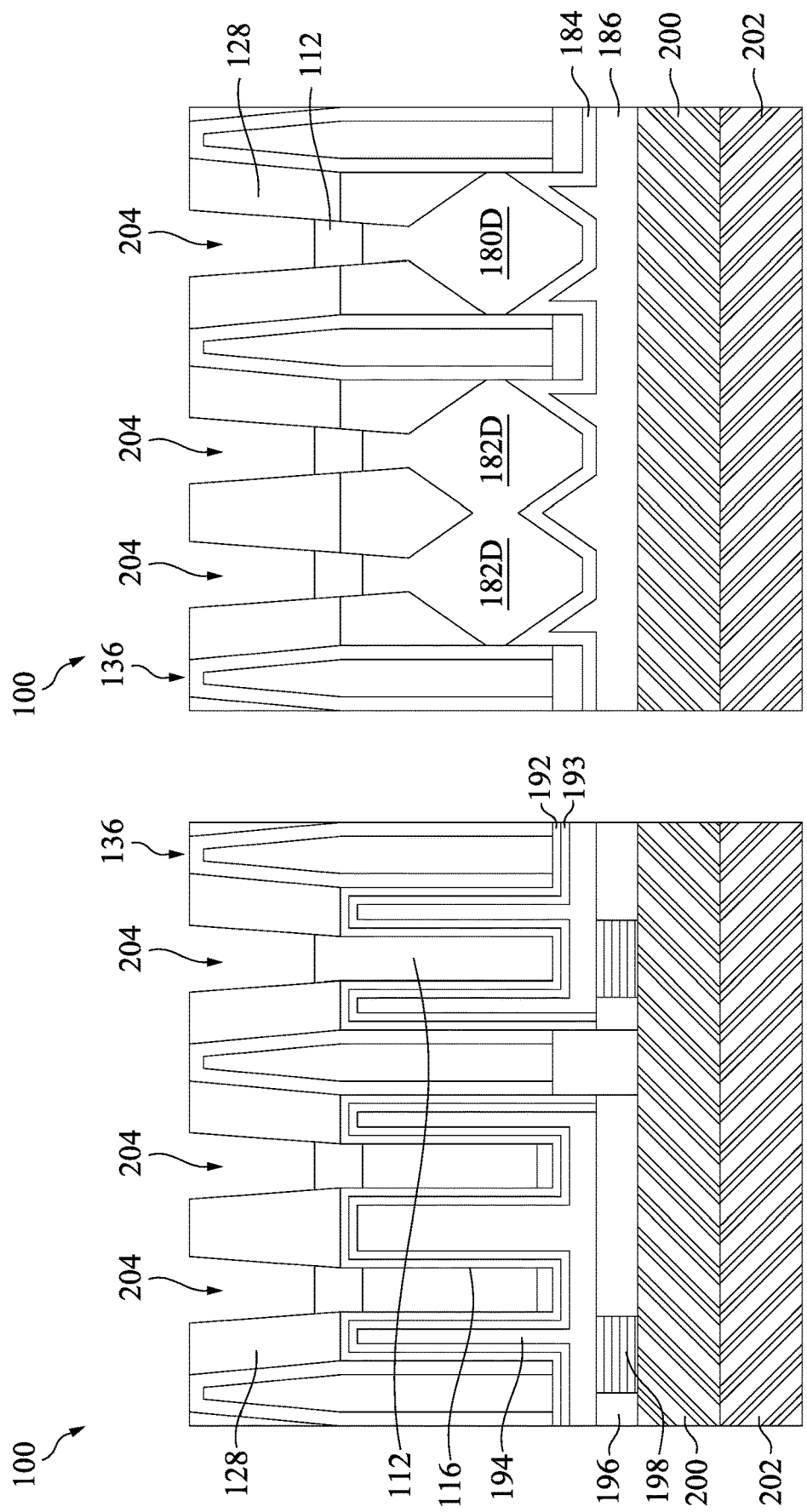

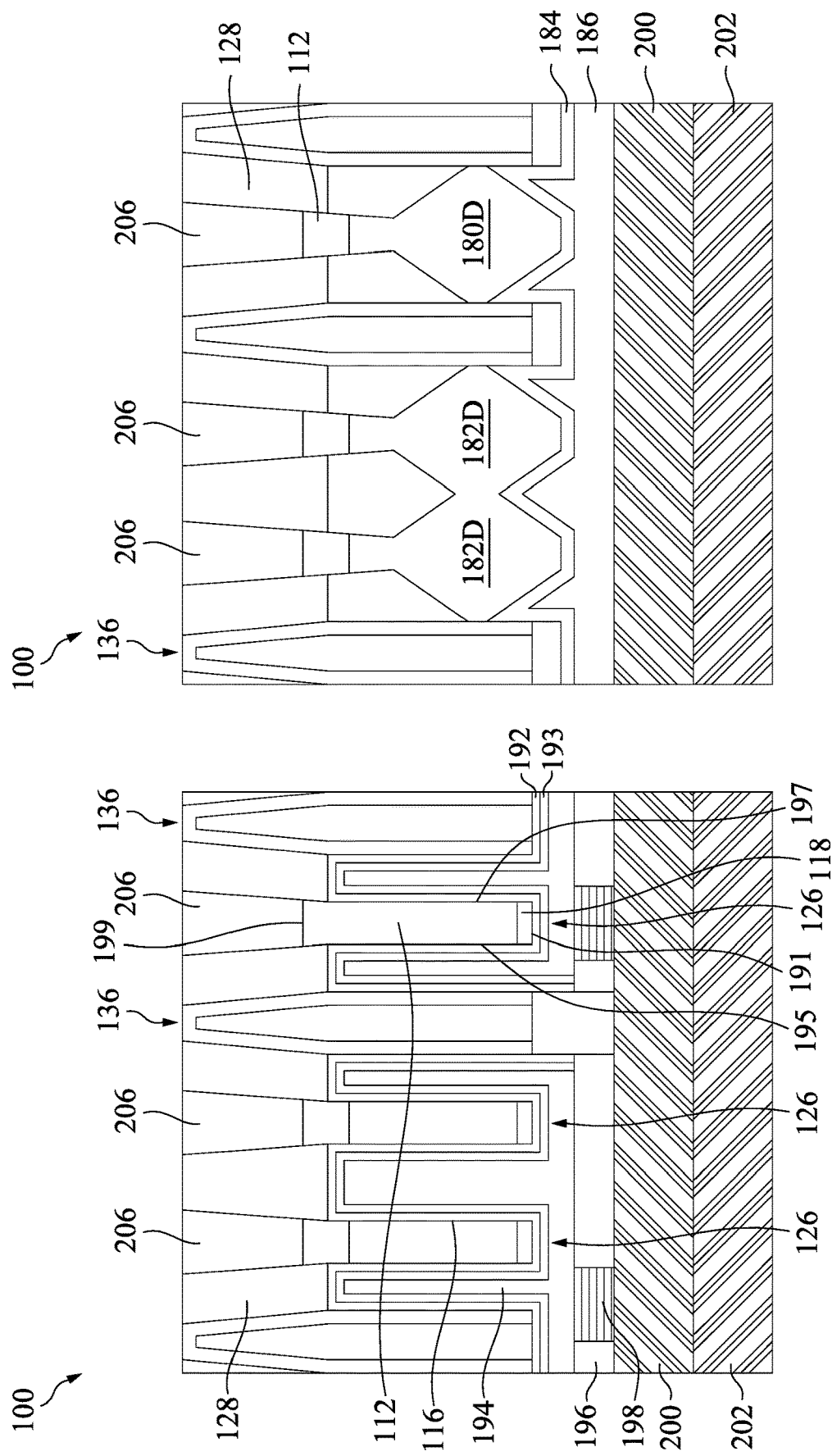

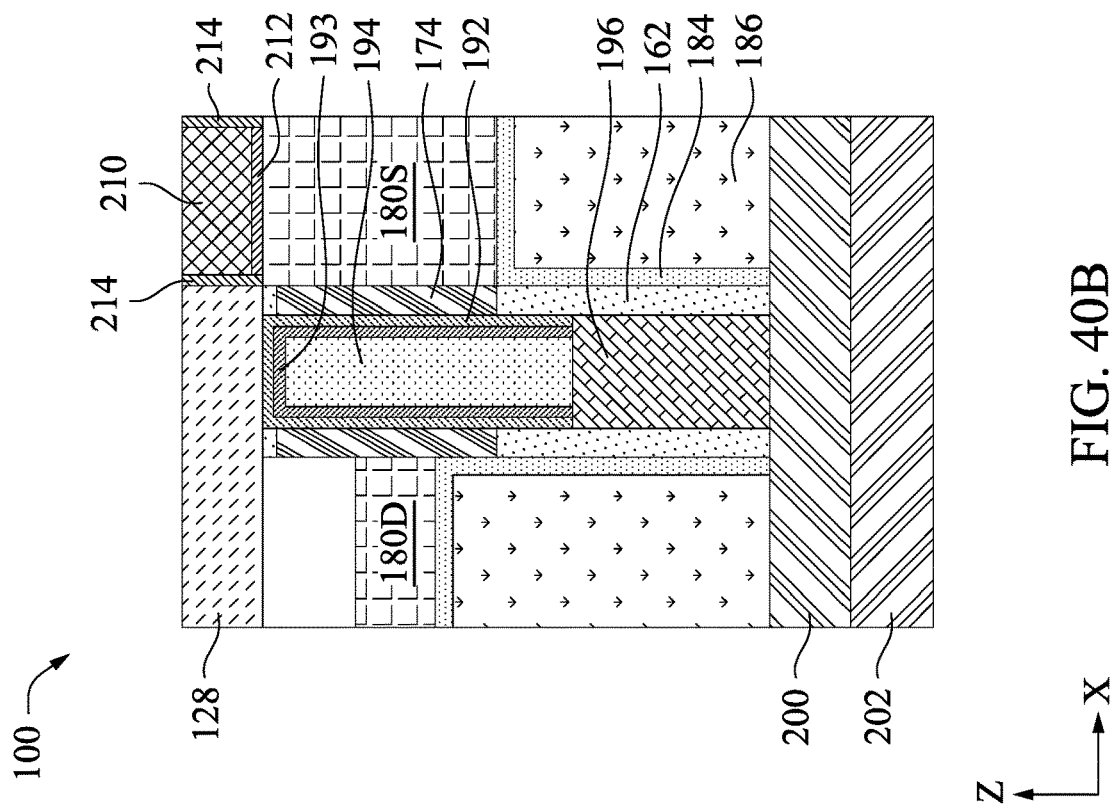
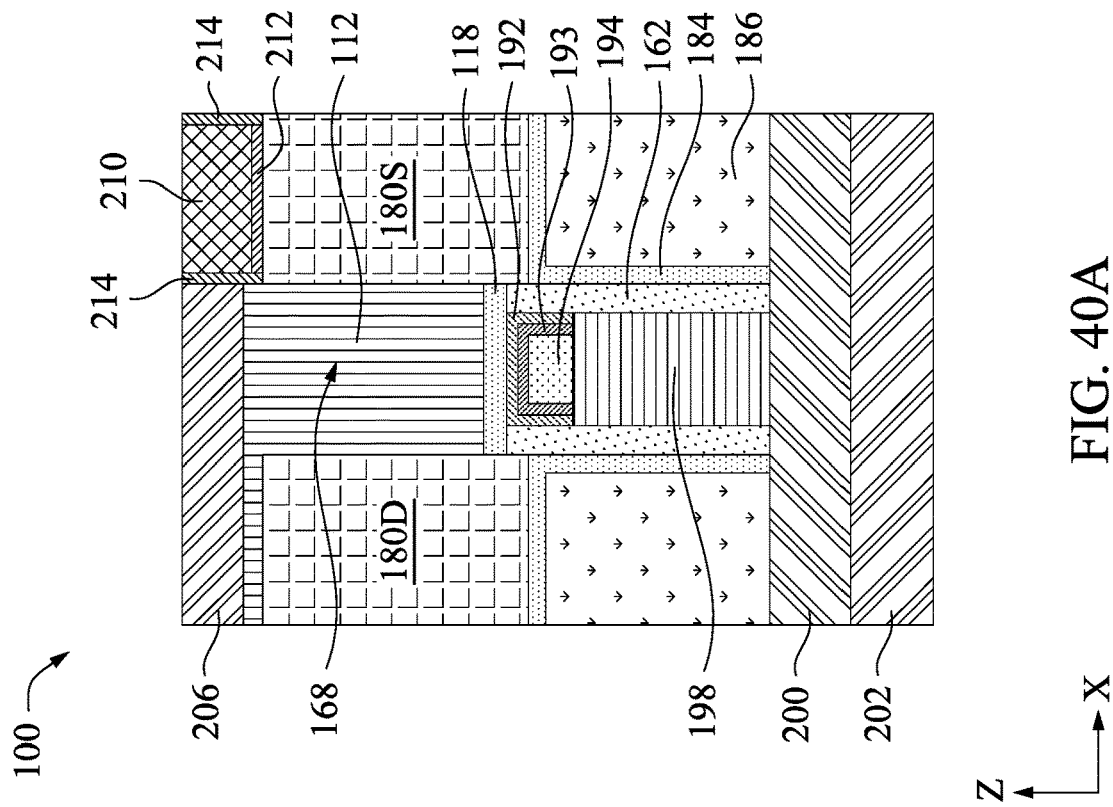
FIG. 40A
FIG. 40B

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A-13D are cross-sectional side views of the stage of manufacturing the semiconductor device structure of FIG. 12 taken along lines A-A, B-B, C-C, D-D of FIG. 10, respectively, in accordance with some embodiments.

FIGS. 15A-15D are cross-sectional side views of the stage of manufacturing the semiconductor device structure of FIG. 14 taken along lines A-A, B-B, C-C, D-D of FIG. 10, respectively, in accordance with some embodiments.

FIGS. 17A-17D are cross-sectional side views of the stage of manufacturing the semiconductor device structure of FIG. 16 taken along lines A-A, B-B, C-C, D-D of FIG. 10, respectively, in accordance with some embodiments.

FIGS. 19A-19D are cross-sectional side views of the stage of manufacturing the semiconductor device structure of FIG. 18 taken along lines A-A, B-B, C-C, D-D of FIG. 10, respectively, in accordance with some embodiments.

FIGS. 28A-28D are cross-sectional side views of the stage of manufacturing the semiconductor device structure of FIG. 27 taken along lines A-A, B-B, C-C, D-D of FIG. 10, respectively, in accordance with some embodiments.

FIGS. 35A-35C are cross-sectional side views of one of various stages of manufacturing the semiconductor device structure, in accordance with some embodiments.

FIGS. 39A-39C are cross-sectional side views of one of various stages of manufacturing the semiconductor device structure, in accordance with some embodiments.

FIGS. 40A-40D are cross-sectional side views of the stage of manufacturing the semiconductor device structure of FIGS. 39A-39C taken along lines A-A, B-B, C-C, D-D of FIG. 10, respectively, in accordance with some embodiments.

DETAILED DESCRIPTION

Figure 1:
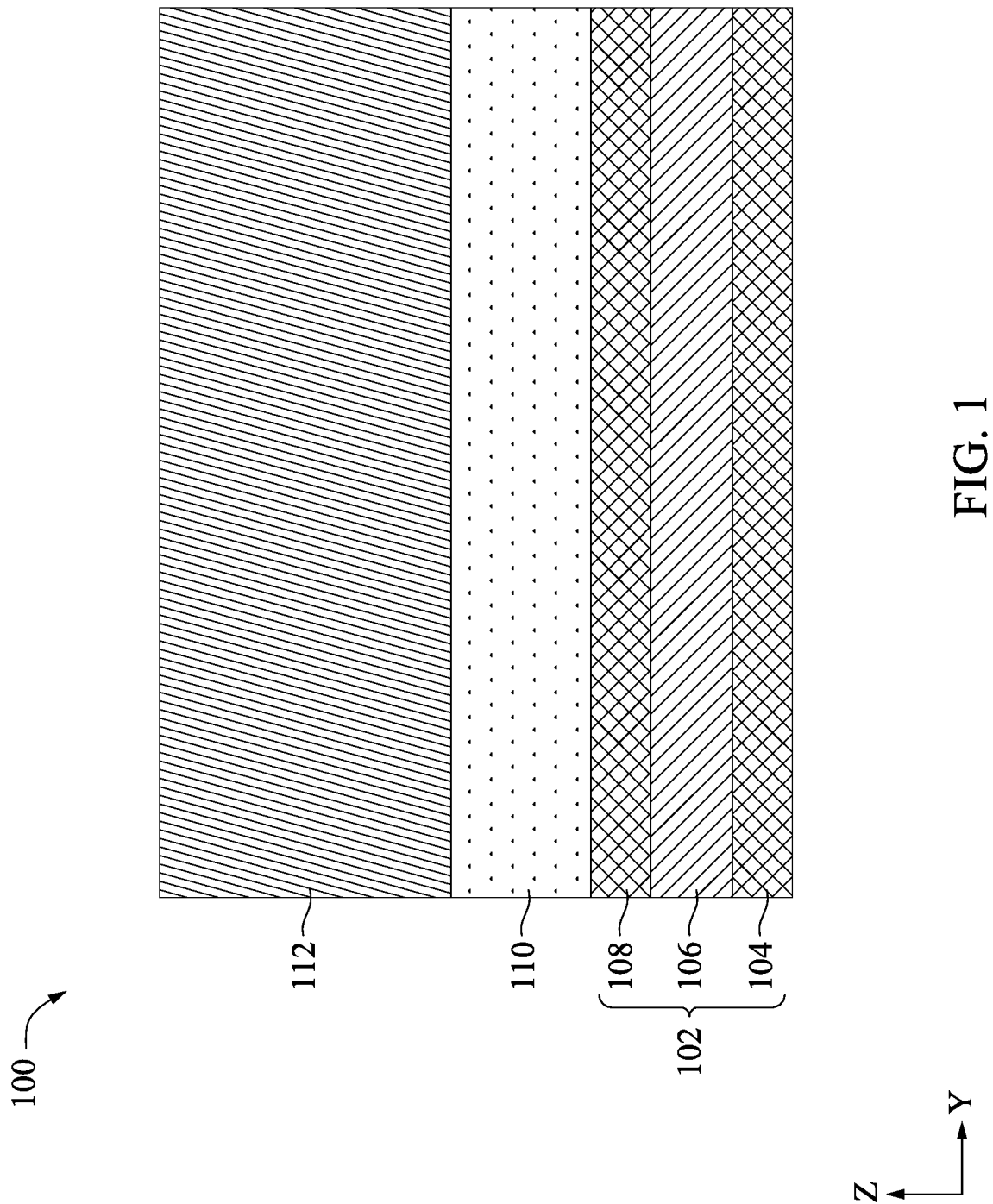
FIGS. 1-10 are cross-sectional side views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-42 show exemplary sequential processes for manufacturing a semiconductor device structure 100, in accordance with some embodiments. It is understood that additional operations can be provided before, during, and after processes shown by FIGS. 1-42 and some of the operations described below can be replaced or eliminated, for additional embodiments of the method. The order of the operations/processes may be interchangeable.

FIGS. 1-10 are cross-sectional side views of various stages of manufacturing a semiconductor device structure 100, in accordance with some embodiments. As shown in FIG. 1, a sacrificial semiconductor layer 110 is formed on a substrate 102, and a semiconductor layer 112 is formed on the sacrificial semiconductor layer 110. The substrate 102 may include a first semiconductor layer 104, a second semiconductor layer 108, and a dielectric layer 106 between the first semiconductor layer 104 and the second semiconductor layer 108. The first and second semiconductor layers 104, 108 may each include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). The dielectric layer 106 may include any suitable dielectric material, such as an oxide. In some embodiments, the substrate 102 is a silicon-on-insulator (SOI) substrate, and the first and second semiconductor layers 104, 108 each include silicon. The sacrificial semiconductor layer 110 may include a semiconductor material having different etch selectivity than the semiconductor material of the semiconductor layer 112. In some embodiments, the sacrificial semiconductor layer 110 includes SiGe, and the semiconductor layer 112 includes Si. The sacrificial semiconductor layer 110 and the semiconductor layer 112 each may be epitaxial grown. In some embodiments, the epitaxial growths of the sacrificial semiconductor layer 110 and the semiconductor layer 112 may be performed by a molecular beam epitaxy (MBE) process, a metalorganic chemical vapor deposition (MOCVD) process, and/or other suitable epitaxial growth processes.

Figure 2:
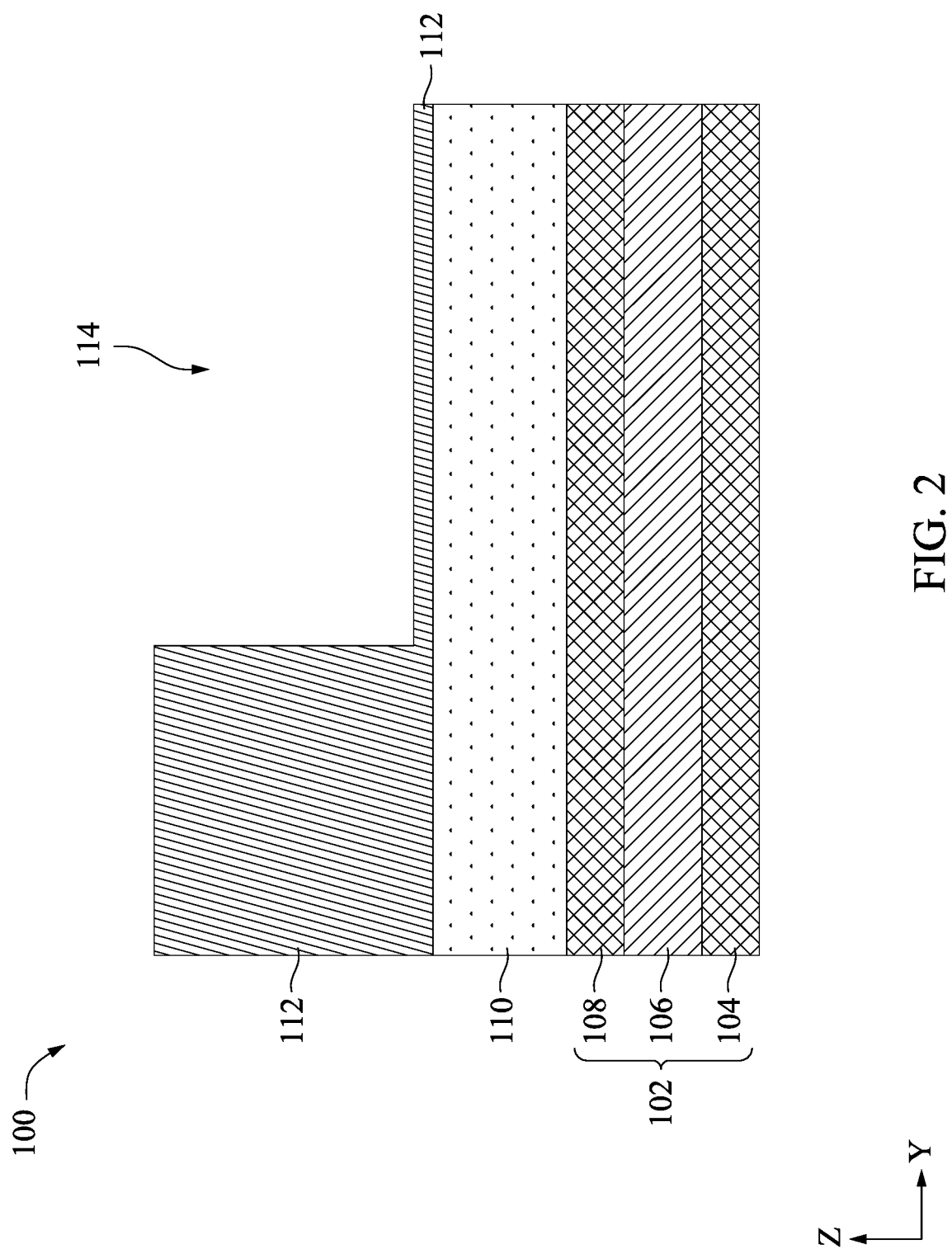

As shown in FIG. 2, a portion of the semiconductor layer 112 is removed to form an opening 114. The removal of the portion of the semiconductor layer 112 may be performed by any suitable process, such as a dry etch, a wet etch, or a combination thereof. The removal process does not expose the sacrificial semiconductor layer 110. Thus, the opening 114 may have a bottom that is the semiconductor layer 112, as shown in FIG. 2. Prior to removing the portion of the semiconductor layer 112, a patterned mask (not shown) may be formed on the portion of the semiconductor layer 112 that is not removed, while exposing the portion of the semiconductor layer 112 to be removed. The mask may be removed subsequently by any suitable removal process.

Figure 3:
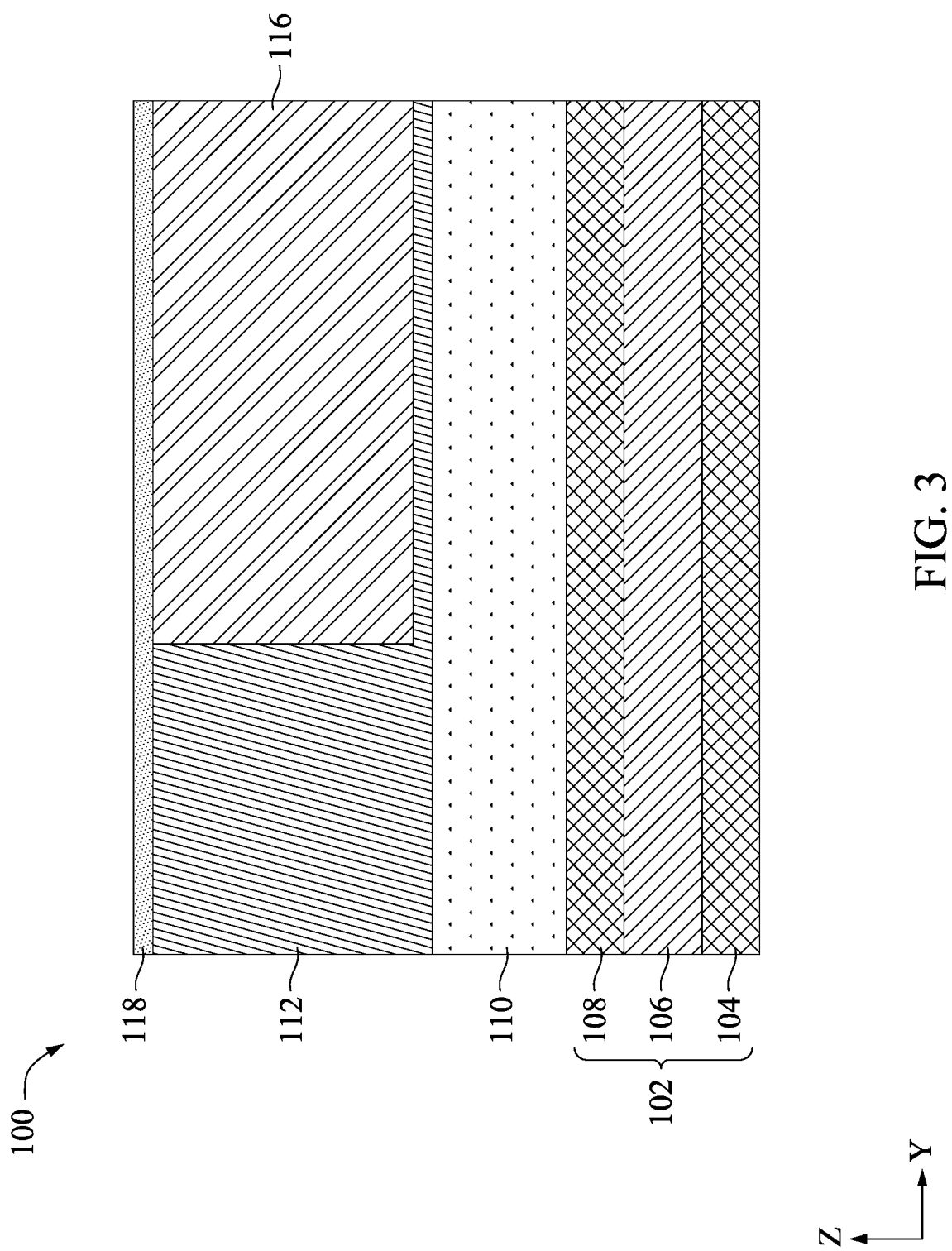

A semiconductor layer 116 is formed in the opening 114, as shown in FIG. 3. The semiconductor layer 116 may include a material different from the semiconductor material of the semiconductor layer 112. In some embodiments, the semiconductor device structure 100 includes fin field effect transistors (FinFETs), the semiconductor layer 112 may be one or more channel regions for n-type field effect transistors (NFET), and the semiconductor layer 116 may be one or more channel regions for p-type field effector transistors (PFET). In some embodiments, the semiconductor layer 112 includes Si, and the semiconductor layer 116 includes SiGe. The semiconductor layer 116 may be formed by any suitable process, such as CVD, MBE, or MOCVD. The semiconductor layer 116 may be formed in the opening 114 (FIG. 2) and on the semiconductor layer 112, and a planarization process may be performed to expose the semiconductor layer 112. The planarization process may be any suitable process, such as chemical mechanical polish (CMP). As a result of the planarization process, the semiconductor layer 112 and the semiconductor layer 116 may be coplanar. A cap layer 118 may be formed on the semiconductor layer 112 and the semiconductor layer 116, as shown in FIG. 3. The cap layer 118 may include a semiconductor material. In some embodiments, the cap layer 118 includes the same material as the semiconductor layer 112. The cap layer 118 may protect the semiconductor layer 116 during subsequent processes. The cap layer 118 may have a thickness along the Z direction ranging from about 1 nm to about 5 nm. If the thickness of the cap layer 118 is less than about 1 nm, the semiconductor layer 116 may not be sufficiently protected by the cap layer 118 during subsequent processes. If the thickness of the cap layer 118 is greater than about 5 nm, the manufacturing cost is increased without significant advantage.

Figure 4:
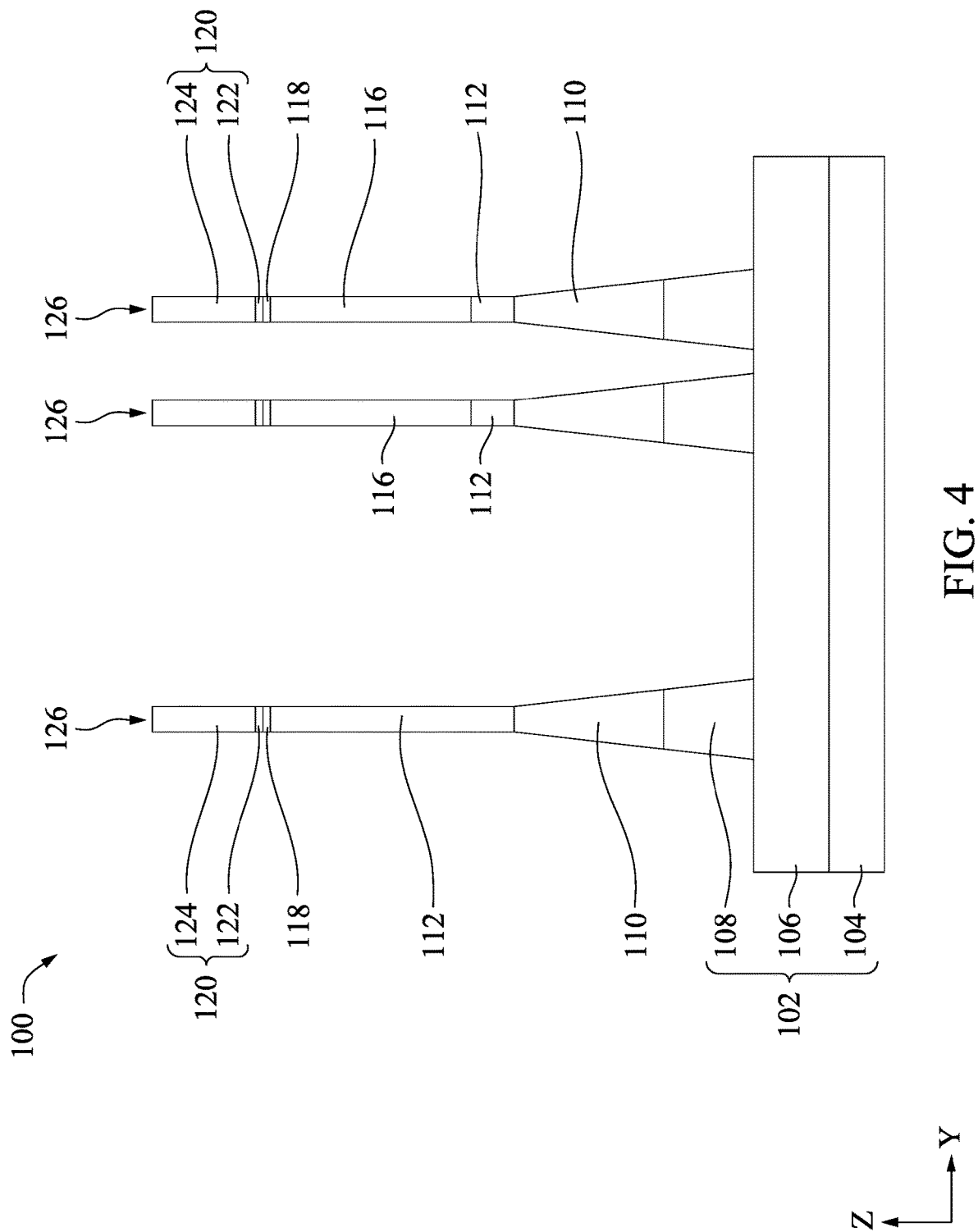

As shown in FIG. 4, a plurality of fins 126 are formed. The fins 126 may be semiconductor fins that include one or more semiconductor layers. One or more fins 126 may include a NFET channel region (i.e., the semiconductor layer 112). One or more fins 126 may include a PFET channel region (i.e., the semiconductor layer 116). Each fin 126 may include the second semiconductor layer 108, the sacrificial semiconductor layer 110, the semiconductor layer 112, the cap layer 118, and a mask structure 120. The fins 126 with PFET channel regions may further include the semiconductor layers 116. The two fins 126 with PFET channel regions each includes the semiconductor layer 116, which is the channel region, and the semiconductor layer 112 to protect the semiconductor layer 116 during the subsequent removal of the sacrificial semiconductor layer 110. The thickness along the Z direction of the semiconductor layer 112 in contact with the semiconductor layer 116 may range from about 1 nm to about 20 nm. If the thickness of the semiconductor layer 112 is less than about 1 nm, the semiconductor layer 116 may not be sufficiently protected by the semiconductor layer 112 during subsequent processes. If the thickness of the semiconductor layer 116 is greater than about 20 nm, the manufacturing cost is increased without significant advantage. The thickness of the semiconductor layer 112 in contact with the semiconductor layer 116 may be defined during the removal of a portion of the semiconductor layer 112 shown in FIG. 2.

Each fin 126 may have an upper portion having a substantially constant width along the Y direction and a lower portion having varying widths along the Y direction. In some embodiments, two or more etch processes are performed to form the fin 126. For example, the upper portion of the fin 126 is a result of a physical etch process, and the lower portion of the fin 126 is a result of a chemical etch process.

The fins 126 may be patterned by any suitable method. For example, the fins 126 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, the mask structure 120 is formed over the cap layer 118. The mask structure 120 may include an oxygen-containing layer 122 and a nitrogen-containing layer 124. The oxygen-containing layer 122 may be a pad oxide layer, such as a $SiO_2$ layer. The nitrogen-containing layer 124 may be a pad nitride layer, such as $Si_3N_4$. The mask structure 120 may be formed by any suitable deposition process, such as chemical vapor deposition (CVD) process. The mask structure 120 may be patterned by the aforementioned one or more photolithography processes, and the pattern may be transferred to the layers below to form the fins 126 by one or more etch processes. The one or more etch processes can include dry etch, wet etch, and/or other suitable processes. As shown in FIG. 4, one fin 126 with NFET channel region and two fins 126 with PFET channel regions are formed, however, the number of the fins 126 with NFET channel region and PFET channel regions are not limited to one and two, respectively. The distance between the fin 126 with the NFET channel region and the fin 126 with the PFET channel region is greater than the distance between fins 126 with PFET channel regions. The number and arrangement of fins 126 with NFET and PFET channel regions are for illustration purpose and are not intended to be limiting.

Figure 5:
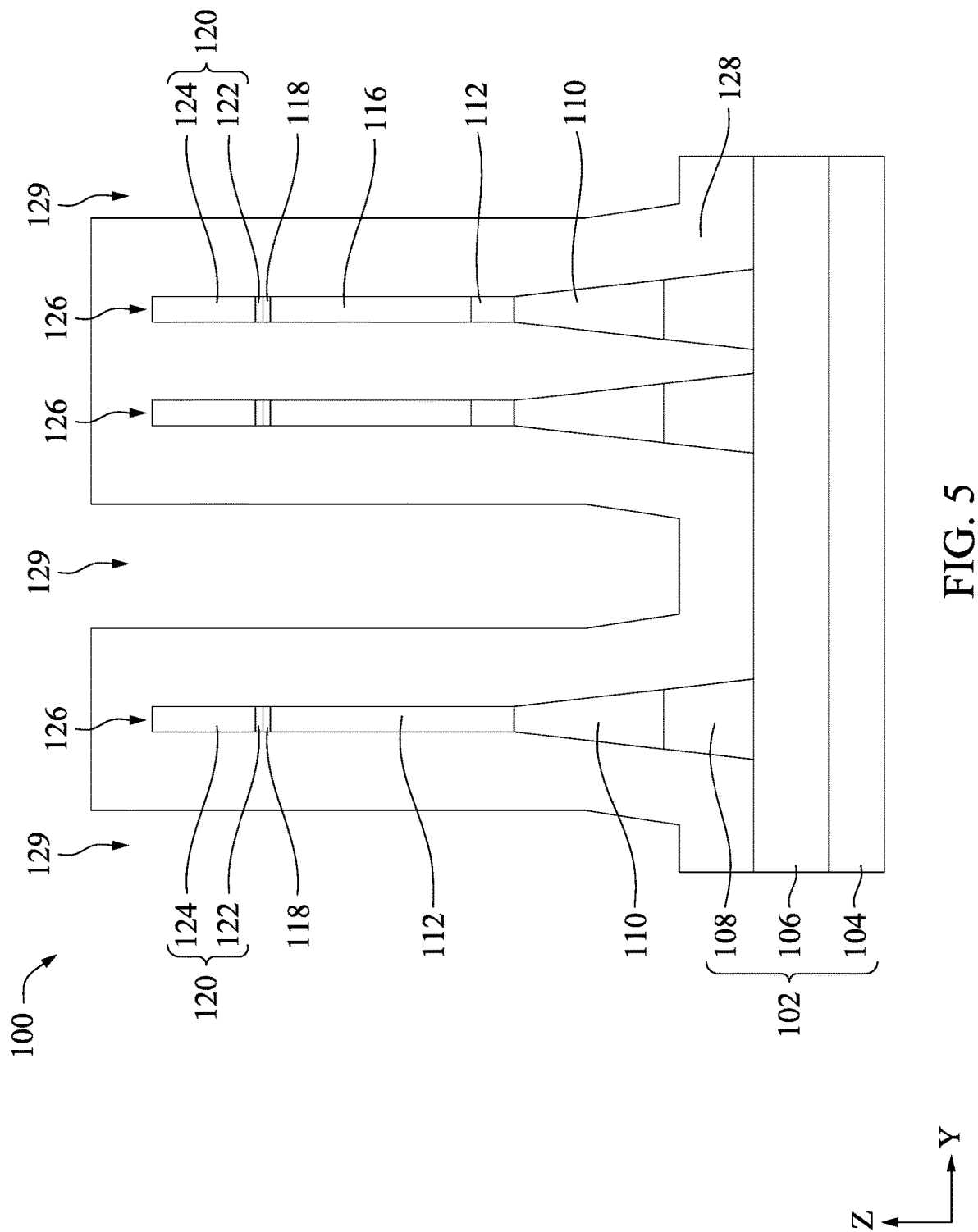

As shown in FIG. 5, a spacer 128 is formed on the exposed surfaces of the semiconductor device structure 100. The spacer 128 may be formed on the dielectric layer 106 and may embed the fins 126. The spacer 128 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than 7); or any suitable dielectric material. The spacer 128 may be formed by any suitable process, such as an atomic layer deposition (ALD) process. In some embodiments, the spacer 128 is conformally formed. The term "conformal" may be used herein for ease of description upon a layer having substantial same thickness over various regions. Due to the spacing between adjacent fins 126, one or more openings 129 may be formed between adjacent fins 126. In some embodiments, the opening 129 is formed between the fin 126 with NFET channel region and the fin 126 with PFET channel region, and the opening 129 is not formed between fins 126 with PFET channel regions, as shown in FIG. 5.

Figure 6:
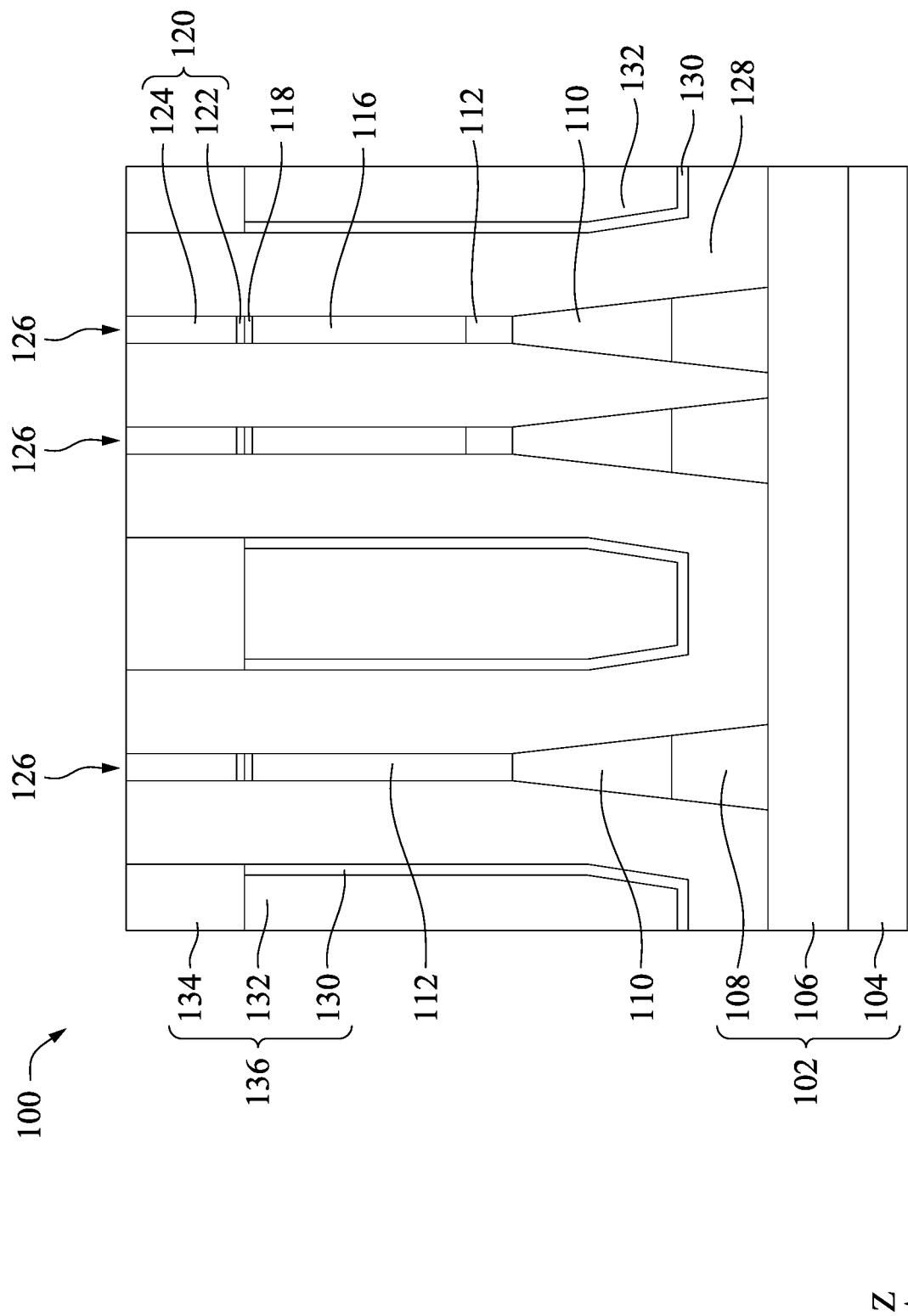

As shown in FIG. 6, a dielectric feature 136 is formed in each opening 129. The dielectric feature 136 includes a liner 130, a low-K dielectric material 132, and a high-K dielectric material 134. The liner 130 may include a carbon-containing dielectric material, such as SiCN, SiOC, or SiOCN. The liner 130 may be formed by a conformal process, such as an ALD process. The liner 130 may be initially formed on the exposed surfaces of the semiconductor device structure 100, such as on the spacer 128. The low-K dielectric material 132 is formed on the liner 130. The low-K dielectric material 132 may fill the openings 129. The low-K dielectric material 132 may include a material having a K value lower than 7, such as SiN, SiCN, SiOC, SiON, or SiOCN. The low-K dielectric material 132 may be formed by any suitable process, such as CVD or FCVD. The liner 130 and the low-K dielectric material 132 may be formed in the openings 129 and over the spacer 128 and the fins 126.

The liner 130 and the low-K dielectric material 132 may be recessed to a level below the top surface of the fins 126 (e.g., the top surface of the nitrogen-containing layer 124). In some embodiments, the portion of the liner 130 and the portion of the low-K dielectric material 132 formed over the spacer 128 and the fins 126 are removed by a planarization process, such as CMP process, followed by one or more etch processes to recess the liner 130 and the low-K dielectric material 132 in the openings 129. The spacer 128 may have a different etch selectivity compared to the liner 130 and the low-K dielectric material 132. Thus, the recess of the liner 130 and the low-K dielectric material 132 in the openings 129 does not substantially affect the spacer 128. In some embodiments, the portion of the low-K dielectric material 132 formed over the spacer 128 and the fins 126 is removed by a planarization process, and the liner 130 remains over the spacer 128 and the fins 126. The low-K dielectric material 132 is then recessed in the openings 129. The liner 130 has a different etch selectivity compared to the low-K dielectric material 132. The liner 130 protects the spacer 128, which may include the same material as the low-K dielectric material 132, during the recess process of the low-K dielectric material 132 in the openings 129. After the recess of the low-K dielectric material 132 in the openings 129, the exposed portions of the liner 130 over the spacer 128, the fins 126, and in the openings 129 are removed by a suitable removal process, such as a dry etch, a wet etch, or a combination thereof. In some embodiments, the portions of the liner 130 are removed by a selective wet etch that does not substantially affect the low-K dielectric material 132 and the spacer 128.

Figure 29:
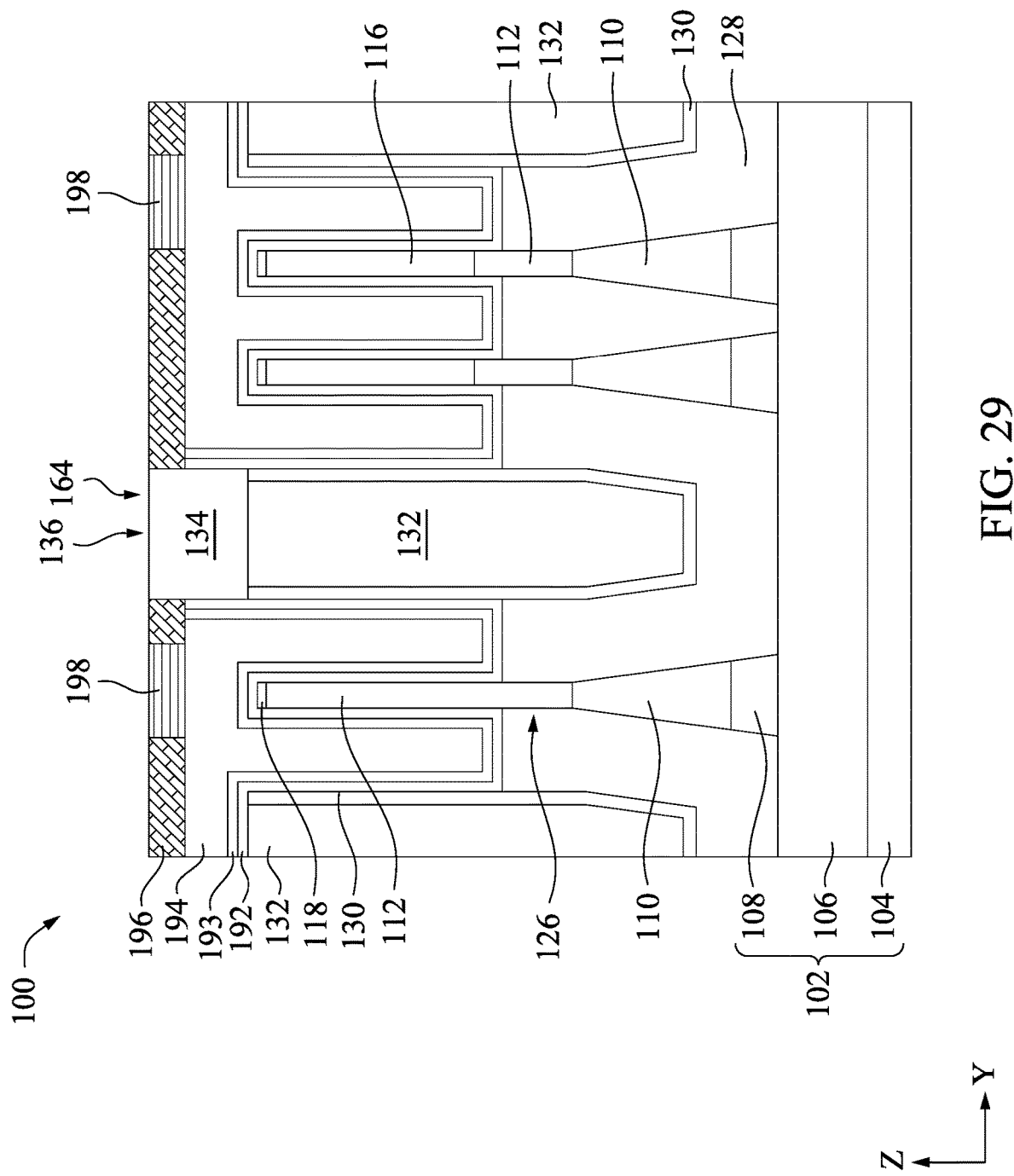
FIG. 29 is a cross-sectional side view of one of various stages of manufacturing the semiconductor device structure, in accordance with some embodiments.
Figure 30B:
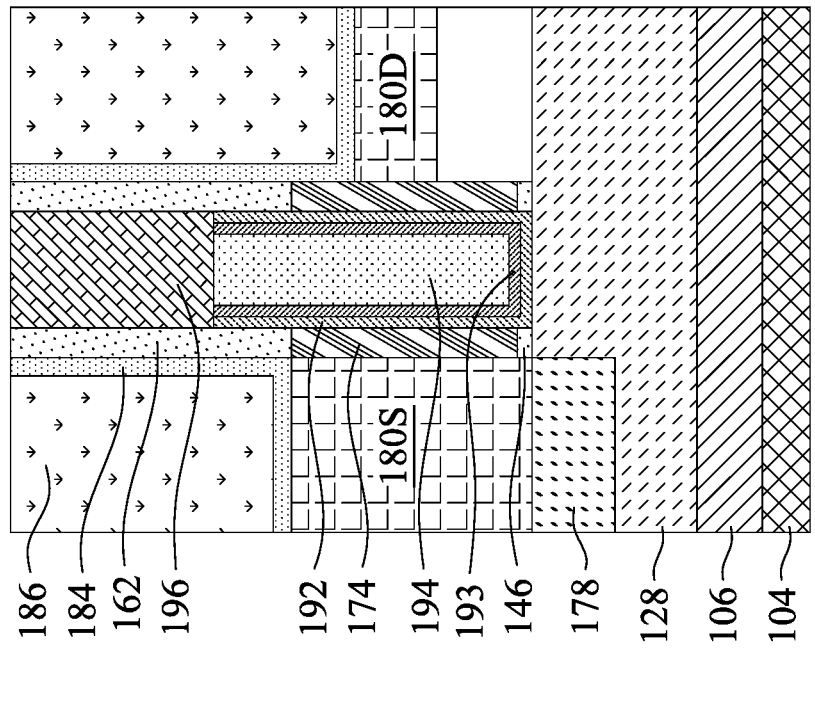
FIGS. 30A-30D are cross-sectional side views of the stage of manufacturing the semiconductor device structure of FIG. 29 taken along lines A-A, B-B, C-C, D-D of FIG. 10, respectively, in accordance with some embodiments.
Figure 30A:
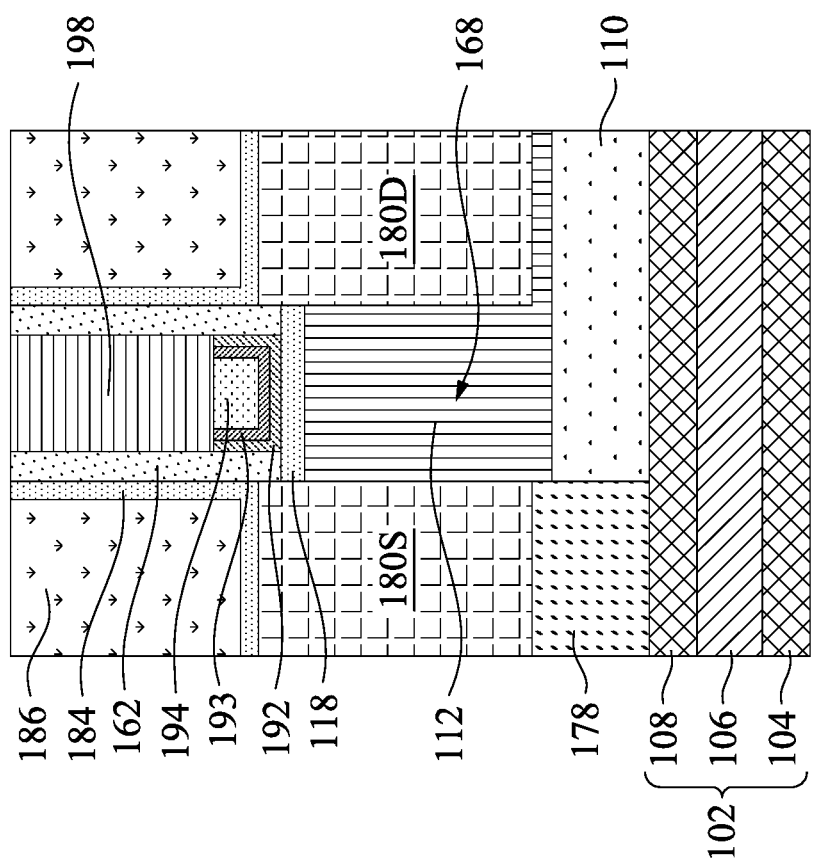
Figure 30D:
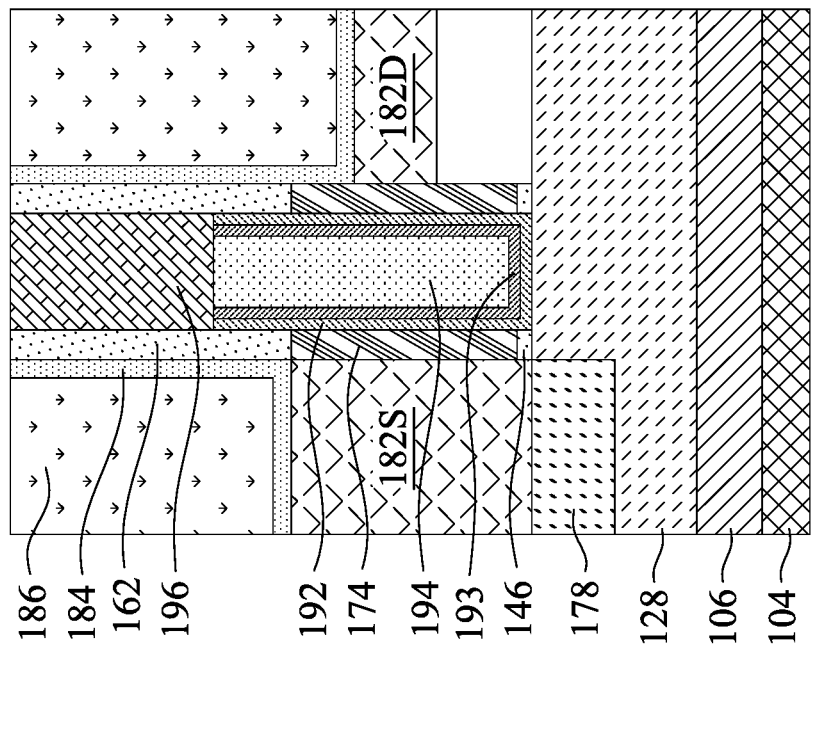
Figure 30C:
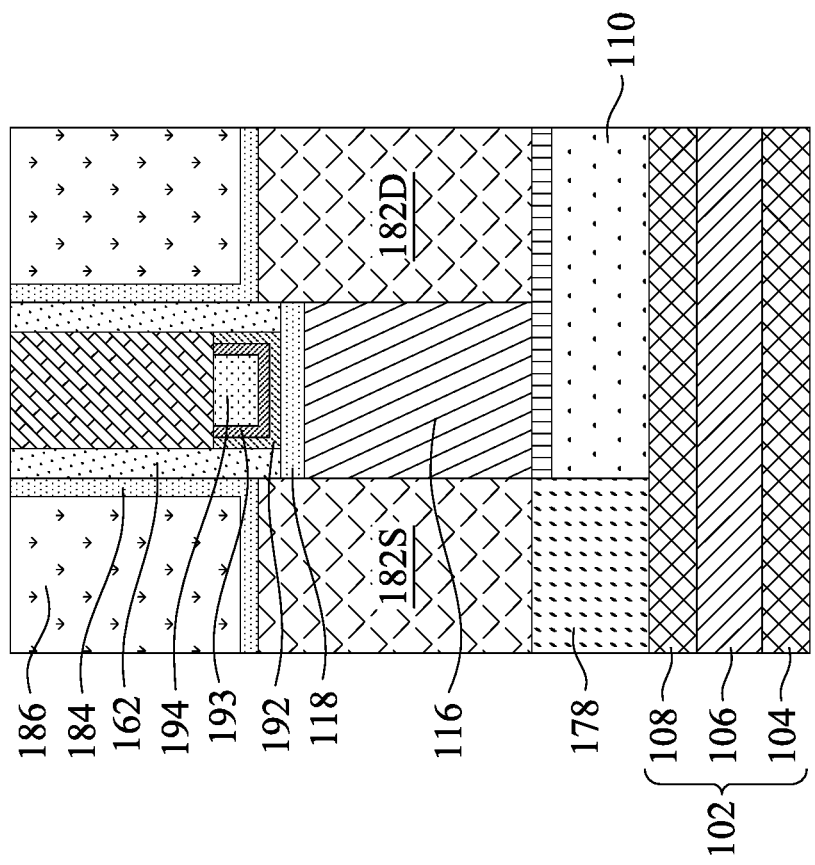

After recessing the liner 130 and the low-K dielectric material 132, the high-K dielectric material 134 is formed on the liner 130 and the low-K dielectric material 132, as shown in FIG. 6. The high-K dielectric material 134 may include a material having a K value greater than 7, such as $HfO_2$, $ZrO_2$, $HfAlO_x$, $HfSiO_x$, $Al_2O_3$, or other suitable material. The high-K dielectric material 134 may be formed by any suitable process, such as a CVD, PECVD, FCVD, or ALD process. The high-K dielectric material 134 may have a height along the Z direction ranging from about 5 nm to about 25 nm. The high-K dielectric material 134 may be utilized to separate, or cut-off, gate electrode layers 194 (FIG. 29). Thus, if the height of the high-K dielectric material 134 is less than about 5 nm, the gate electrode layers may not be sufficiently cut-off. On the other hand, if the height of the high-K dielectric material 134 is greater than about 25 nm, the manufacturing cost is increased without significant advantage.

Figure 20:
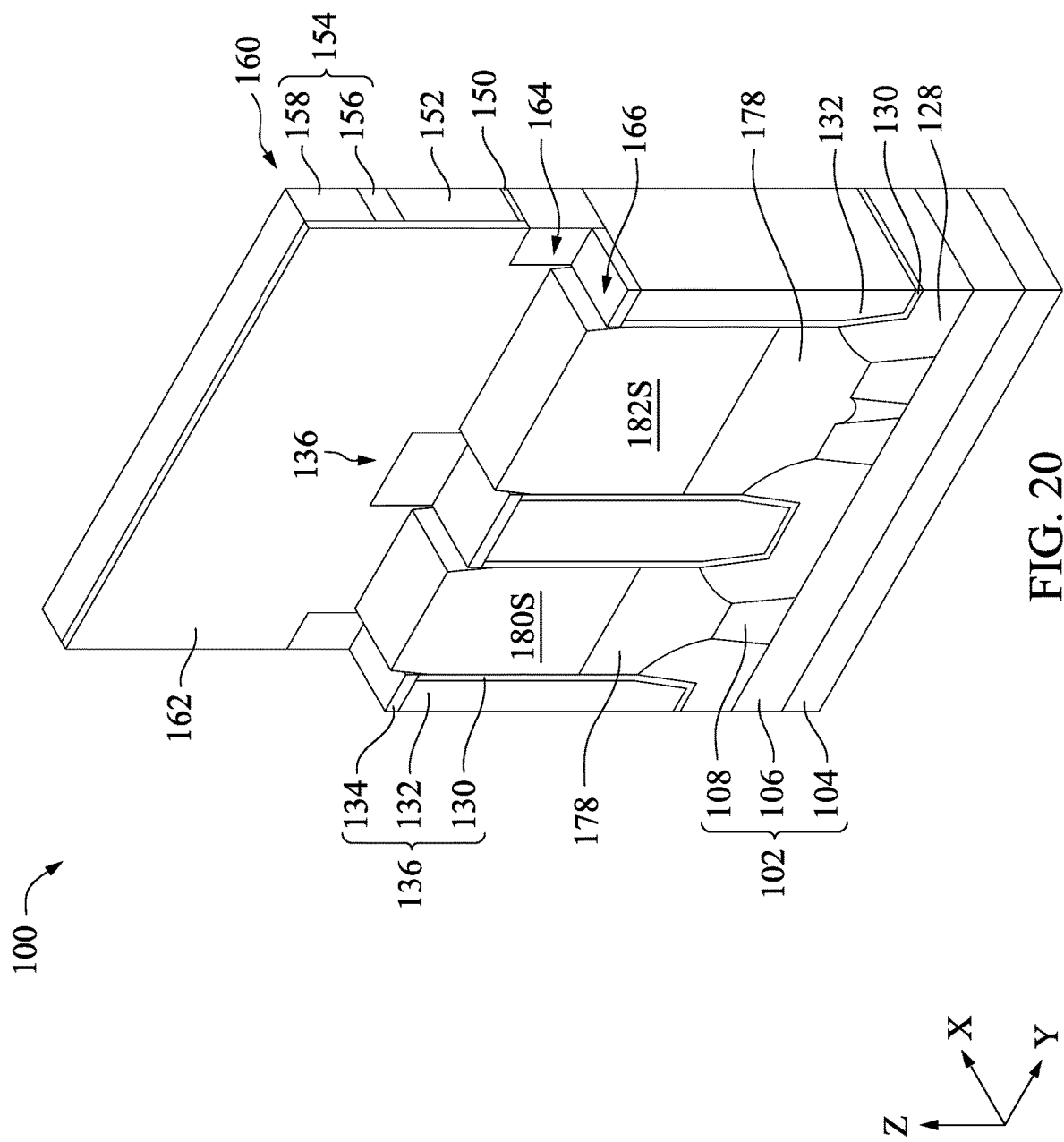
FIG. 20 is a perspective view of one of various stages of manufacturing the semiconductor device structure, in accordance with some embodiments.

A planarization process is performed to expose the nitrogen-containing layer 124 and the spacer 128, as shown in FIG. 6. The planarization process may be any suitable process, such as a CMP process. The planarization process removes portions of the high-K dielectric material 134 formed over the top of the fins 126 and the spacer 128. The dielectric feature 136 may be utilized to separate adjacent source/drain (S/D) epitaxial features 180S, 182S (FIG. 20). At least some of the dielectric features 136 may be utilized to separate adjacent gate electrode layers 194 (FIG. 29).

Figure 7:
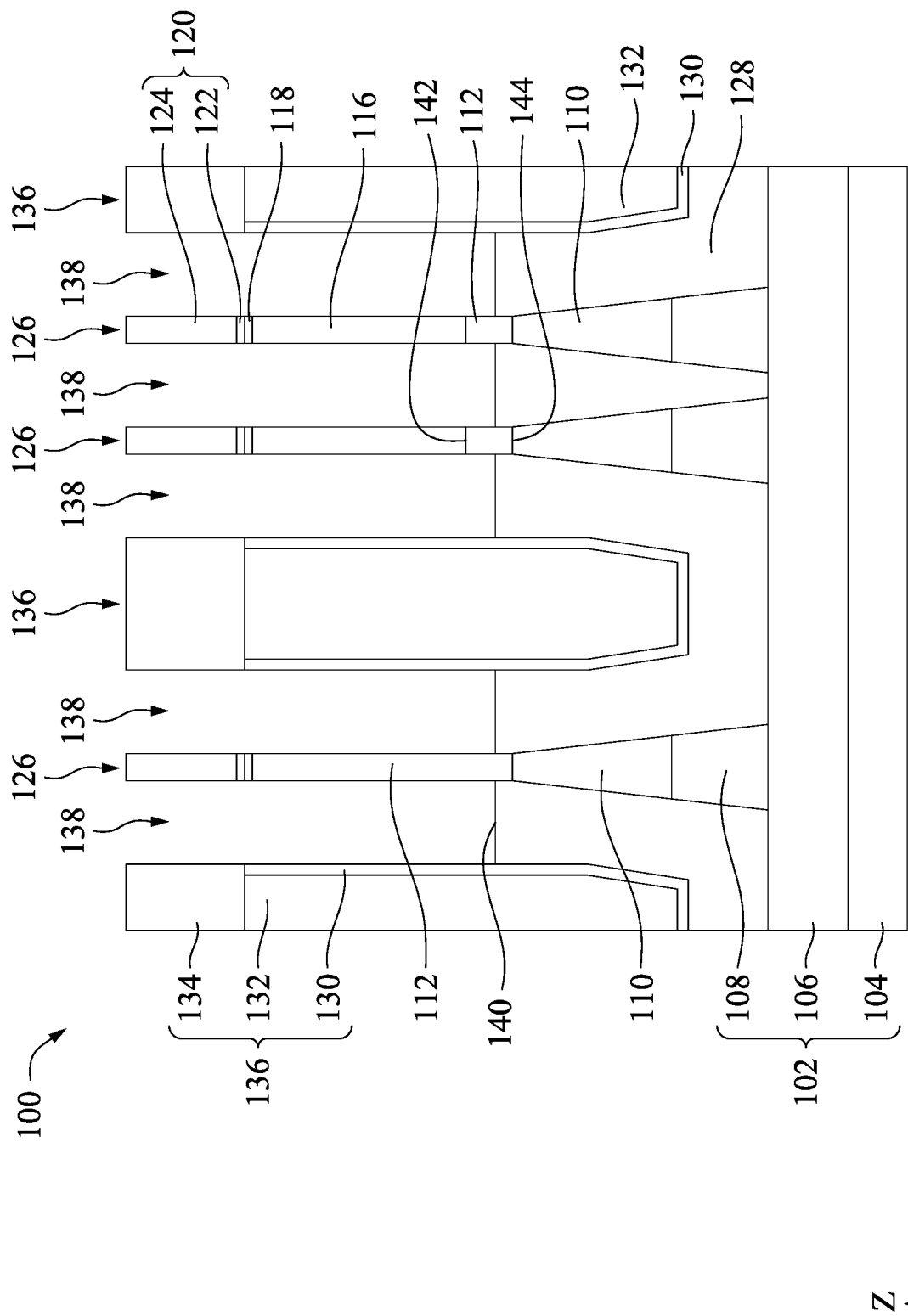

As shown in FIG. 7, the spacer 128 may be recessed by removing a portion of the spacer 128 located between adjacent fins 126 and between the fin 126 and the dielectric feature 136 to form openings 138. The openings 138 may be formed by any suitable removal process, such as dry etch or wet etch, that selectively removes the spacer 128 but not the high-K dielectric material 134, the nitrogen-containing layer 124, the liner 130, the semiconductor layer 112, and the semiconductor layer 116. The recessed spacer 128 may be the shallow trench isolation (STI). After the recess process, the spacer 128 includes a top surface 140 that may be at a level between the level of a first surface 142 of the semiconductor layer 112 and the level of a second surface 144 of the semiconductor layer 112. The first surface 142 of the semiconductor layer 112 may be in contact with the semiconductor layer 116, and the second surface 144 of the semiconductor layer may be in contact with the sacrificial semiconductor layer 110. The recess of the spacer 128 expose the channel regions, e.g., the semiconductor layer 112 of the NFET channel region and the semiconductor layer 116 of the PFET channel regions.

Figure 8:
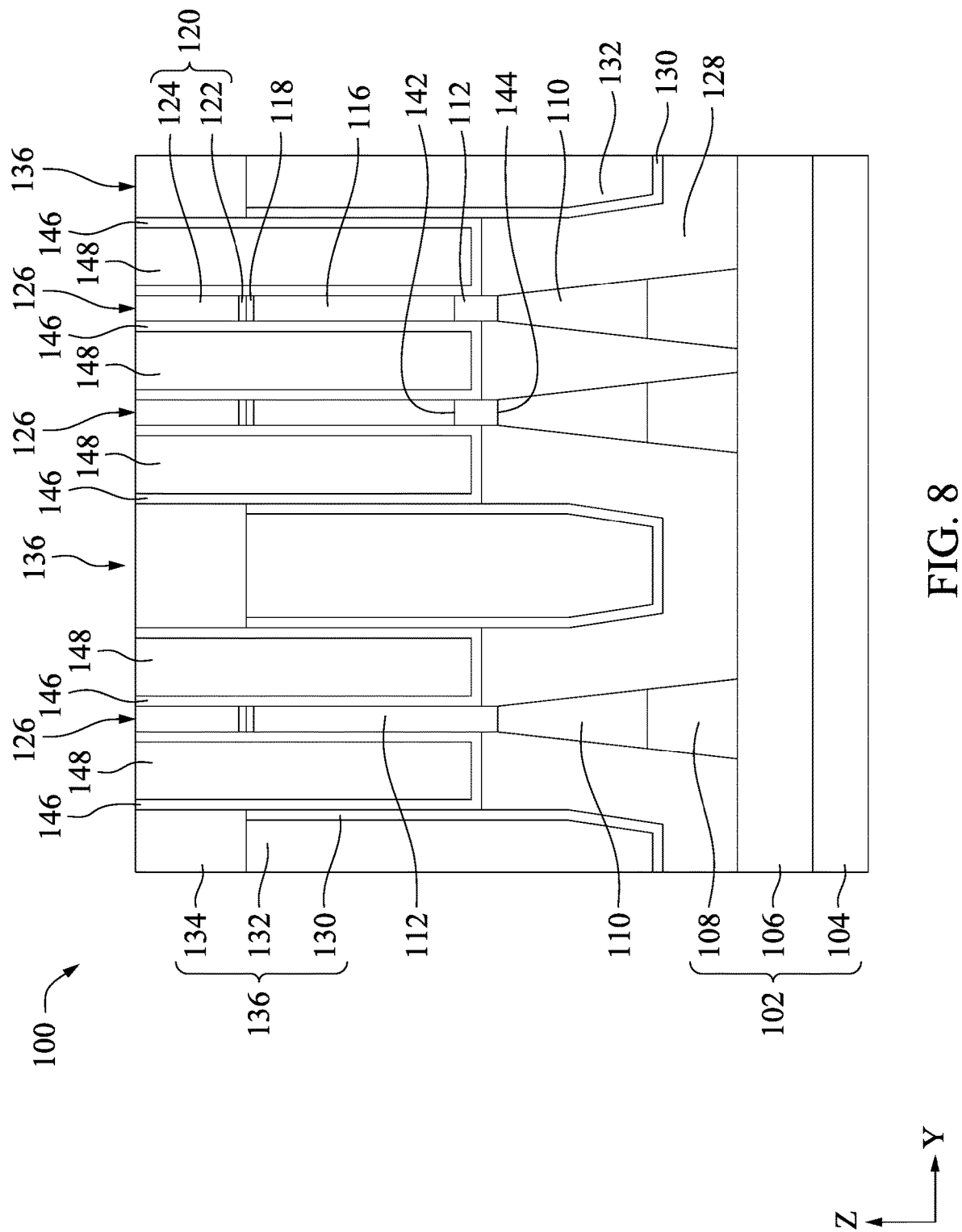

As shown in FIG. 8, a liner 146 and a sacrificial semiconductor material 148 are formed in each opening 138. The liner 146 may include a dielectric material, such as an oxide. The liner 146 may be formed by a conformal process, such as an ALD process. The sacrificial semiconductor material 148 may include an amorphous semiconductor material, such as amorphous SiGe. The sacrificial semiconductor materials 148 may be removed subsequently to form openings, and gate electrode layers 194 (FIG. 29) may be formed in the openings. The material of the sacrificial semiconductor materials 148 may have better fluidity in high aspect ratio openings, such as the openings 138, compared to the conventional sacrificial gate electrode layers. Thus, the openings 138 may have smaller dimensions than that for the conventional sacrificial gate electrode layers to form therein. In other words, the dimensions of the sacrificial semiconductor material 148 are smaller than those of the conventional sacrificial gate electrode layers, leading to gate electrode layers having smaller dimensions than those of the conventional gate electrode layers. With the gate electrode layers having smaller dimensions adjacent each fin, device density is increased.

The sacrificial semiconductor material 148 may be formed by any suitable process, such as a thermal process. The sacrificial semiconductor material 148 may have a different etch selectivity compared to the semiconductor layers 116. In some embodiments, the sacrificial semiconductor material 148 includes SiGe having a first Ge concentration, and the semiconductor layer 116 includes SiGe having a second Ge concentration less than the first Ge concentration. The liner 146 and the sacrificial semiconductor material 148 may be formed in each opening 138 and over the fins 126 and spacer 128. A planarization process is performed to expose the nitrogen-containing layer 124 and the spacer 128, as shown in FIG. 8. The planarization process may be any suitable process, such as a CMP process. The planarization process removes portions of the liner 146 and the sacrificial semiconductor material 148 formed over the top of the fins 126 and the spacer 128.

Figure 9:
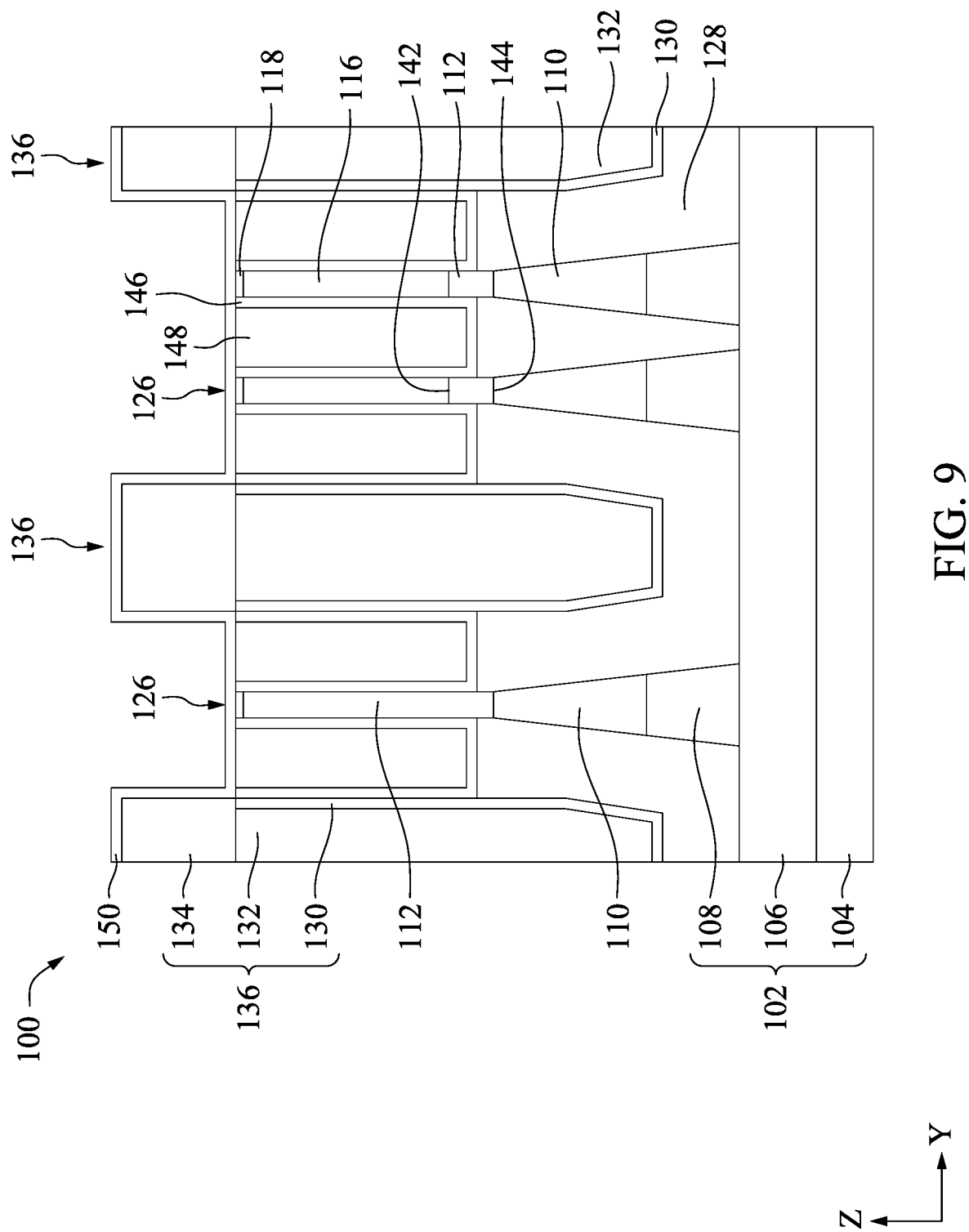

As shown in FIG. 9, the liner 146 and the sacrificial semiconductor material 148 are recessed to substantially the same level as the low-K dielectric material 132 and the cap layer 118. Thus, the top surfaces of the low-K dielectric material 132, the sacrificial semiconductor material 148, and the cap layer 118 may be substantially coplanar. The recess process may be one or more etch processes, such as dry etch, wet etch, or a combination thereof. In some embodiments, a first etch process is performed to recess the liner 146, followed by a second etch process to recess the sacrificial semiconductor material 148. The first and second etch processes may be selective etch processes that do not remove the high-K dielectric material 134.

The mask structures 120 (FIG. 8) are then removed, as shown in FIG. 9. The removal process may be one or more etch processes, such as dry etch, wet etch, or a combination thereof. In some embodiments, a first etch process is performed to remove the nitrogen-containing layer 124 (FIG. 8), followed by a second etch process to remove the oxygen-containing layer 122 (FIG. 8). The first and second etch processes may be selective etch processes that do not remove the liner 146, the sacrificial semiconductor material 148, the cap layer 118, and the high-K dielectric material 134. As a result of the removal processes, the semiconductor device structure 100 may have a substantially planar surface having the high-K dielectric materials 134 extending therefrom. A sacrificial gate dielectric layer 150 may be formed on the exposed surfaces of the semiconductor device structure 100. The sacrificial gate dielectric layer 150 may include one or more layers of dielectric material, such as $SiO_2$, SiN, a high-K dielectric material, and/or other suitable dielectric material. The sacrificial gate dielectric layer 150 may be deposited by a CVD process, a sub-atmospheric CVD (SACVD) process, a FCVD process, an ALD process, or other suitable process. In some embodiments, the sacrificial gate dielectric layer 150 is formed by ALD.

Figure 10:
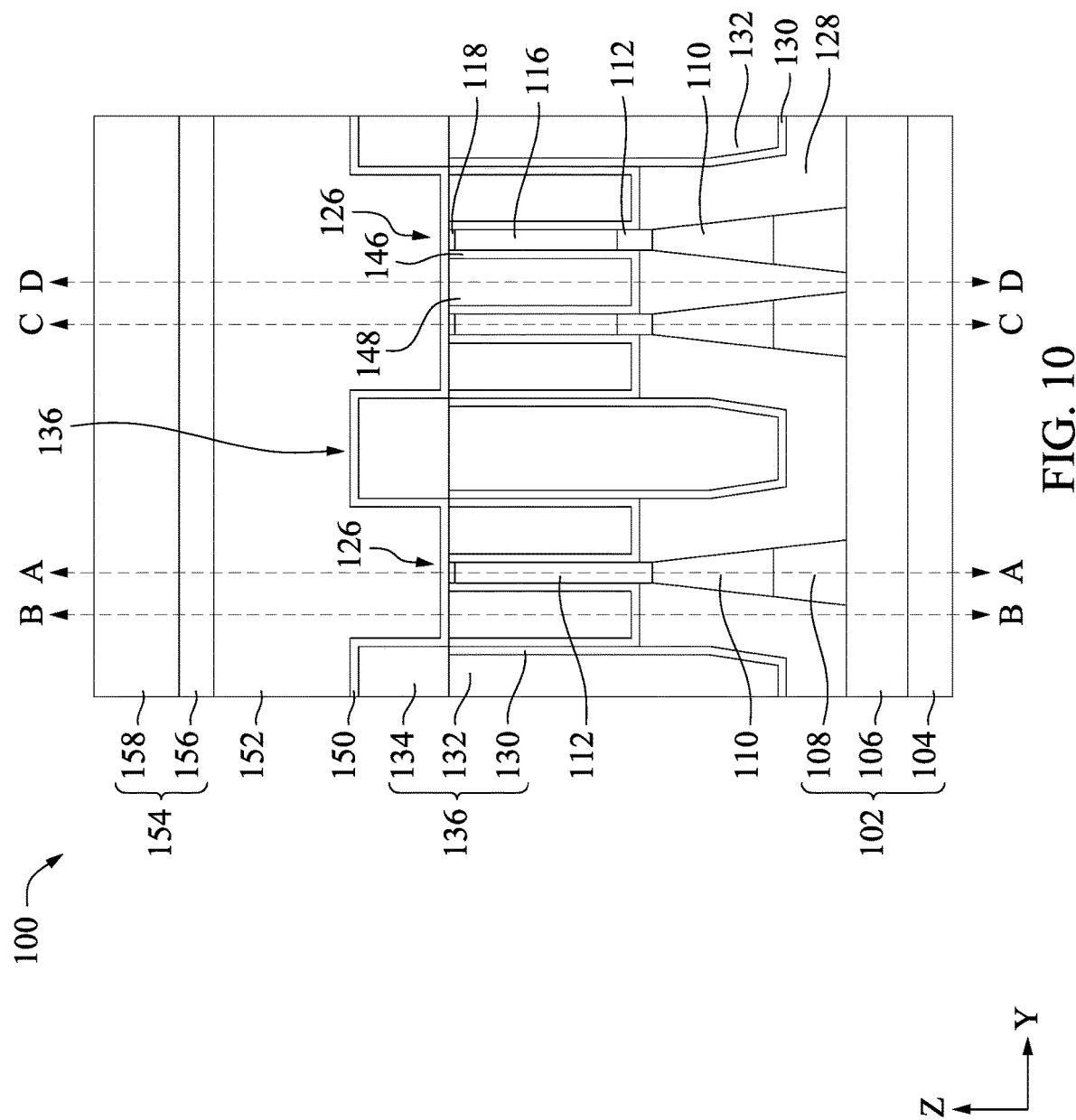

As shown in FIG. 10, a sacrificial gate electrode layer 152 and a mask structure 154 are formed on the sacrificial gate dielectric layer 150. The sacrificial gate electrode layer 152 may include polycrystalline silicon (polysilicon). The mask structure 154 may include an oxygen-containing layer 156 and a nitrogen-containing layer 158. In some embodiments, the sacrificial gate electrode layer 152 and the mask structure 154 are formed by various processes such as layer deposition, for example, CVD (including both LPCVD and PECVD), PVD, ALD, thermal oxidation, e-beam evaporation, or other suitable deposition techniques, or combinations thereof.

Figure 11:
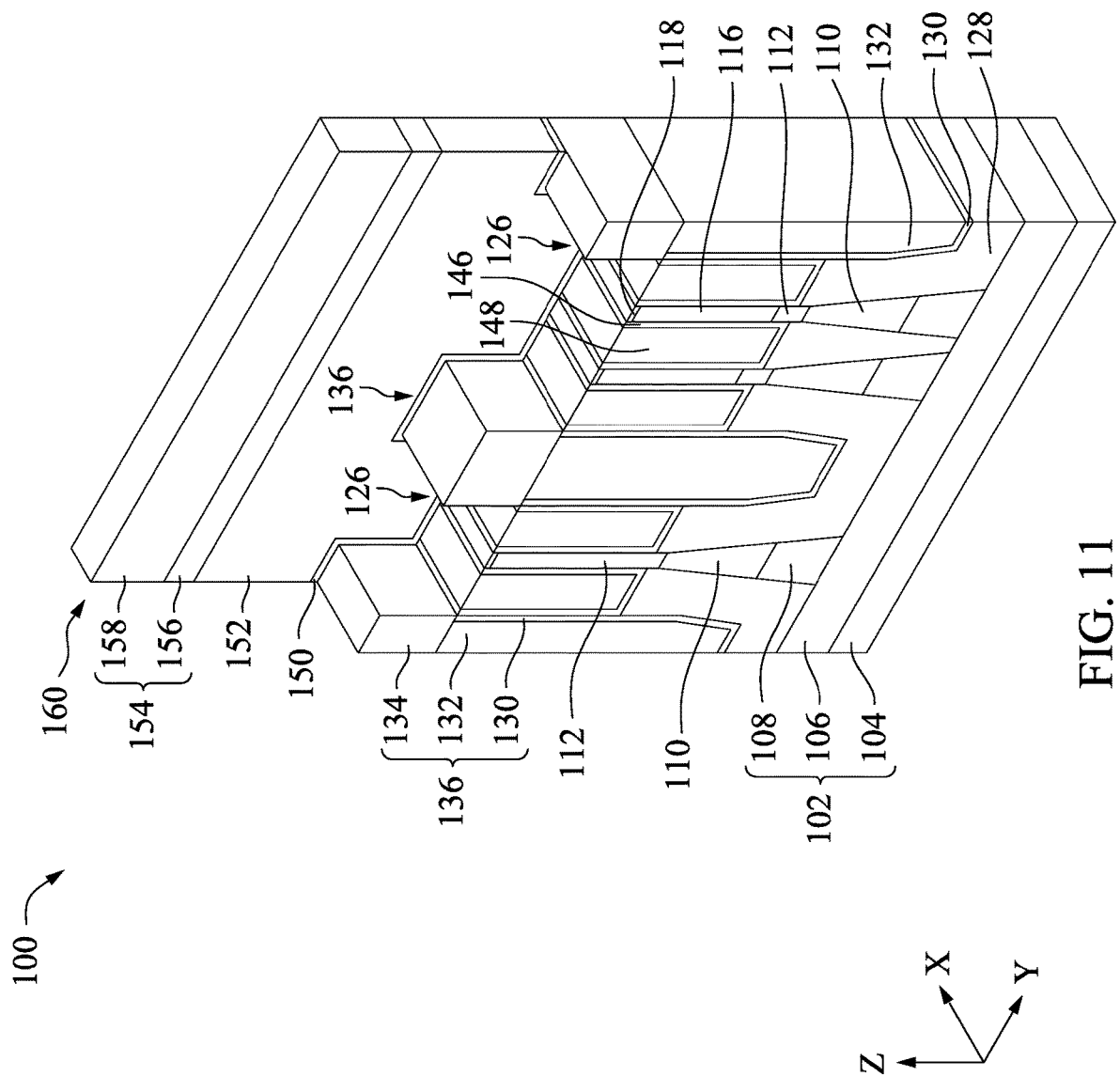
FIGS. 11 and 12 are perspective views of various stages of manufacturing the semiconductor device structure, in accordance with some embodiments.
Figure 12:
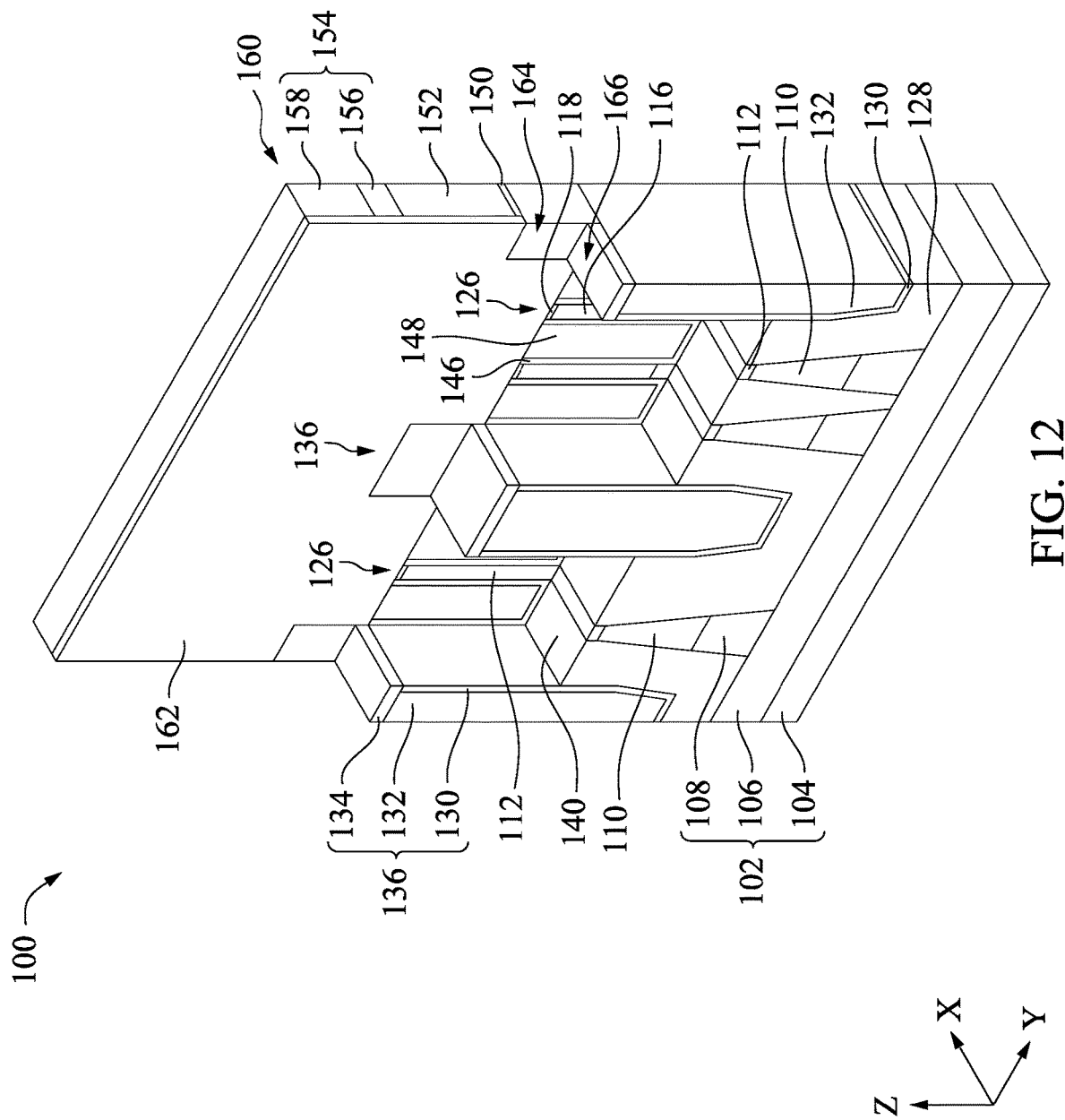

FIGS. 11 and 12 are perspective views of various stages of manufacturing the semiconductor device structure 100, in accordance with some embodiments. As shown in FIG. 11, portions of the sacrificial gate dielectric layer 150, the sacrificial gate electrode layer 152, and the mask structure 154 are removed to form a sacrificial gate stack 160. The sacrificial gate stack 160 includes the sacrificial gate dielectric layer 150, the sacrificial gate electrode layer 152, and the mask structure 154. The sacrificial gate stack 160 may be formed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE etch), wet etch, other etch methods, and/or combinations thereof. By patterning the sacrificial gate stack 160, the fins 126, the sacrificial semiconductor material 148 are partially exposed on opposite sides of the sacrificial gate stack 160. As shown in FIG. 11, one sacrificial gate stack 160 is formed, however, the number of the sacrificial gate stacks 160 is not limited to one.

As shown in FIG. 12, a spacer 162 is formed on the sidewalls of the sacrificial gate stack 160. The spacer 162 may be formed by first depositing a conformal layer that is subsequently etched back to form sidewall spacers 162. For example, a spacer material layer can be disposed conformally on the exposed surfaces of the semiconductor device structure 100. The conformal spacer material layer may be formed by an ALD process. Subsequently, an anisotropic etch is performed on the spacer material layer using, for example, RIE. During the anisotropic etch process, most of the spacer material layer is removed from horizontal surfaces, such as the tops of the fins 126, the sacrificial semiconductor material 148, and the high-K dielectric material 134, leaving the spacers 162 on the vertical surfaces, such as the sidewalls of sacrificial gate stack 160. The spacer 162 may include a dielectric material such as silicon oxide, silicon nitride, silicon carbide, silicon oxynitride, SiCN, silicon oxycarbide, SiOCN, and/or combinations thereof. In some embodiments, the spacer 162 includes multiple layers, such as main spacer walls, liner layers, and the like.

Next, exposed portions of the fins 126, exposed portions of the liner 146, exposed portions of the sacrificial semiconductor material 148 not covered by the sacrificial gate stack 160 and the spacers 162 are selectively removed/recessed by using one or more suitable etch processes, such as dry etch, wet etch, or a combination thereof. In some embodiments, exposed portions of the fins 126 are recessed, exposing the semiconductor layers 112. As shown in FIG. 12, the exposed portions of the fins 126 are recessed to a level at or below the top surface 140 of the spacer 128. The recess processes may include an etch process that recesses the exposed portions of the fins 126 and removes the exposed portions of the liner 146 and sacrificial semiconductor material 148. The removal of the exposed portions of the liner 146 and the sacrificial semiconductor material 148 exposes the top surfaces 140 of the spacer 128. The recessed semiconductor layer 112 may be at or below the level of the top surface 140 of the spacer 128.

In some embodiments, the etch process may reduce the height of the exposed high-K dielectric material 134, as shown in FIG. 12. Thus, a first portion 164 of the high-K dielectric material 134 under the sacrificial gate stack 160 and the spacers 162 has a first height, while a second portion 166 of the high-K dielectric material 134 located between S/D epitaxial features 180S, 182S (FIG. 20) has a second height less than the first height.

At this stage, end portions of the sacrificial semiconductor material 148 under the sacrificial gate stack 160 and the spacers 162 have substantially flat surfaces which may be flush with corresponding spacers 162.

Figure 13D:
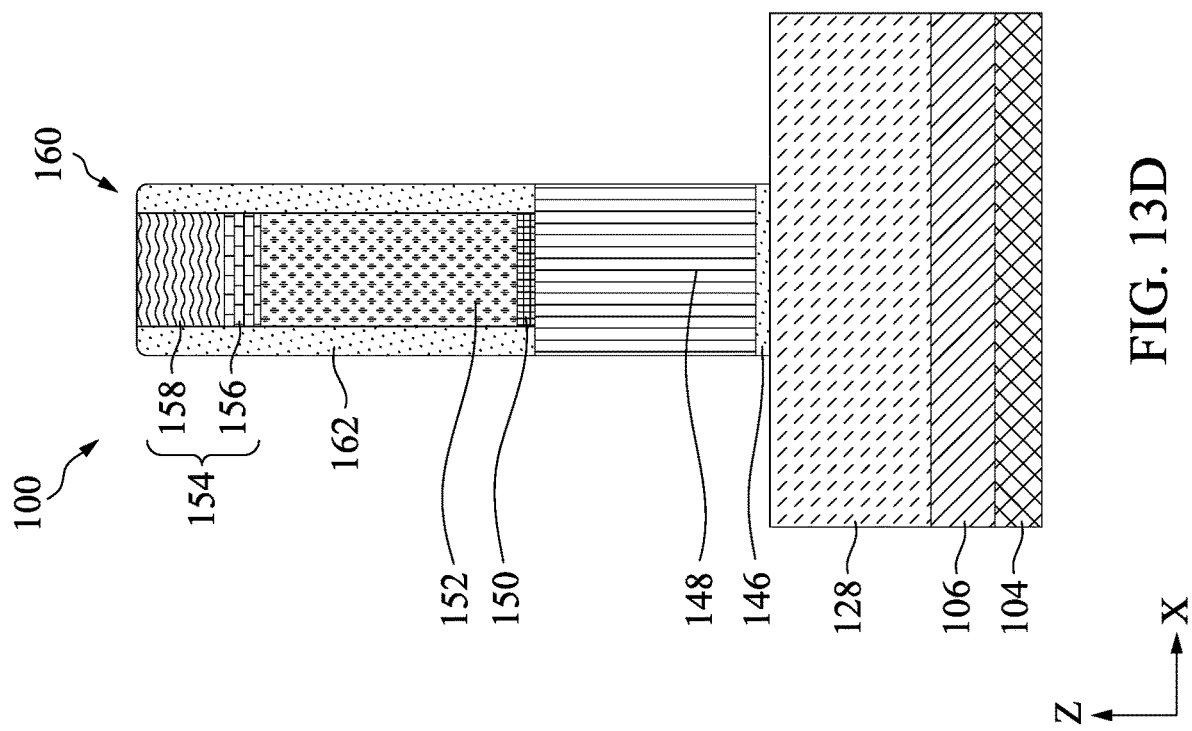
Figure 13C:
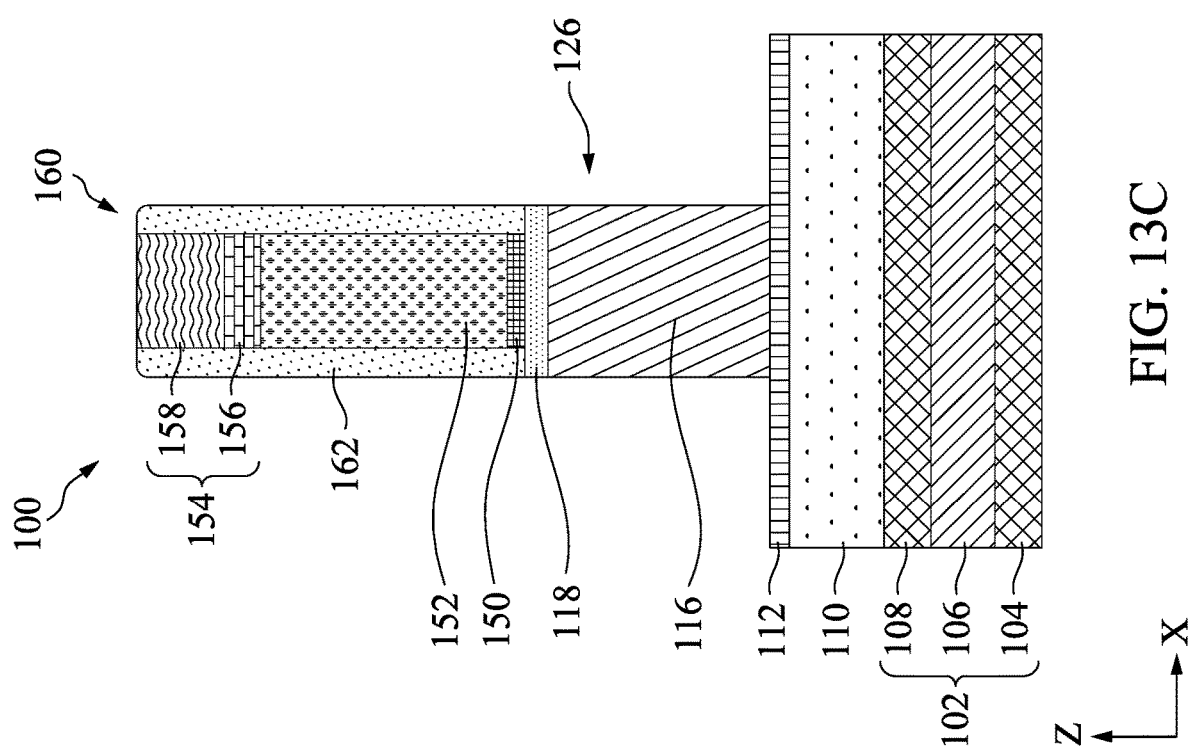

FIGS. 13A-13D are cross-sectional side views of the stage of manufacturing the semiconductor device structure 100 of FIG. 12 taken along lines A-A, B-B, C-C, D-D of FIG. 10, respectively, in accordance with some embodiments. FIG. 13A is a cross-sectional side view along the fin 126 with the NFET channel region. As shown in FIG. 13A, the semiconductor layer 112 includes a first portion 168 under the sacrificial gate stack 160 and the spacers 162 and a second portion 170. The first portion 168 may be the NFET channel region. FIG. 13B is a cross-sectional side view along the sacrificial semiconductor material 148 adjacent the fin 126 with the NFET channel region. As shown in FIG. 13B, the end portions of the sacrificial semiconductor material 148 are flush with the spacers 162. FIG. 13C is a cross-sectional side view along the fin 126 with the PFET channel region. As shown in FIG. 13C, the semiconductor layer 116 is under the sacrificial gate stack 160 and the spacers 162 and is disposed on the semiconductor layer 112. The semiconductor layer 112 may protect the semiconductor layer 116 during subsequent processes. The semiconductor layer 116 may be the PFET channel region. FIG. 13D is a cross-sectional side view along the sacrificial semiconductor material 148 adjacent the fin 126 with the PFET channel region.

Figure 14:
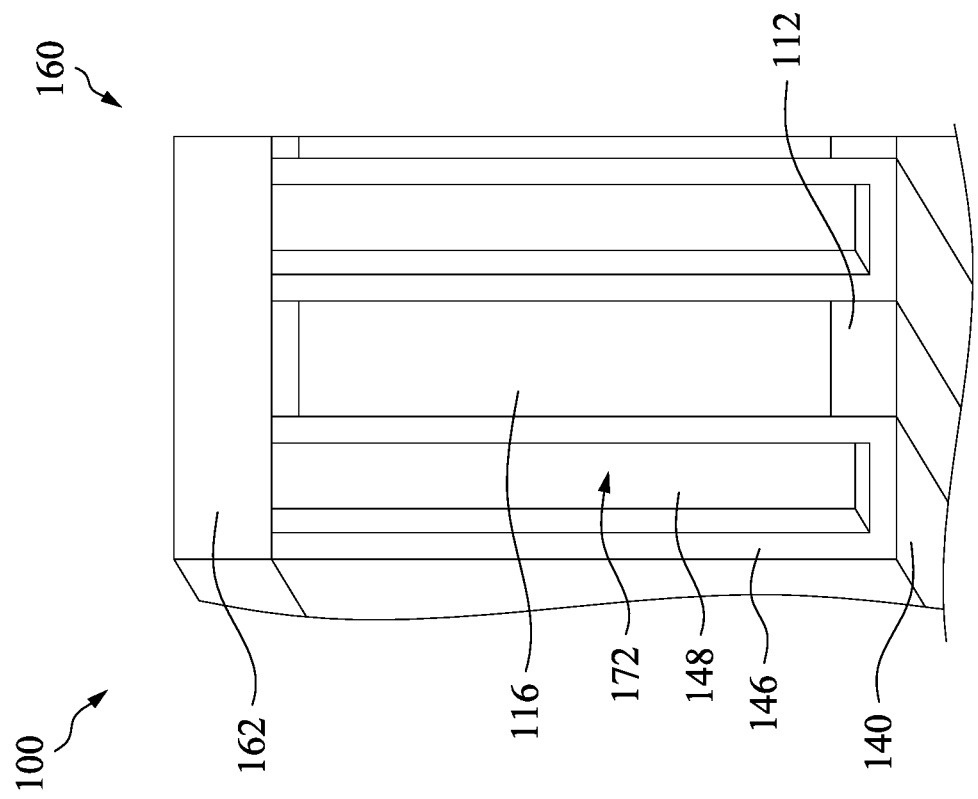
FIG. 14 is an enlarged perspective view of a sacrificial semiconductor material under a sacrificial gate stack and spacers at one of various stages of manufacturing the semiconductor device structure, in accordance with some embodiments.

FIG. 14 is an enlarged perspective view of the sacrificial semiconductor material 148 under the sacrificial gate stack 160 and the spacers 162, in accordance with some embodiments. FIGS. 15A-15D are cross-sectional side views of the stage of manufacturing the semiconductor device structure 100 of FIG. 14 taken along lines A-A, B-B, C-C, D-D of FIG. 10, respectively, in accordance with some embodiments. As shown in FIGS. 14, 15B, 15D, the end portions of each sacrificial semiconductor material 148 are removed, forming gaps 172. In some embodiments, the end portions of the sacrificial semiconductor materials 148 are removed by a selective wet etch process that does not remove the liner 130, the high-K dielectric material 134, the liner 146, the spacers 162, the nitrogen-containing layer 158, and the semiconductor layers 112, 116.

Figure 16:
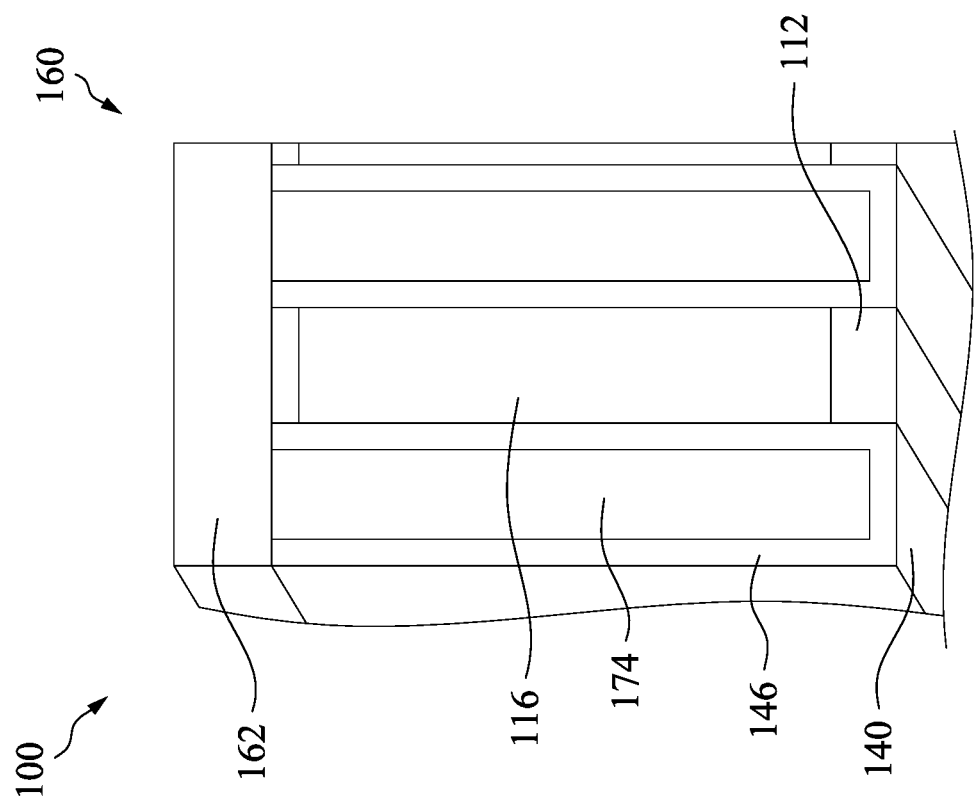
FIG. 16 is an enlarged perspective view of inner spacers under the spacers at one of various stages of manufacturing the semiconductor device structure, in accordance with some embodiments.
Figure 17D:
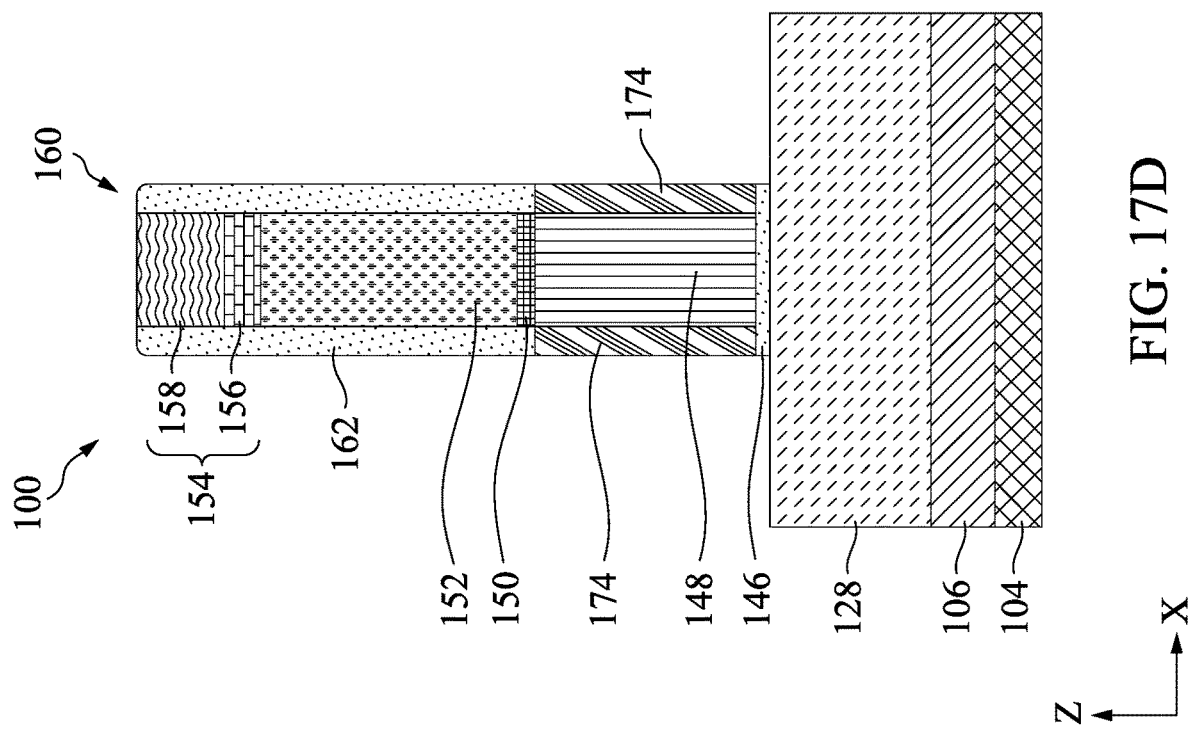
Figure 17C:
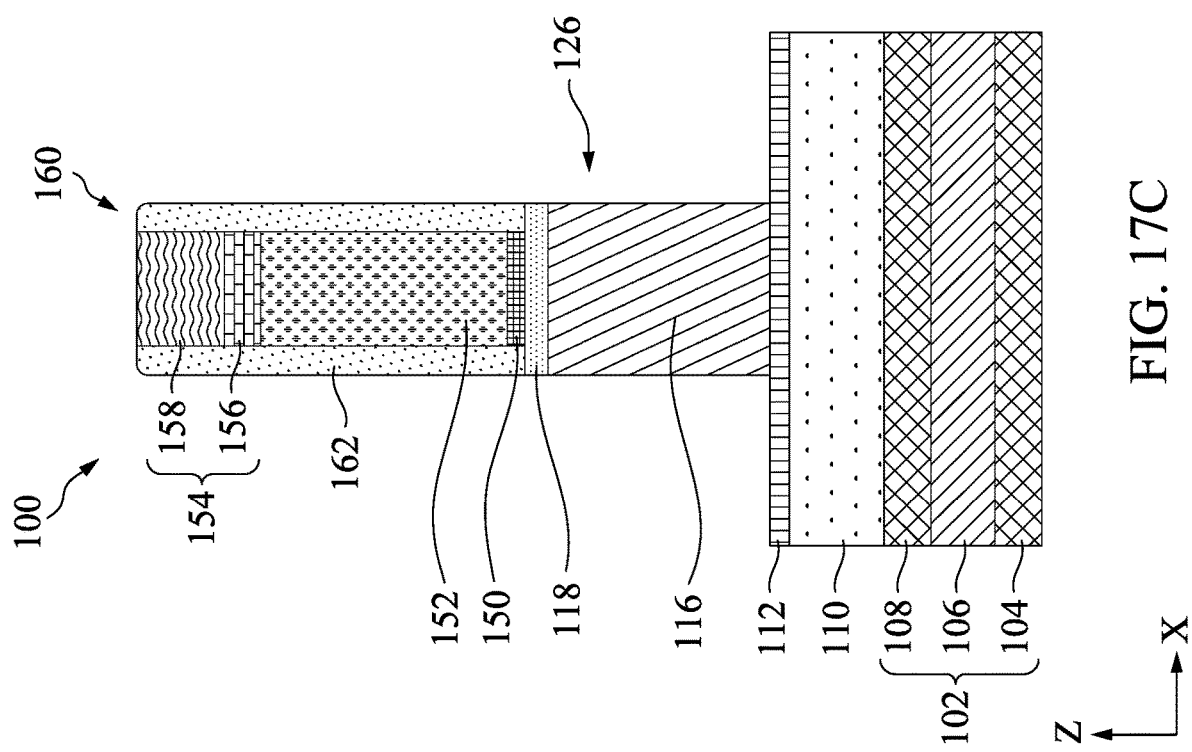
Figure 21:
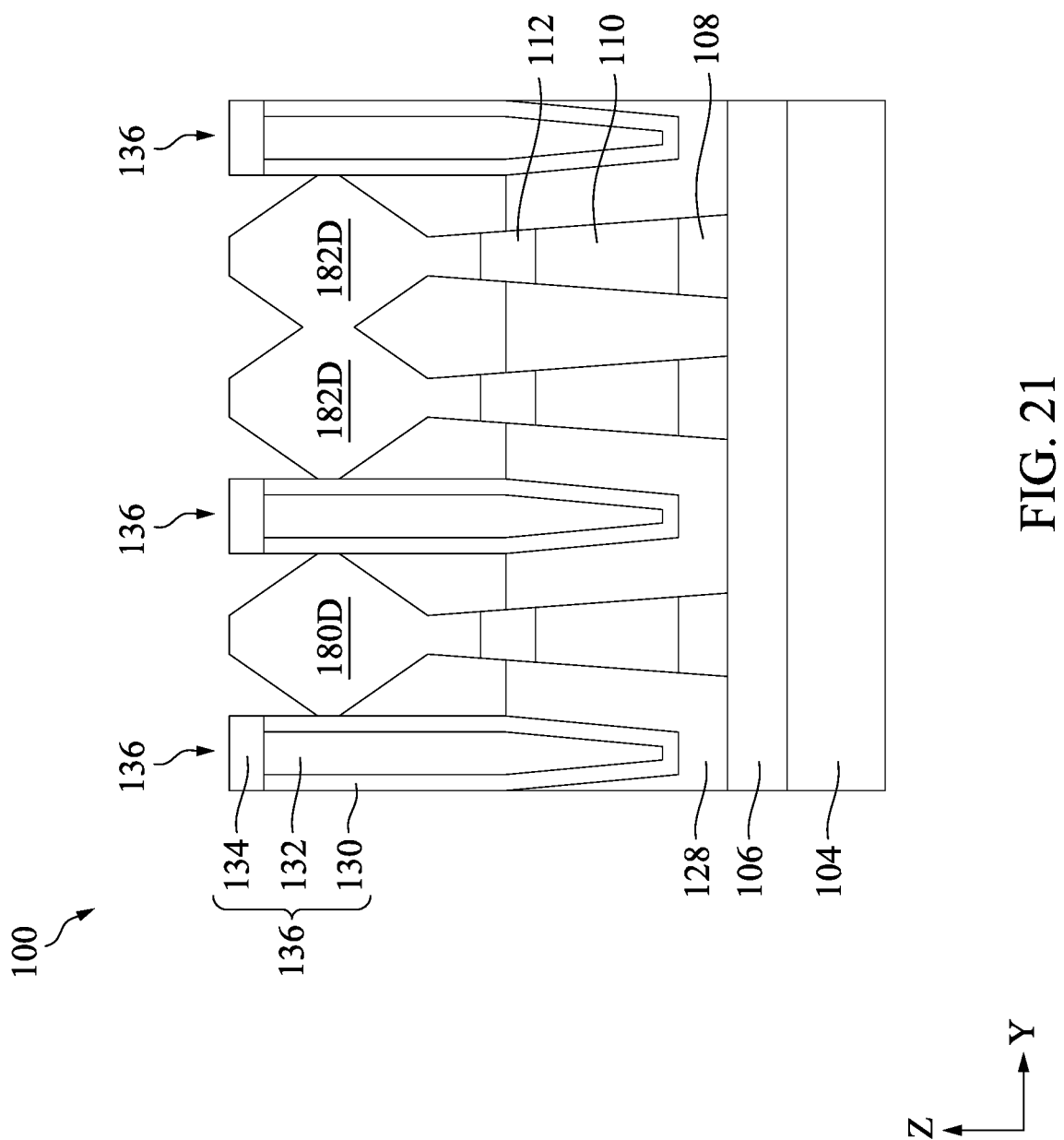
FIG. 21 is a cross-sectional side view of one of various stages of manufacturing the semiconductor device structure, in accordance with some embodiments.
Figure 22B:
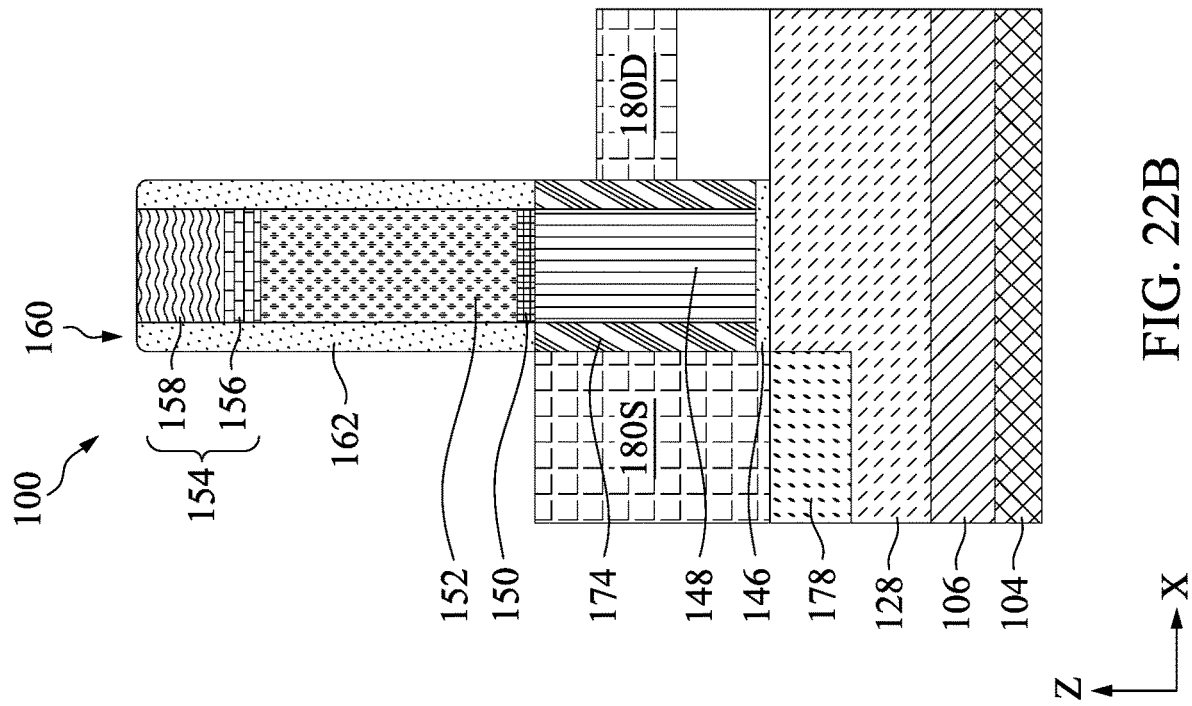
FIGS. 22A-22D are cross-sectional side views of the stage of manufacturing the semiconductor device structure of FIGS. 19 and 20 taken along lines A-A, B-B, C-C, D-D of FIG. 10, respectively, in accordance with some embodiments.
Figure 22A:
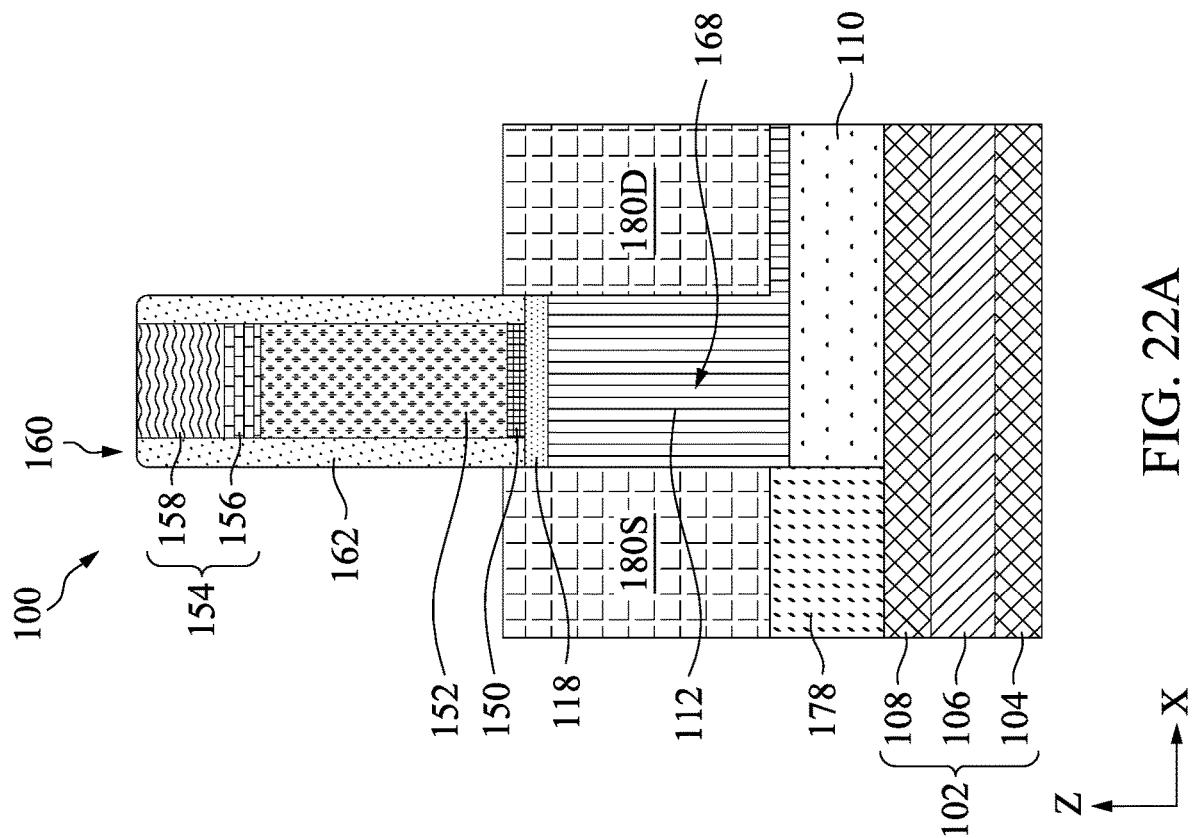
Figure 22D:
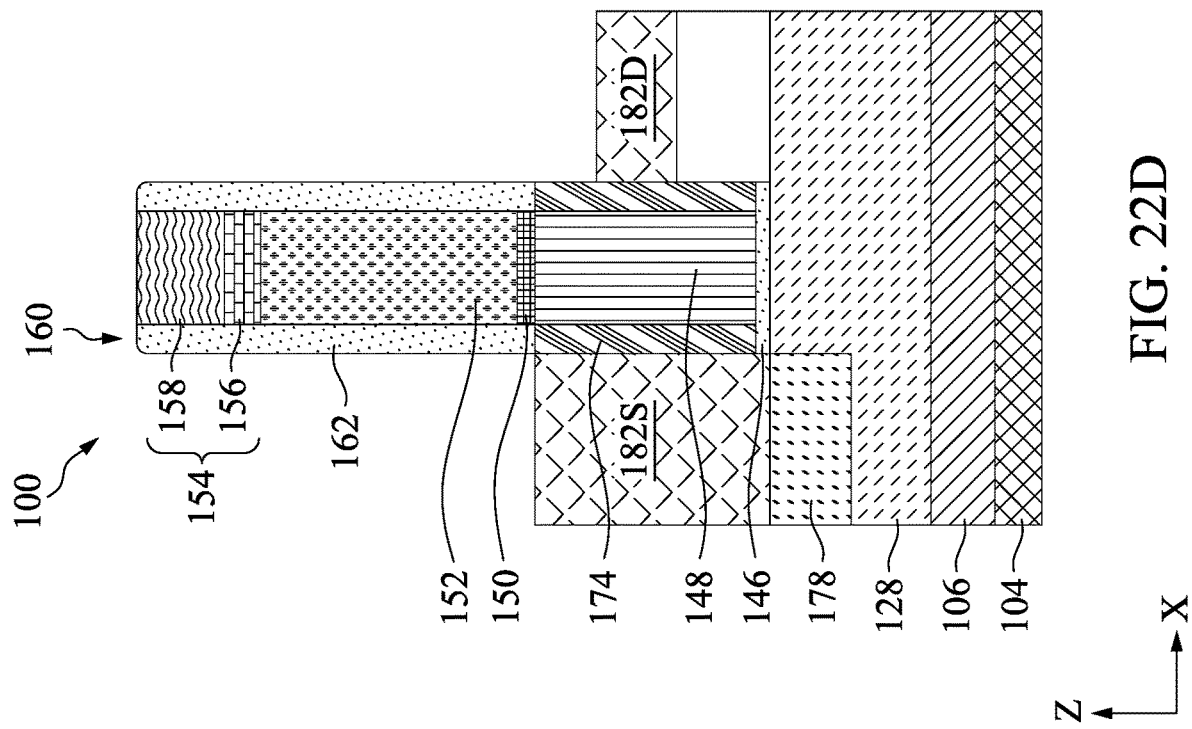
Figure 22C:
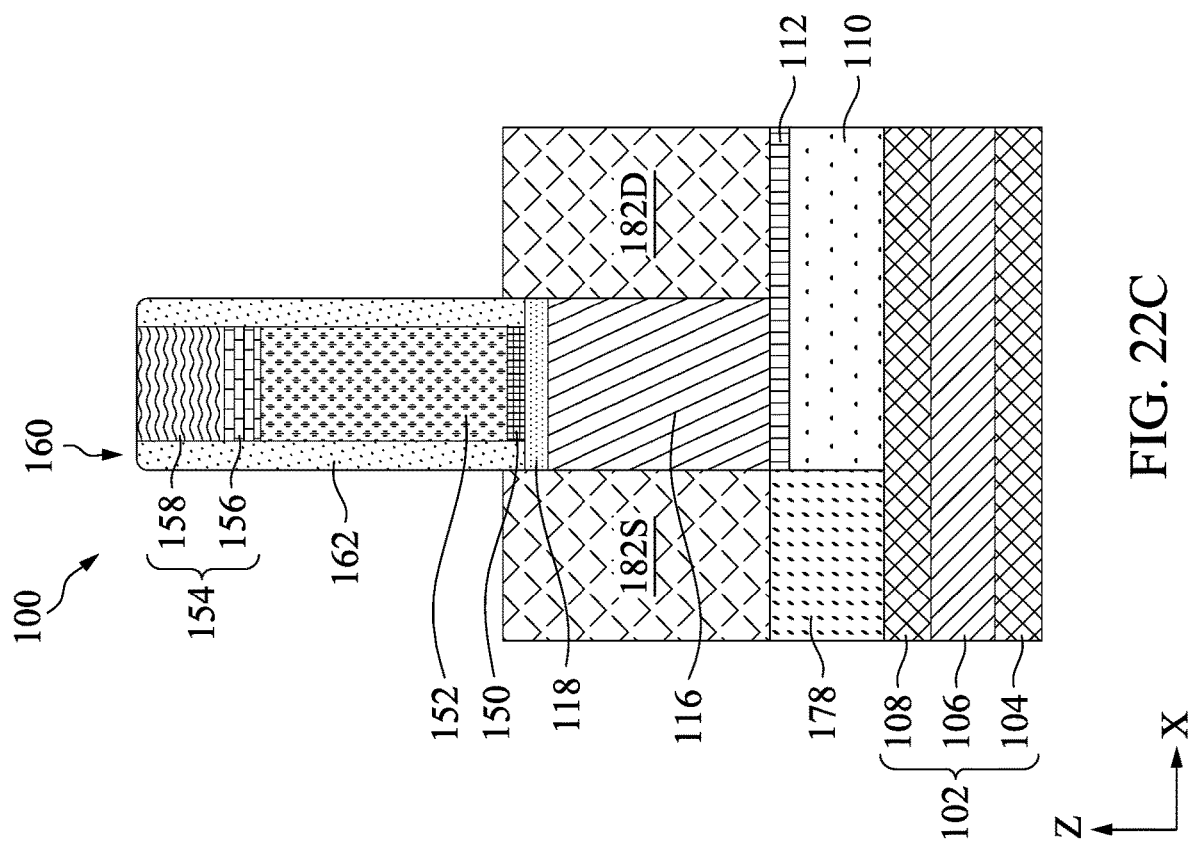

FIG. 16 is an enlarged perspective view of an inner spacer 174 under the spacers 162, in accordance with some embodiments. FIGS. 17A-17D are cross-sectional side views of the stage of manufacturing the semiconductor device structure 100 of FIG. 16 taken along lines A-A, B-B, C-C, D-D of FIG. 10, respectively, in accordance with some embodiments. As shown in FIGS. 16, 17B, 17D, the inner spacers 174 are formed in the gaps 172. In some embodiments, the inner spacers 174 may include a low-K dielectric material, such as SiON, SiCN, SiOC, SiOCN, or SiN. In some embodiments, the inner spacers 174 is a single layer of material. In other embodiments, the inner spacers 174 include two or more layers. For example, the inner spacers 174 may include a first layer in contact with the sacrificial semiconductor material 148 and a second layer in contact with the first layer. In one aspect, the first layer may include a nitrogen-containing material, such as SiN, and the second layer may include an oxygen-containing material, such as an oxide. Alternatively, the first layer may include an oxygen-containing material, and the second layer may include a nitrogen-containing material. The inner spacers 174 may be formed by first forming a conformal spacer layer using a conformal deposition process, such as ALD, followed by an anisotropic etch to remove portions of the conformal spacer layer other than the inner spacers 174. The inner spacers 174 may be protected by the spacers 162 during the anisotropic etch process. In some embodiments, the inner spacers 174 may be flush with the spacers 162, as shown in FIGS. 17B, 17D. The inner spacer 174 may have a thickness along the X direction ranging from about 2 nm to about 15 nm and a width along the Y direction ranging from about 5 nm to about 15 nm. The inner spacers 174 may be utilized to insulate the gate electrode layer 194 (FIG. 29) from S/D epitaxial features 180S, 180D, 182S, 182D (FIGS. 20 and 21). Thus, if the thickness of the inner spacer 174 is less than about 2 nm, the gate electrode layer 194 may not be sufficiently insulated from the S/D epitaxial features 180S, 180D, 182S, 182D. On the other hand, if the thickness of the inner spacer 174 is greater than about 15 nm, the manufacturing cost is increased without significant advantage.

Figure 18:
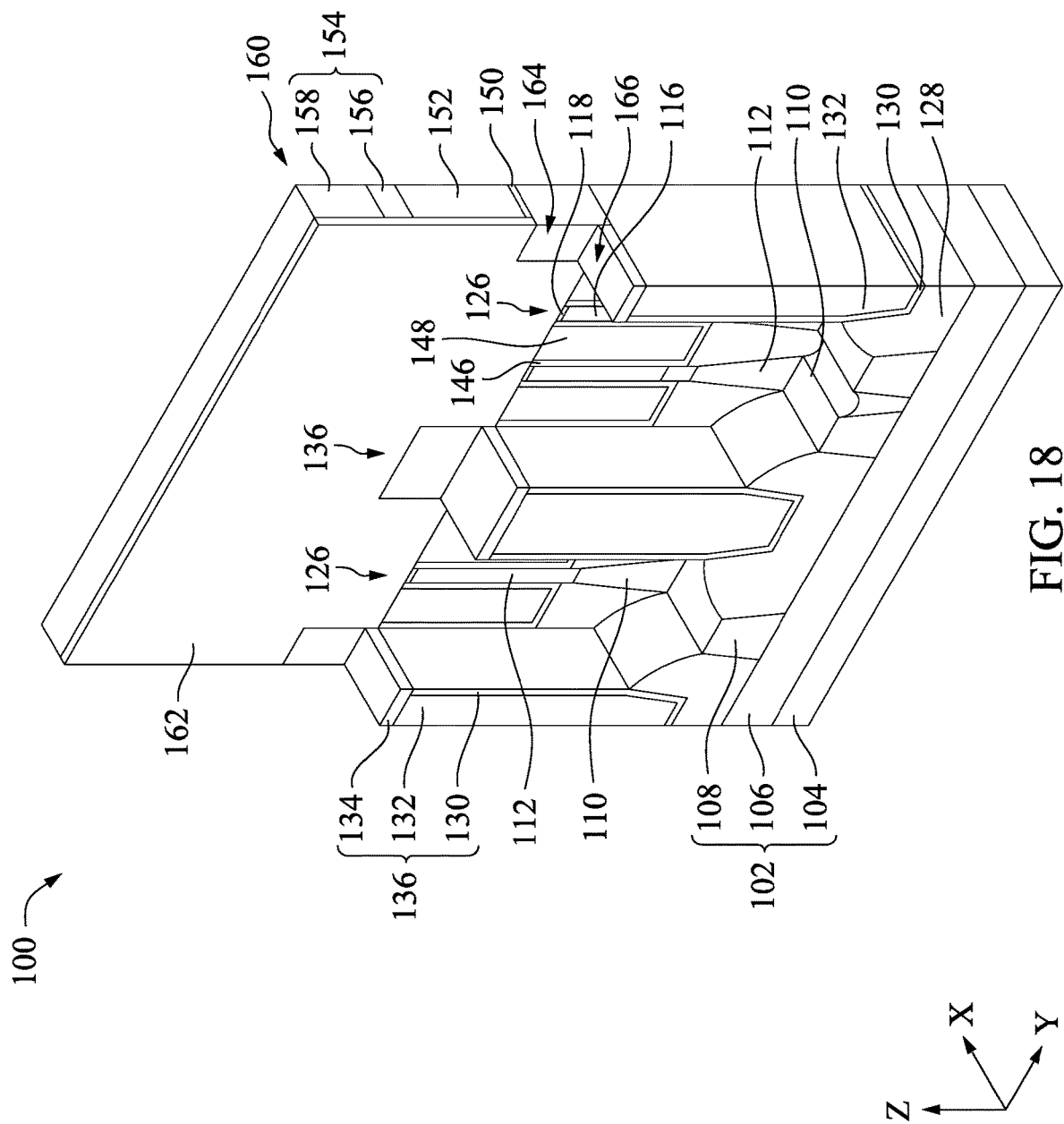
FIG. 18 is a perspective view of one of various stages of manufacturing the semiconductor device structure, in accordance with some embodiments.
Figure 19B:
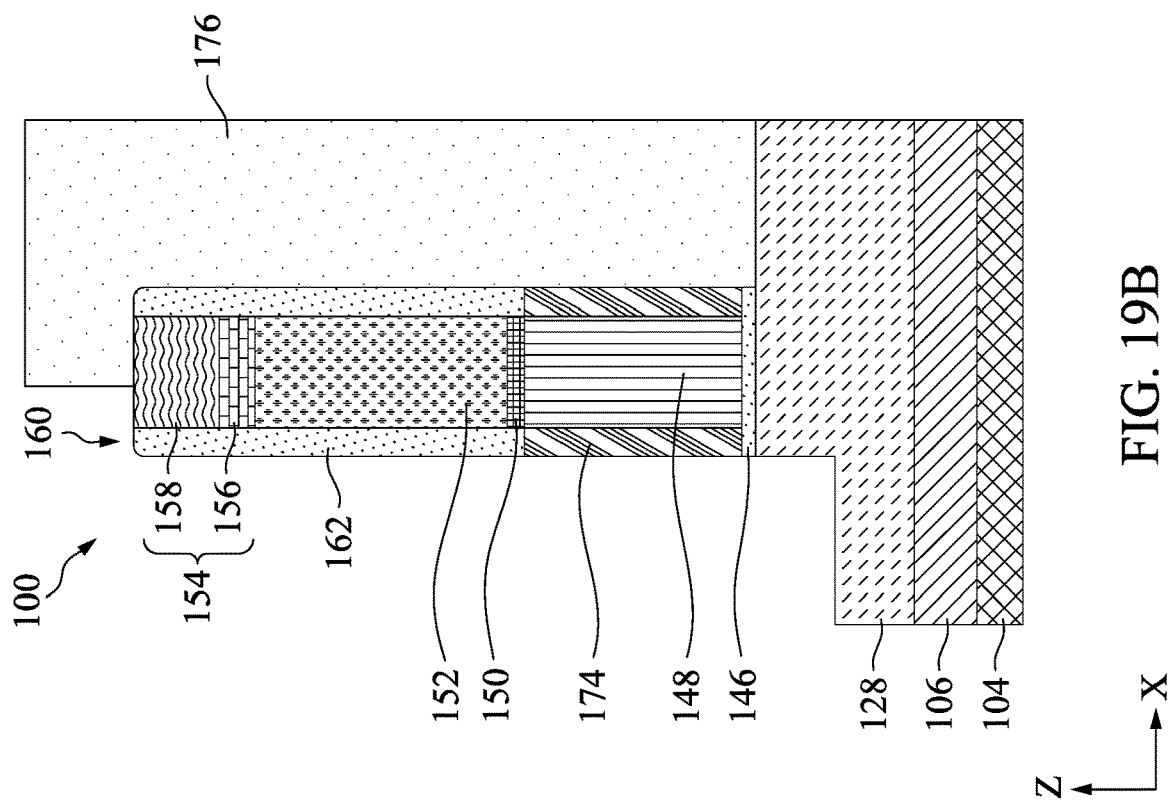
Figure 19A:
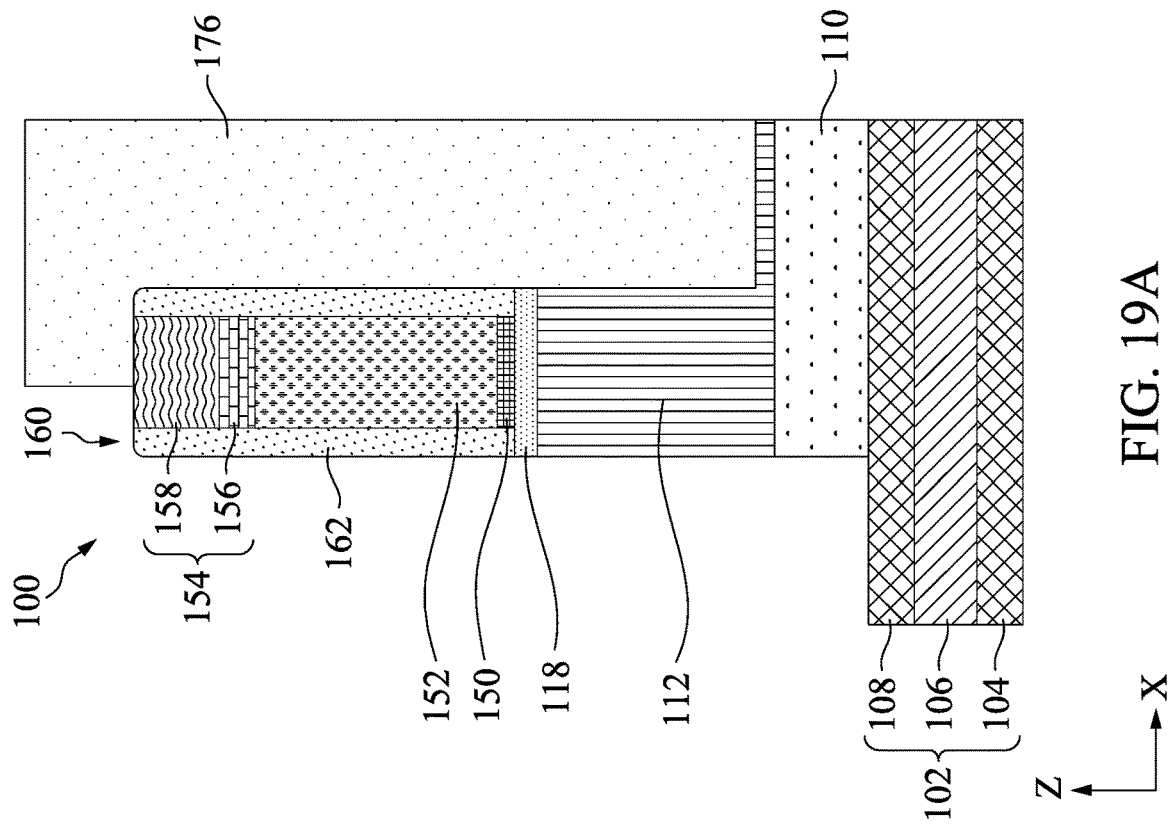

FIG. 18 is a perspective view of one of various stages of manufacturing the semiconductor device structure 100, in accordance with some embodiments. FIGS. 19A-19D are cross-sectional side views of the stage of manufacturing the semiconductor device structure 100 of FIG. 18 taken along lines A-A, B-B, C-C, D-D of FIG. 10, respectively, in accordance with some embodiments. As shown in FIGS. 18 and 19A-19D, the semiconductor layers 112, the sacrificial semiconductor layers 110, and portions of the spacer 128 located on one side of the sacrificial gate stack 160 are removed, exposing the second semiconductor layers 108. The removal of the materials may be performed by one or more etch processes, such as a dry etch, a wet etch, or a combination thereof. In some embodiments, the etch process is selective, and the spacers 162, the nitrogen-containing layer 158, the high-K dielectric material 134, and the liner 130 are not substantially affected.

As shown in FIGS. 19A-19D, a mask 176 is formed on the materials on the other side of the sacrificial gate stack 160 prior to removal of the materials. The mask 176 may be a photoresist that is patterned to cover the exposed semiconductor layers 112 and spacer 128 on one side of the sacrificial gate stack 160 while leaving the semiconductor layers 112 and spacer 128 on the other side of the sacrificial gate stack 160 exposed. The mask 176 protects the semiconductor layer 112 and the spacer 128 on the other side of the sacrificial gate stack 160 during the removal process.

FIG. 20 is a perspective view of one of various stages of manufacturing the semiconductor device structure 100, in accordance with some embodiments. FIG. 21 is a cross-sectional side view of the stage of manufacturing the semiconductor device structure 100 of FIG. 20, in accordance with some embodiments. As shown in FIG. 20, sacrificial semiconductor materials 178 are formed on the exposed second semiconductor layers 108. The sacrificial semiconductor materials 178 may be selectively formed on the semiconductor material of the second semiconductor layers 108 but not on the dielectric materials of the high-K dielectric materials 134 and the mask 176 (FIGS. 19A-19D). The mask 176 prevents the sacrificial semiconductor materials 178 from forming on the semiconductor layer 112 on the other side of the sacrificial gate stack 160. The sacrificial semiconductor materials 178 may grow to the same level as the top surface 140 (FIG. 12) of the spacer 128, which has been removed. The sacrificial semiconductor materials 178 may be formed on the spacer 128 and in contact with the liner 130, as shown in FIG. 20.

After forming the sacrificial semiconductor materials 178 on the second semiconductor layers 108 and the spacer 128, the mask 176 (FIGS. 19A-19D) is removed. The mask 176 may be removed by any suitable process, such as stripping. The removal process may be selective so that materials other than the mask 176 are not removed. S/D epitaxial features 180S, 180D, 182S, 182D are formed, as shown in FIG. 20, FIG. 21, and FIGS. 22A-22D. In some embodiments, the S/D epitaxial features 180S, 180D may include one or more layers of Si, SiP, SiC and SiCP for the NFET, and the S/D epitaxial features 182S, 182D may include one or more layers of Si, SiGe, Ge for the PFET. For example, the S/D epitaxial features 180S, 180D may be in contact with the semiconductor layer 112 under the sacrificial gate stack 160, which is the channel region for the NFET, and the S/D epitaxial features 182S, 182D may be in contact with the semiconductor layers 116 under the sacrificial gate stack 160, which is the channel region for the PFET. In some embodiments, the S/D epitaxial features 180S, 180D may be formed with a first material on the sacrificial semiconductor material 178, while a mask (not shown) covers the semiconductor layers 112 to prevent the formation of the S/D epitaxial features 182S, 182D. Then, the mask formed on the semiconductor layers 112 is removed, and another mask (not shown) is formed on the S/D epitaxial features 180S, 180D. Then, the S/D epitaxial features 182S, 182D may be formed with a second material different from the first material on the semiconductor layers 112.

In some embodiments, the S/D epitaxial features 180S, 182S are the source regions, and the S/D epitaxial features 180D, 182D are the drain regions. The S/D epitaxial features 180S, 180D, 182S, 182D may be formed by an epitaxial growth method using CVD, ALD or MBE. The S/D epitaxial features 180S, 180D, 182S, 182D may grow both vertically and horizontally to form facets, as shown in FIGS. 20 and 21. As shown in FIGS. 20 and 21, each S/D epitaxial feature 180S, 182S is formed on the sacrificial semiconductor material 178, and each S/D epitaxial feature 180D, 182D is formed on the semiconductor layer 112. Because the sacrificial semiconductor material 178 has larger dimensions than those of the semiconductor layer 112, the shape of the S/D epitaxial features 180S, 182S is different from the shape of the S/D epitaxial features 180D, 182D. Thus, the source region, i.e., the S/D epitaxial feature 180S or 182S, has a shape different from a shape of the drain region, i.e., the S/D epitaxial feature 180D or 182D.

Figure 23B:
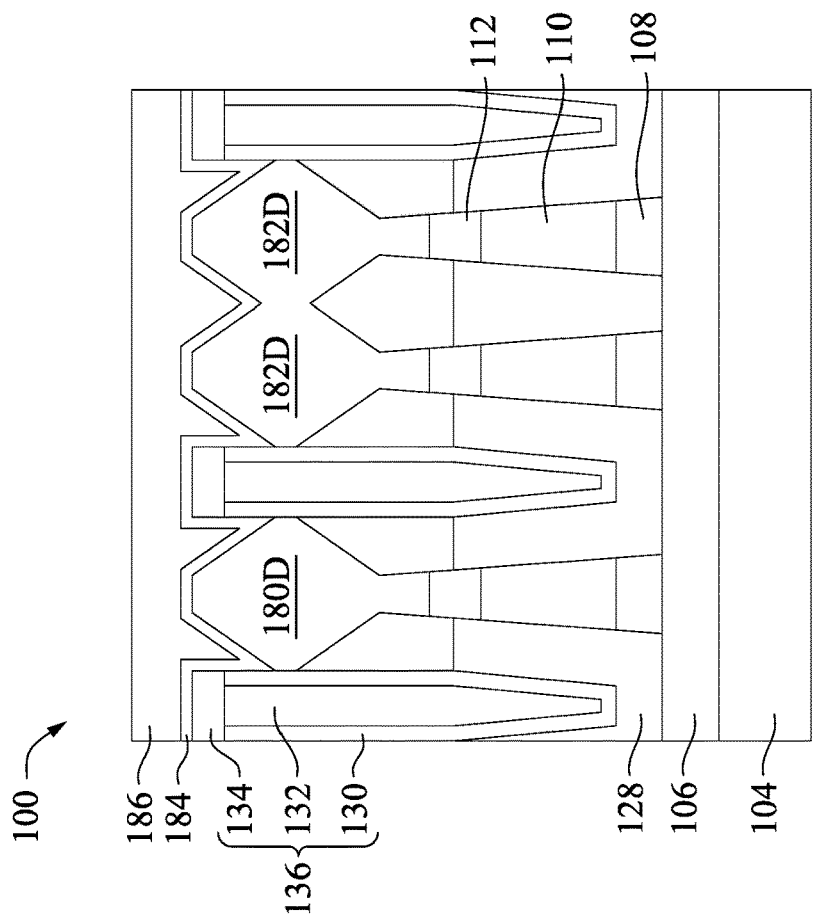
FIGS. 23A-23B are cross-sectional side views of one of various stages of manufacturing the semiconductor device structure, in accordance with some embodiments.
Figure 23A:
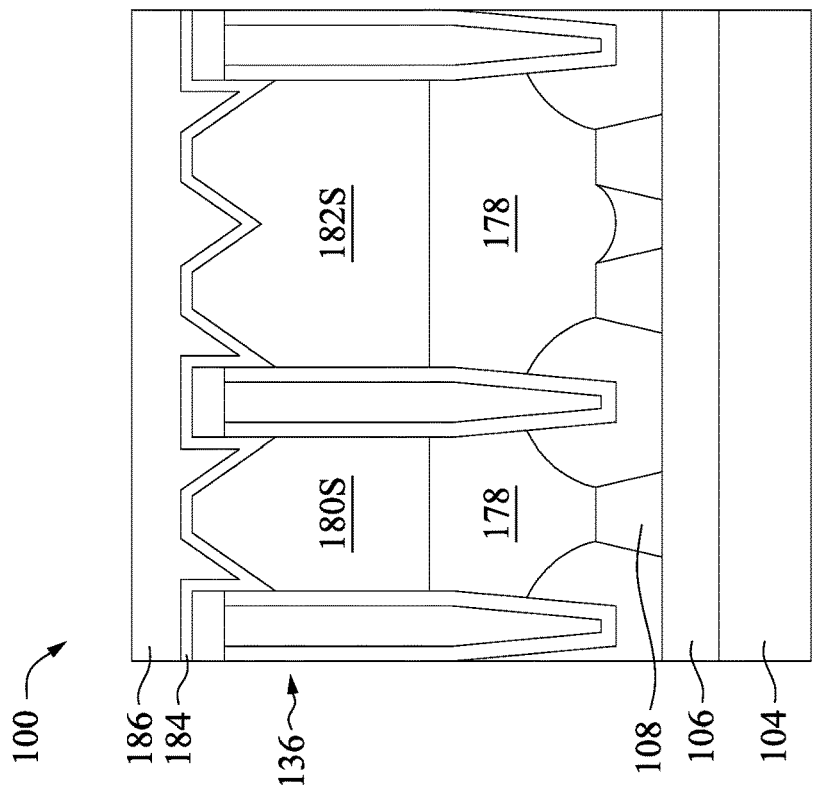
Figure 24B:
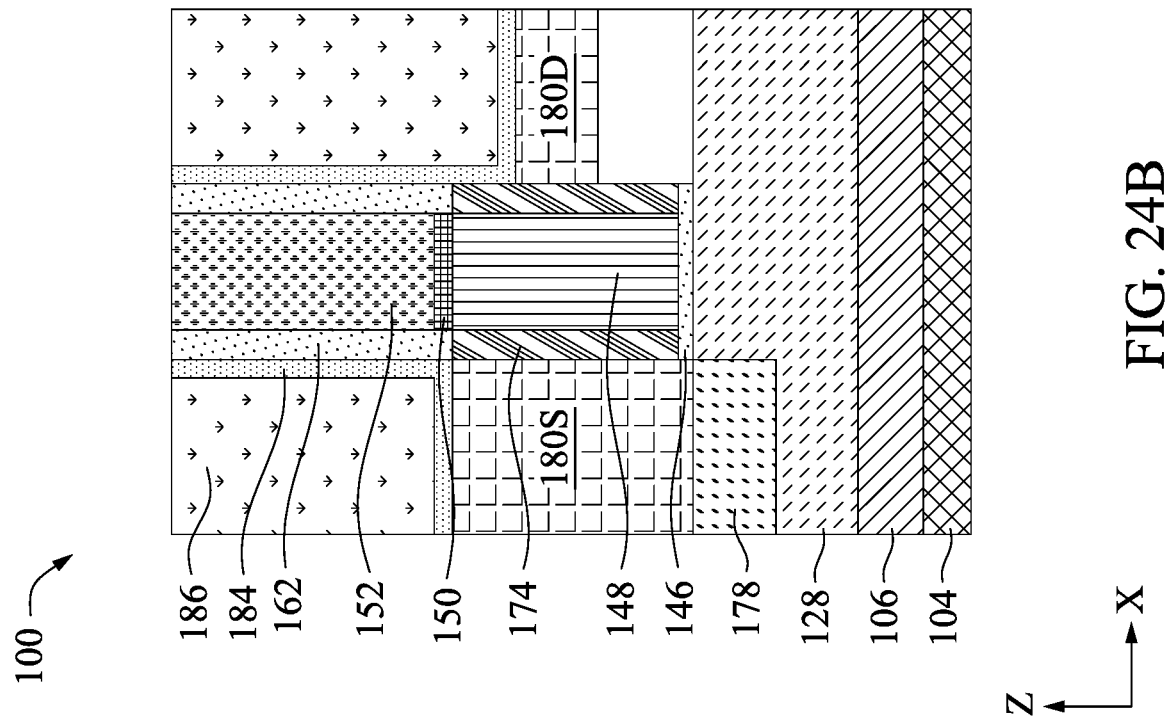
FIGS. 24A-24D are cross-sectional side views of the stage of manufacturing the semiconductor device structure of FIGS. 23A-23B taken along lines A-A, B-B, C-C, D-D of FIG. 10, respectively, in accordance with some embodiments.
Figure 24A:
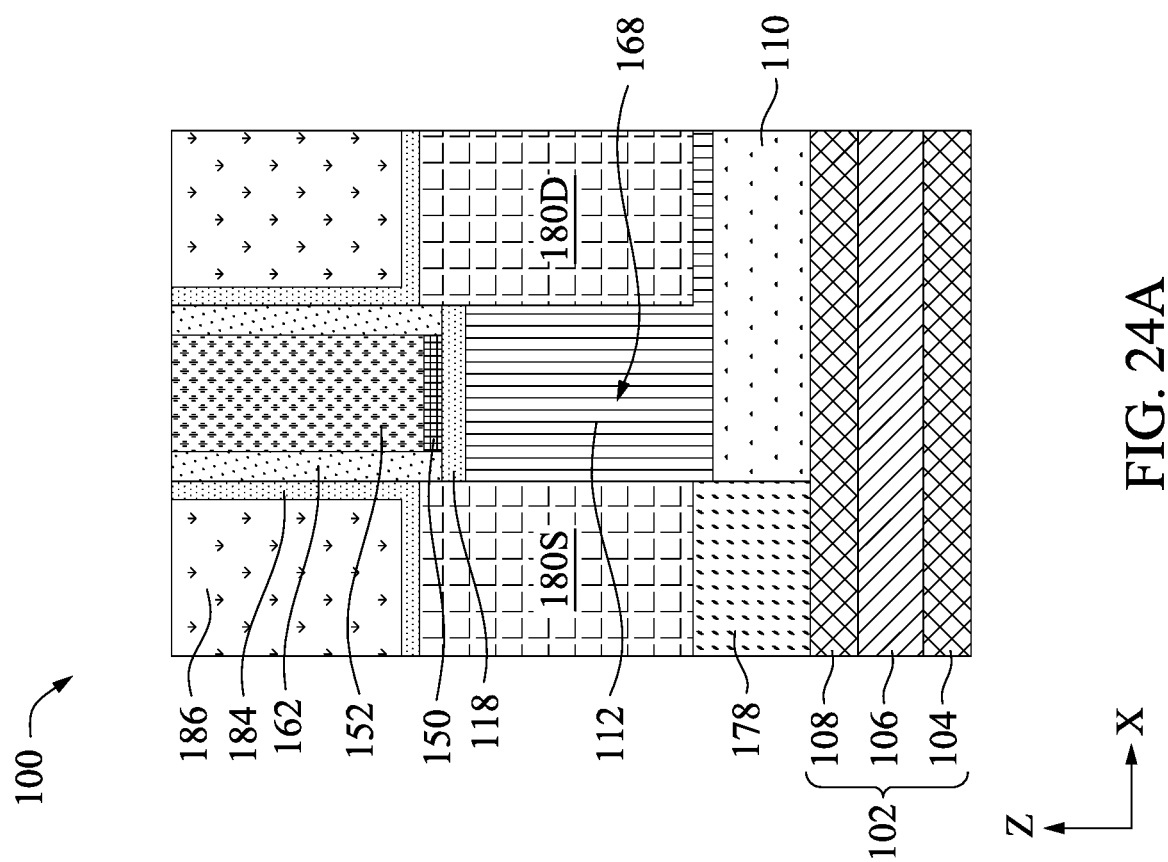
Figure 24D:
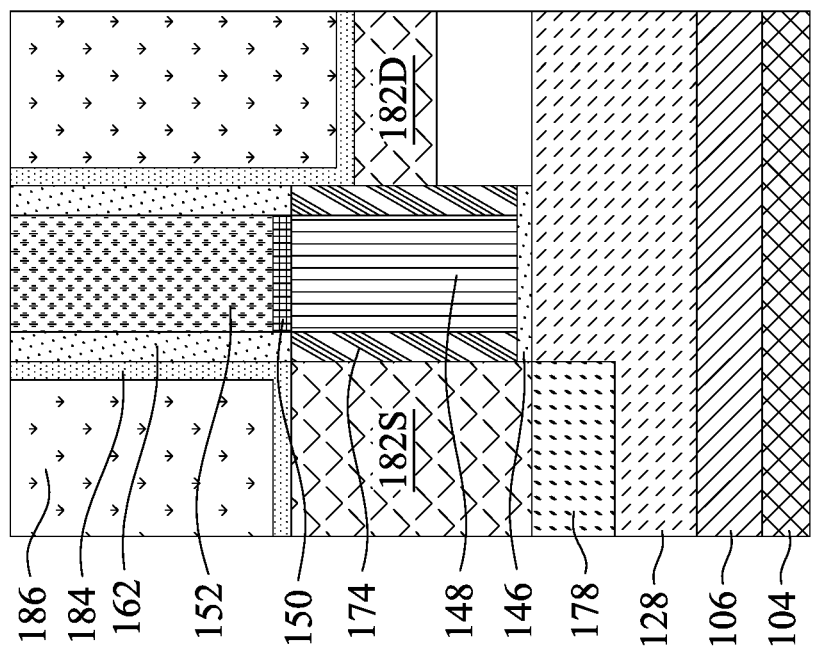
Figure 24C:
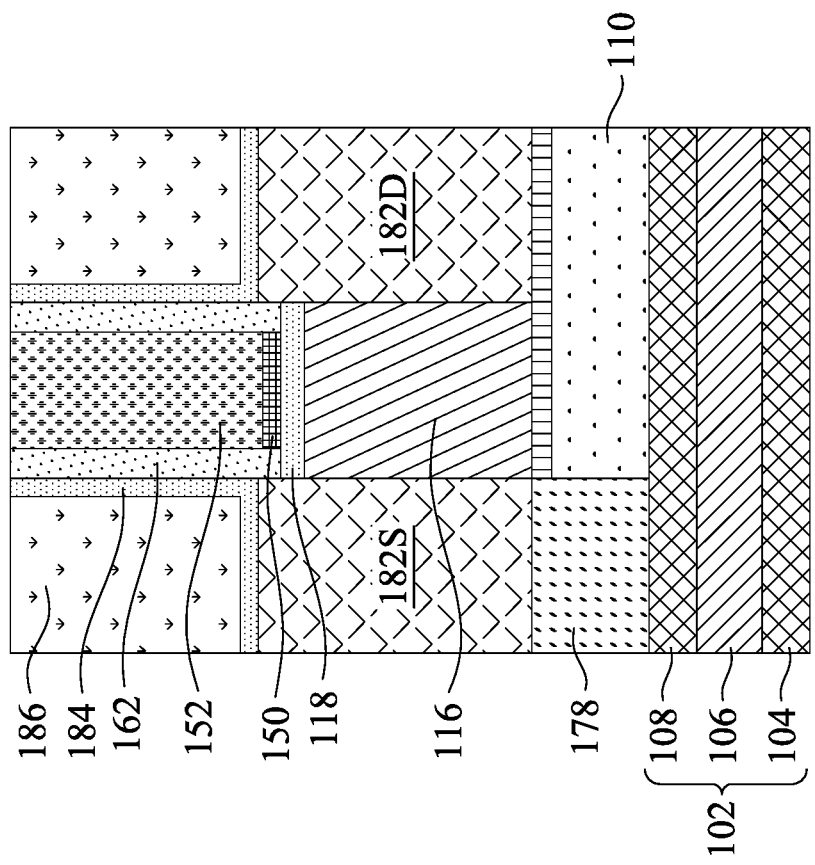

As shown in FIGS. 23A and 23B, a contact etch stop layer (CESL) 184 may be formed on the S/D epitaxial features 180S, 180D, 182S, 182D and the dielectric features 136. The CESL 184 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 184 may be formed by CVD, PECVD, ALD, or any suitable deposition technique. In some embodiments, the CESL 184 is a conformal layer formed by the ALD process. An interlayer dielectric (ILD) layer 186 may be formed on the CESL 184. The ILD layer 186 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 186 may be deposited by a PECVD process or other suitable deposition technique. In some embodiments, after formation of the ILD layer 186, the semiconductor device structure 100 may be subject to a thermal process to anneal the ILD layer 186.

A planarization process is performed to expose the sacrificial gate electrode layer 152, as shown in FIGS. 24A-24D. The planarization process may be any suitable process, such as a CMP process. The planarization process removes portions of the ILD layer 186 and the CESL 184 disposed on the sacrificial gate stacks 160. The planarization process may also remove the mask structure 154 (FIGS. 22A-22D).

Figure 25:
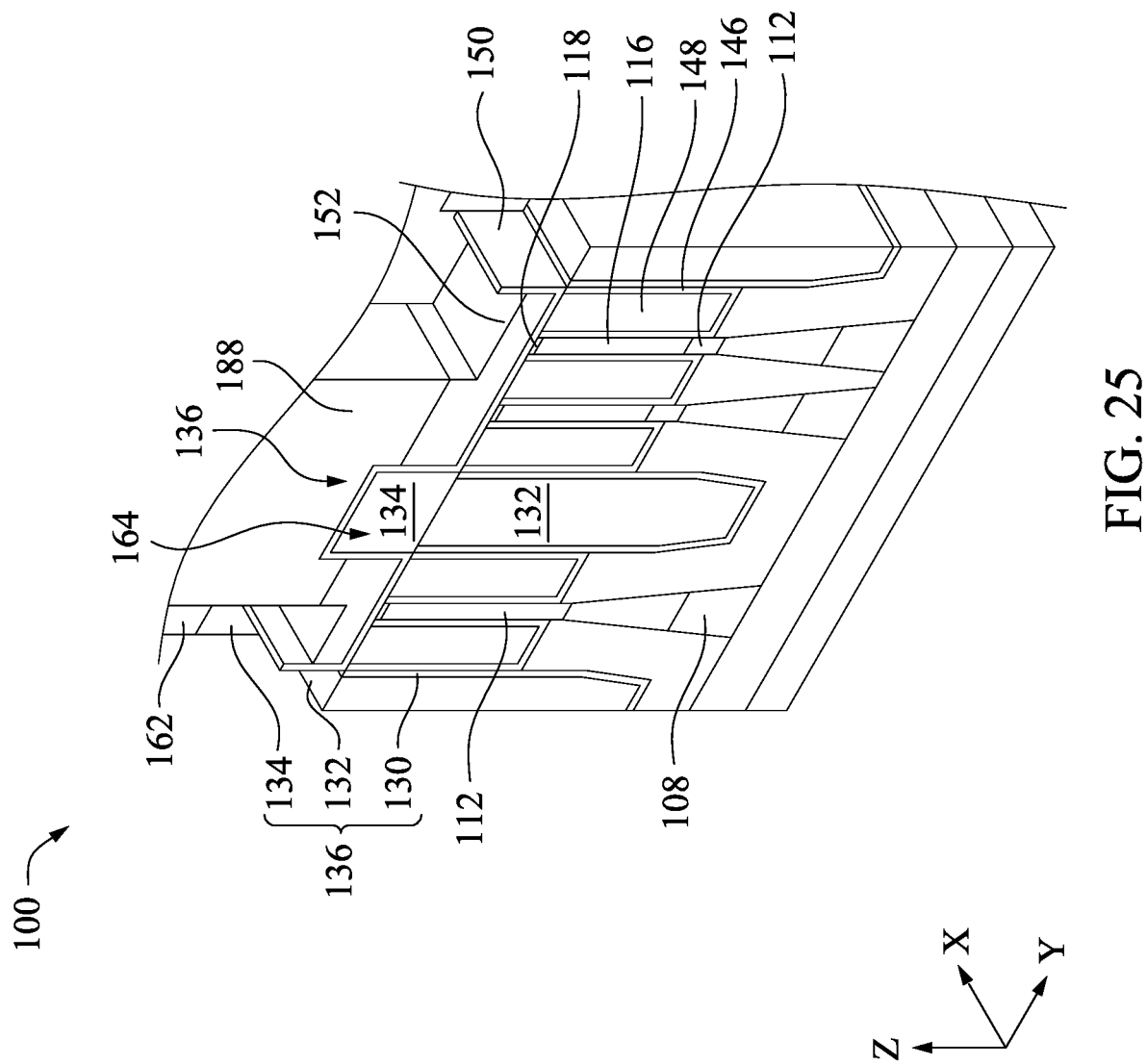
FIG. 25 is a perspective view of one of various stages of manufacturing the semiconductor device structure, in accordance with some embodiments.
Figure 26B:
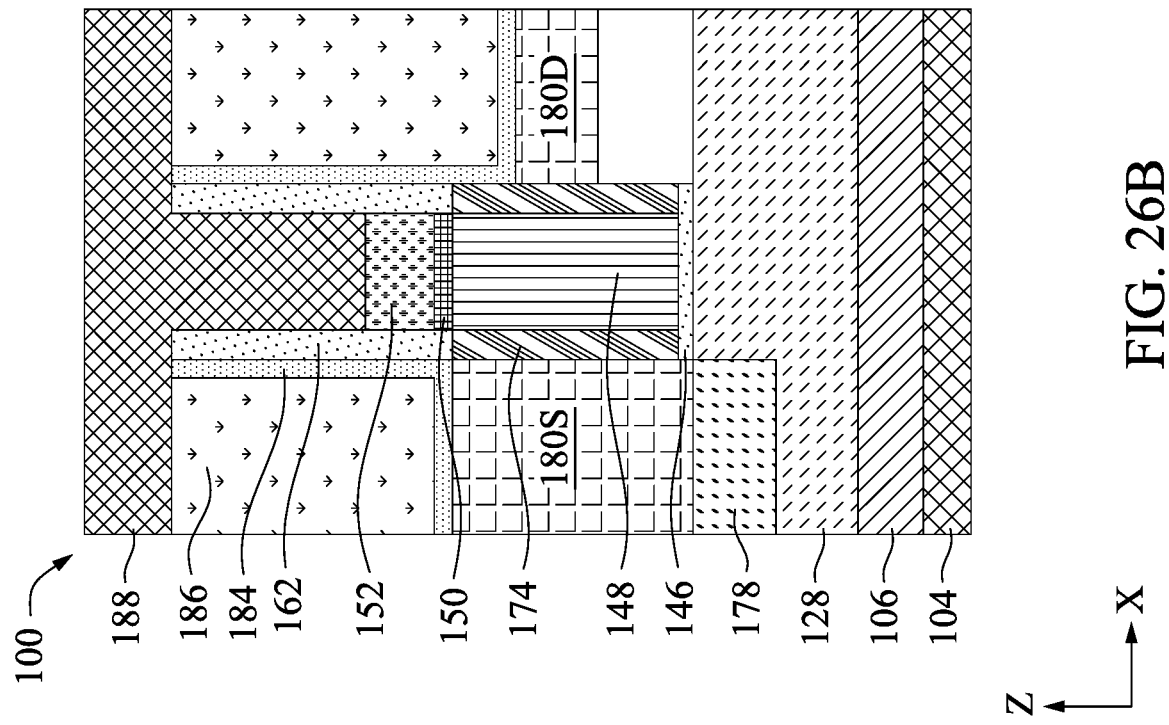
FIGS. 26A-26D are cross-sectional side views of the stage of manufacturing the semiconductor device structure of FIG. 25 taken along lines A-A, B-B, C-C, D-D of FIG. 10, respectively, in accordance with some embodiments.
Figure 26A:
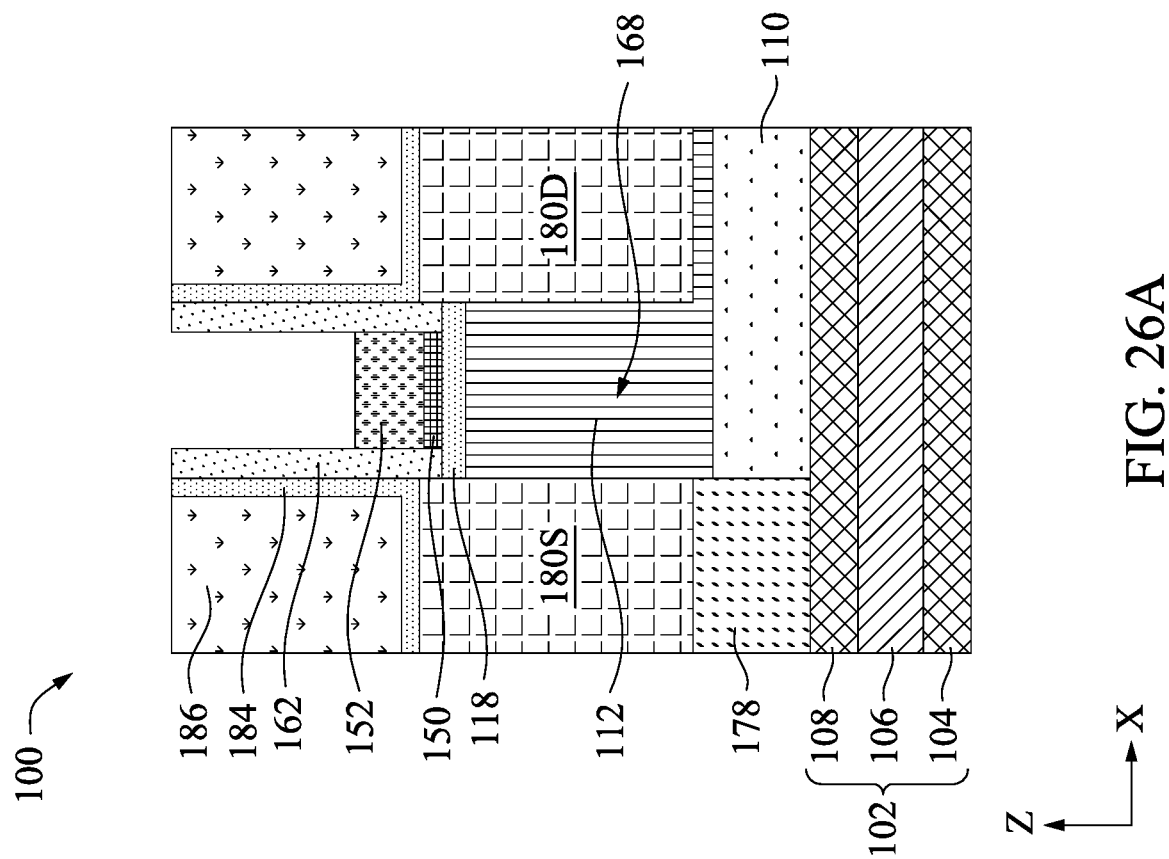
Figure 26D:
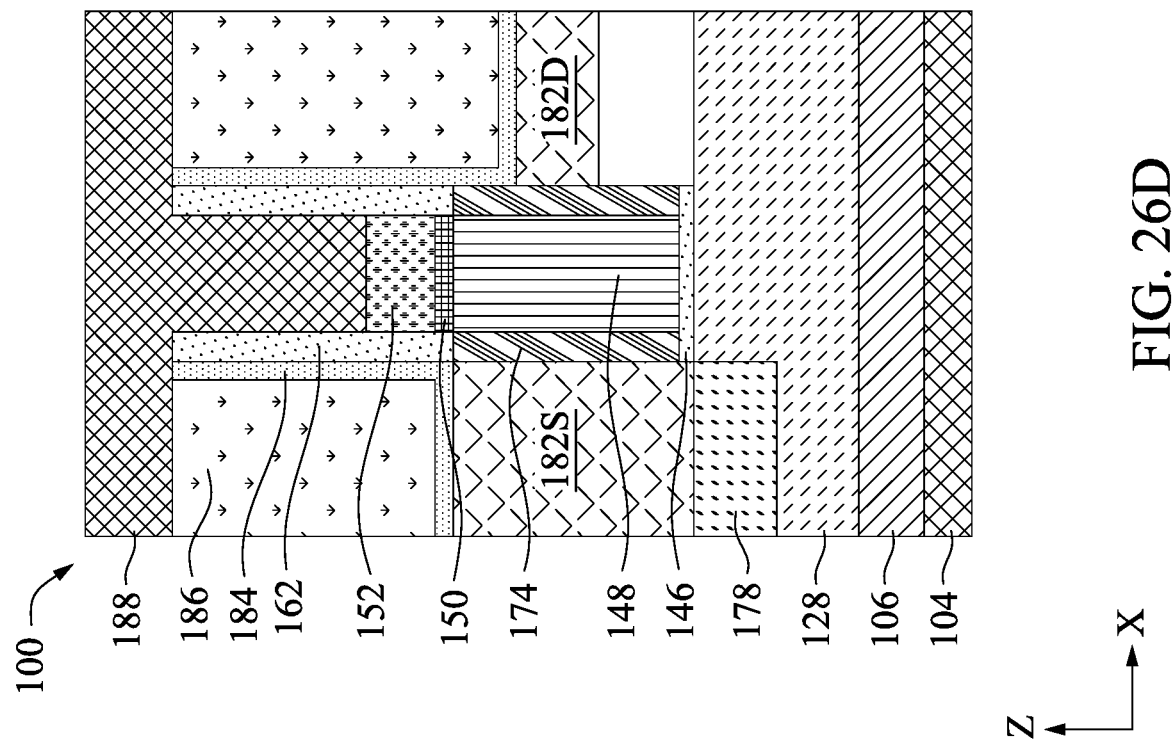
Figure 26C:
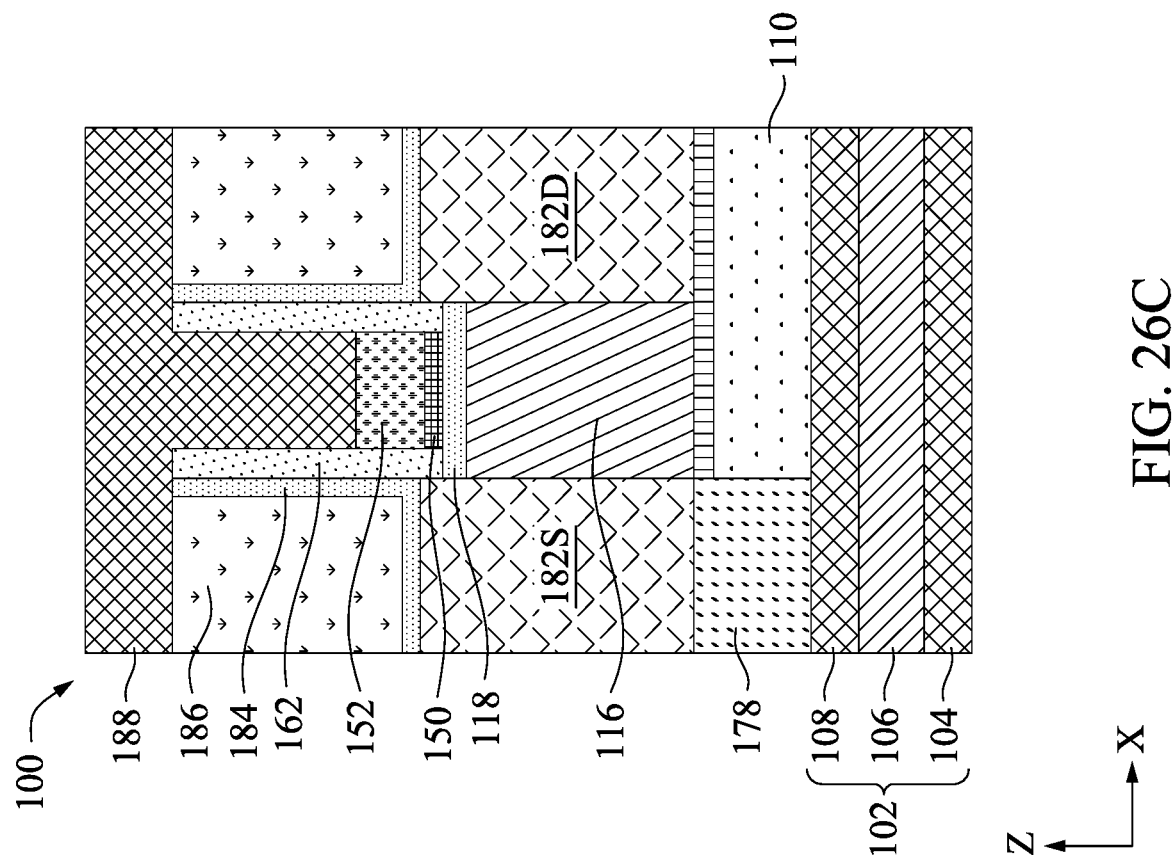

FIG. 25 is a perspective view of one of various stages of manufacturing the semiconductor device structure 100, in accordance with some embodiments. FIGS. 26A-26D are cross-sectional side views of the stage of manufacturing the semiconductor device structure 100 of FIG. 25 taken along lines A-A, B-B, C-C, D-D of FIG. 10, respectively, in accordance with some embodiments. As shown in FIGS. 25 and 26A-26D, a portion of the sacrificial gate electrode layer 152 is removed, and the remaining sacrificial gate electrode layer 152 is below the level of the top of the first portion 164 of the high-K dielectric material 134. In other words, the sacrificial gate electrode layer 152 is recessed to a level below the top of the first portion 164 of the high-K dielectric material 134, and the portions of the sacrificial gate dielectric layer 150 formed on the high-K dielectric materials 134 are exposed. The portion of the sacrificial gate electrode layer 152 may be removed by any suitable process, such as dry etch, wet etch, or a combination thereof. In some embodiments, a wet etchant such as a tetramethylammonium hydroxide (TMAH) solution can be used to selectively remove the sacrificial gate electrode layer 1504 but not the ILD layer 186 and the CESL 184. In some embodiments, a portion of the spacer 162 may be removed by the etch process that removes the portion of the sacrificial gate electrode layer 152.

As shown in FIGS. 25, 26B, 26C and 26D, a mask 188 is formed on a portion of the exposed portions of the sacrificial gate dielectric layer 150, and the mask 188 may extend along the X direction, which also covers a portion of the spacer 162, the CESL 184, and the ILD layer 186. The mask 188 may be formed by first forming a blanket layer on the semiconductor device structure 100, followed by pattern and etch processes to remove portions of the blanket layer to form the mask 188. The mask 188 may include an oxygen-containing material and/or a nitrogen-containing material. In some embodiments, the mask 188 is a photoresist formed by first forming a blanket photoresist layer on the semiconductor device structure 100, followed by pattern the photoresist to form the mask 188.

The mask 188 may be formed over one or more of the first portions 164 of the high-K dielectric material 134. The mask 188 protects the one or more of the first portions 164 of the high-K dielectric material 134 from being removed in order to separate, or cut-off, the subsequently formed gate electrode layer 194 (FIG. 29). The unprotected first portions 164 of the high-K dielectric material 134 may be removed or recessed, leading to the subsequently formed gate electrode layer 194 (FIG. 29) connecting adjacent channel regions. In some embodiments, the high-K dielectric materials 134 not covered by the mask 188 are removed, as shown in FIG. 25. In other embodiments, the high-K dielectric materials 134 not covered by the mask 188 are recessed to a height less than or equal to about 5 nm, which allows the gate electrode layer 194 (FIG. 29) to form thereover. In other words, if it is predetermined that the gate electrode layers 194 (FIG. 29) in adjacent channel regions should be separated, or cut-off, the mask 188 is formed on the first portion 164 of the high-K dielectric material 134 of the dielectric feature 136 formed between the adjacent channel regions, such as between the NFET channel regions and PFET channel regions, as shown in FIG. 25. On the other hand, if it is predetermined that the gate electrode layers 194 (FIG. 29) in adjacent channel regions should be connected, the mask 188 is not formed on the first portion 164 of the high-K dielectric material 134 of the dielectric feature 136 formed between the adjacent channel regions. If the gate electrode layers 194 (FIG. 29) are connected, then a single signal (i.e., an electrical current) sent to the gate electrode layers may control both adjacent channel regions. If the gate electrode layers are cut-off, then independent signal (i.e., independent electrical current) may be sent to each gate electrode layer to separately control each of the adjacent channel regions.

Figure 27:
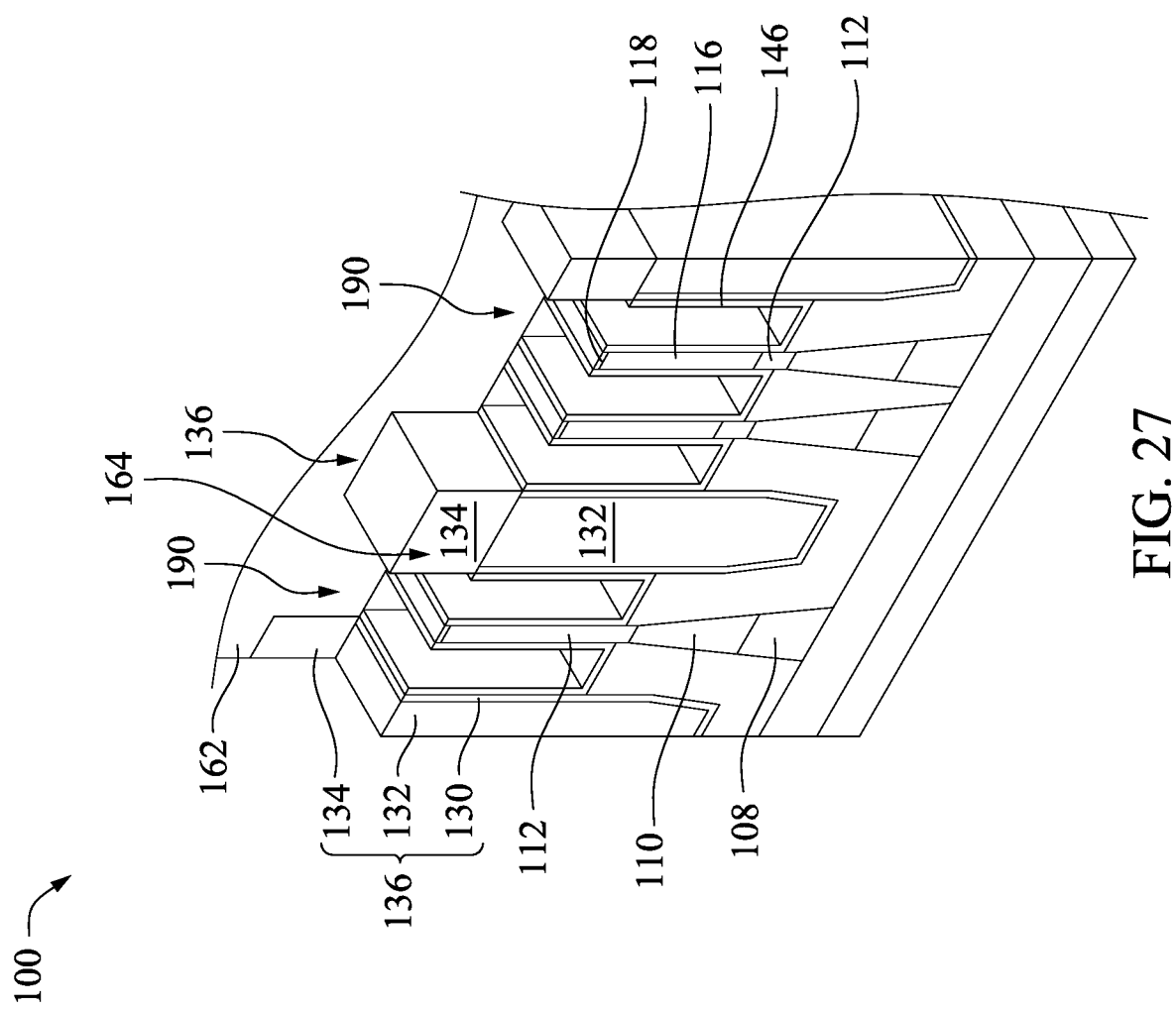
FIG. 27 is a perspective view of one of various stages of manufacturing the semiconductor device structure, in accordance with some embodiments.

FIG. 27 is a perspective view of one of various stages of manufacturing the semiconductor device structure 100, in accordance with some embodiments. FIGS. 28A-28D are cross-sectional side views of the stage of manufacturing the semiconductor device structure 100 of FIG. 27 taken along lines A-A, B-B, C-C, D-D of FIG. 10, respectively, in accordance with some embodiments. As shown in FIGS. 27 and 28A-28D, the remaining portion of the sacrificial gate electrode layer 152 is removed, followed by the removal of the sacrificial gate dielectric layer 150 and the sacrificial semiconductor materials 148. The remaining portion of the sacrificial gate electrode layer 152 may be removed by any suitable process, such as dry etch, wet etch, or a combination thereof. In some embodiments, a wet etchant such as a tetramethylammonium hydroxide (TMAH) solution can be used to selectively remove the sacrificial gate electrode layer 152 but not the ILD layer 186, the sacrificial gate dielectric layer 150, and the CESL 184.

Figure 28D:
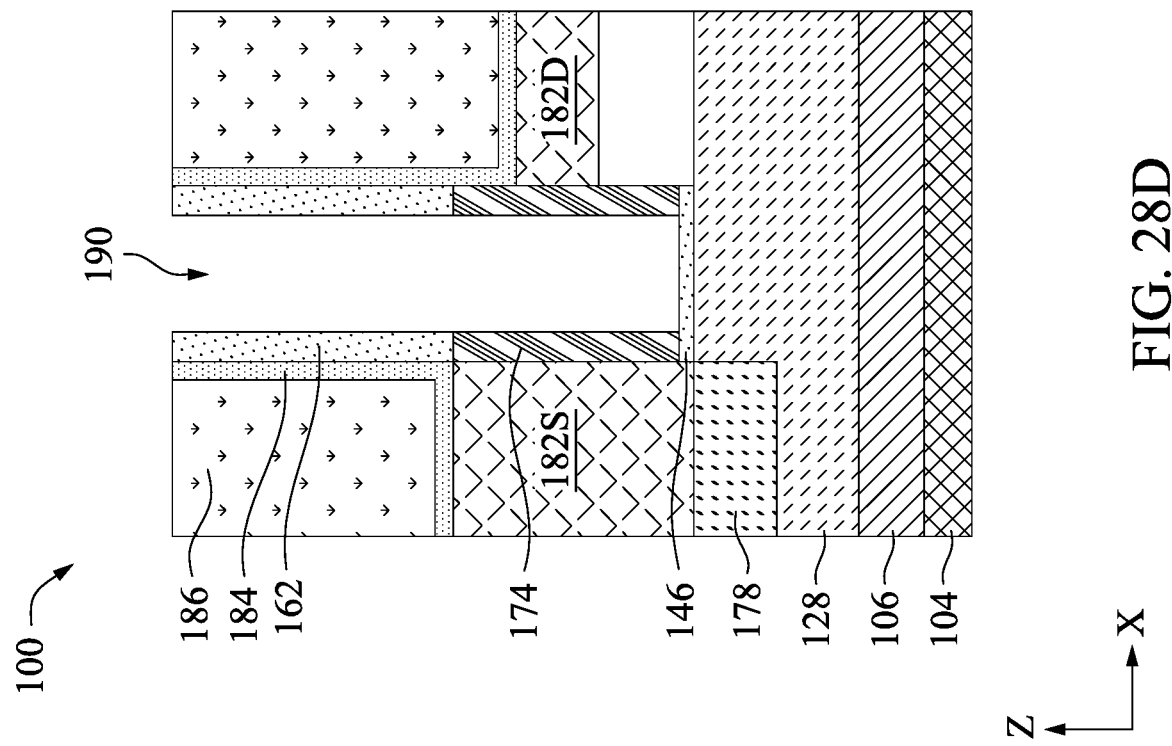
Figure 28C:
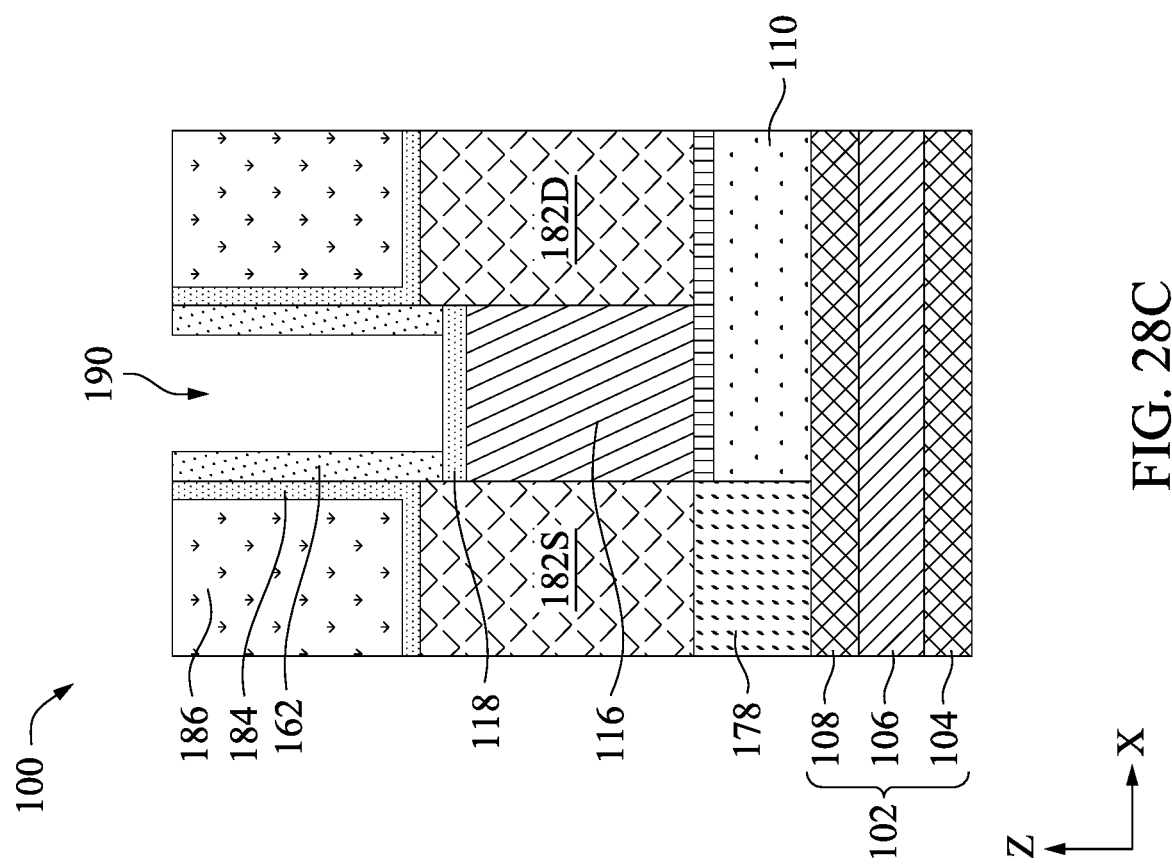

After the removal of the sacrificial gate electrode layer 152, the remaining portion of the sacrificial gate dielectric layer 150 and the sacrificial semiconductor materials 148 are removed. The removal processes expose the cap layer 118, the liner 146, and the inner spacers 174, as shown in FIGS. 27 and 28A-28D. The removal process may be any suitable processes, such as dry etch, wet etch, or a combination thereof. In some embodiments, a first etch process may be performed to remove the remaining portion of the sacrificial gate dielectric layer 150, followed by a second etch process to remove the sacrificial semiconductor materials 148. The first etch process may be a selective etch process that removes the remaining portion of the sacrificial gate dielectric layer 150 but not the high-K dielectric material 134, the spacers 162, and the ILD layer 186. Similarly, the second etch process may be a selective etch process that removes the sacrificial semiconductor materials 148 but not the high-K dielectric material 134, the inner spacers 174, and the ILD layer 186. As a result, openings 190 are formed in the channel regions of the semiconductor device structure 100. The openings 190 may extend to between S/D epitaxial features 180S, 180D and between S/D epitaxial features 182S, 182D, as shown in FIGS. 28B and 28D. The openings 190 may be formed on opposite sides of the semiconductor layer 112 and semiconductor layers 116, as shown in FIG. 27.

FIG. 29 is a cross-sectional side view of one of various stages of manufacturing the semiconductor device structure 100, in accordance with some embodiments. FIGS. 30A-30D are cross-sectional side views of the stage of manufacturing the semiconductor device structure 100 of FIG. 29 taken along lines A-A, B-B, C-C, D-D of FIG. 10, respectively, in accordance with some embodiments. As shown in FIGS. 29 and 30A-30D, the liner 146 is removed by any suitable removal process, such as a dry etch, a wet etch, or a combination thereof. The liner 146 may have been damaged during the removal of the sacrificial semiconductor materials 148. The removal of the liner 146 may be a selective process that does not remove materials other than the liner 146. After the liner 146 is removed, liners 192 may be conformally formed on the exposed surfaces of the semiconductor device structure 100, and gate dielectric layers 193 may be conformally formed on the liner 192. The liner 192 may be an oxide layer, and the gate dielectric layer 193 may include the same material as the sacrificial gate dielectric layer 150 (FIG. 11). In some embodiments, the gate dielectric layer 193 includes a high-K dielectric material. The liners 192 and the gate dielectric layers 193 may be formed by any suitable processes, such as ALD processes.

Next, the gate electrode layers 194 are formed in the openings 190 (FIGS. 27 and 28A-28D) and on the gate dielectric layers 193. The gate electrode layer 194 is formed on the gate dielectric layer 193 and over each fin 126. The gate electrode layer 194 may be also formed adjacent opposite sides of each fin 126, as shown in FIG. 29. In some embodiments, the semiconductor device structure 100 includes FinFET devices. The gate electrode layer 194 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layers 194 may be formed by PVD, CVD, ALD, electro-plating, or other suitable method.

Next, the gate electrode layers 194 are recessed to the level below the top of the first portion 164 of the high-K dielectric material 134 of the dielectric feature 136, as shown in FIG. 29. The recess of the gate electrode layers 194 may be any suitable process, such as a dry etch, a wet etch, or a combination thereof. In some embodiments, the recess process may be a selective dry etch process that does not substantially affect the ILD layer 186, the spacers 162, and the CESL 184, as shown in FIGS. 30A-30D. The liners 192 and the gate dielectric layers 193 may be recessed along with the gate electrode layers 194. As a result of the recess process, some adjacent gate electrode layers 194 are separated, or cut-off, by the dielectric feature 136.

After the recess of the gate electrode layers 194, a dielectric material 196 is formed over the gate electrode layers 194, and conductive features 198 may be formed in the dielectric material 196, as shown in FIGS. 29 and 30A-30D. The dielectric material 196 may include a low-K dielectric material, such as SiN, SiCN, SiOC, SiON, or SiOCN. In some embodiments, the dielectric material 196 is different from the material of the inner spacers 174. The dielectric material 196 may be formed by any suitable process, such as CVD, FCVD, or PECVD. The conductive features 198 may be formed through the dielectric material 196 and in contact with the gate electrode layers 194, as shown in FIG. 29. The conductive feature 198 may include a material having one or more of Ru, Mo, Co, Ni. W, Ti, Ta, Cu, Al, TiN and TaN, and may be formed by any suitable process, such as PVD, ECP, or CVD. The conductive feature 198 may provide a signal, such as an electrical current, to the gate electrode layer 194 located therebelow. Furthermore, the signal may be provided to adjacent gate electrode layer 194 over the low-K dielectric material 132 or remaining portion of the high-K dielectric material 134. Thus, adjacent gate electrode layers 194 may receive the signal from one conductive feature 198. A conductive contact (not shown) may be formed in the ILD layer 186 and may be electrically connected to the S/D epitaxial feature 180D or 182D via a silicide layer (not shown). In some embodiments, a conductive contact (not shown) may be formed in the ILD layer 186 and may be electrically connected to the S/D epitaxial feature 180S or 182S via a silicide layer (not shown).

Figure 31:
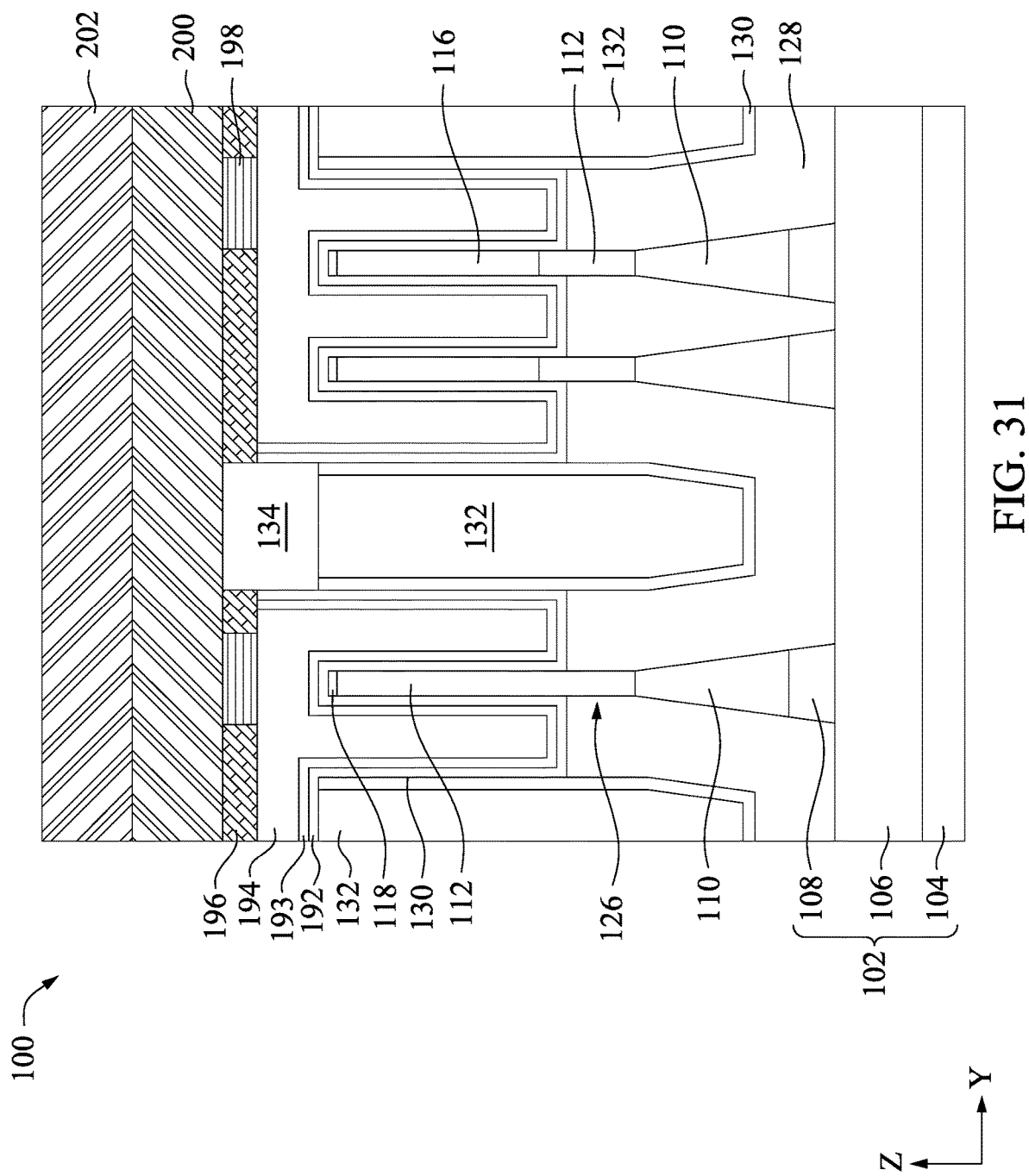
FIG. 31 is a cross-sectional side view of one of various stages of manufacturing the semiconductor device structure, in accordance with some embodiments.
Figure 32B:
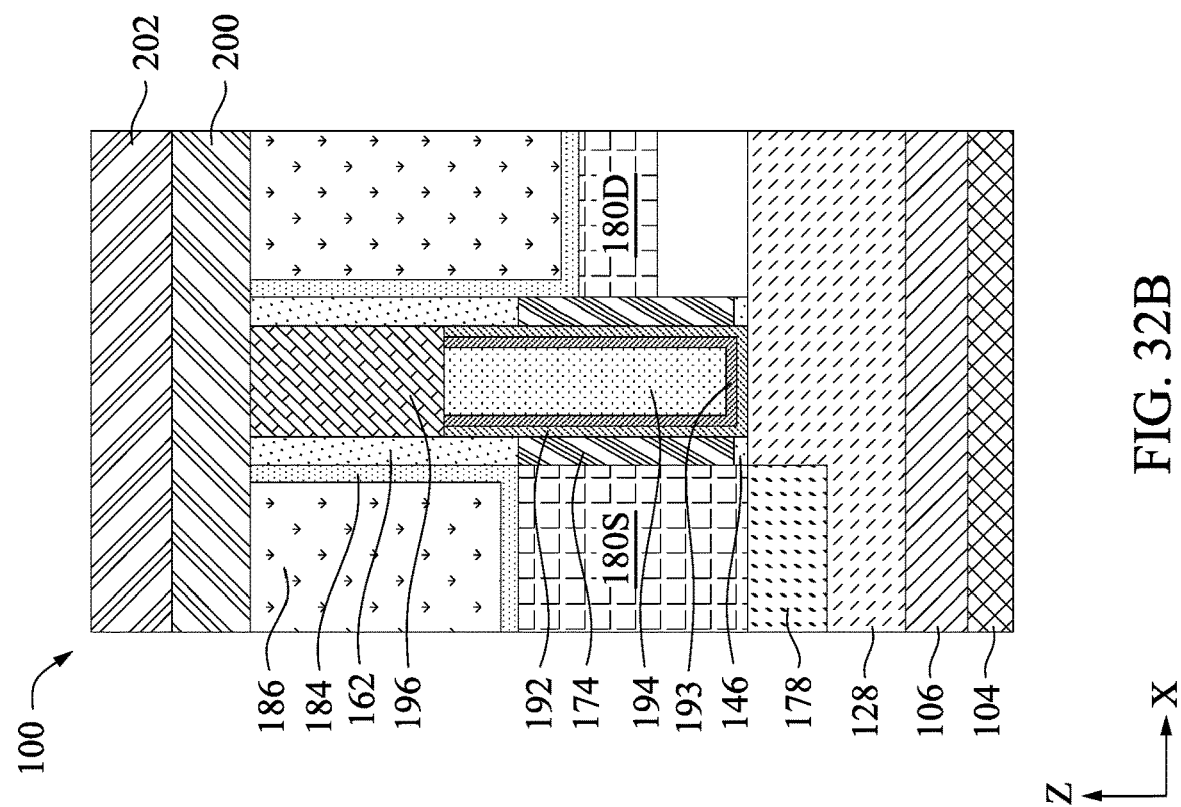
FIGS. 32A-32D are cross-sectional side views of the stage of manufacturing the semiconductor device structure of FIG. 31 taken along lines A-A, B-B, C-C, D-D of FIG. 10, respectively, in accordance with some embodiments.
Figure 32A:
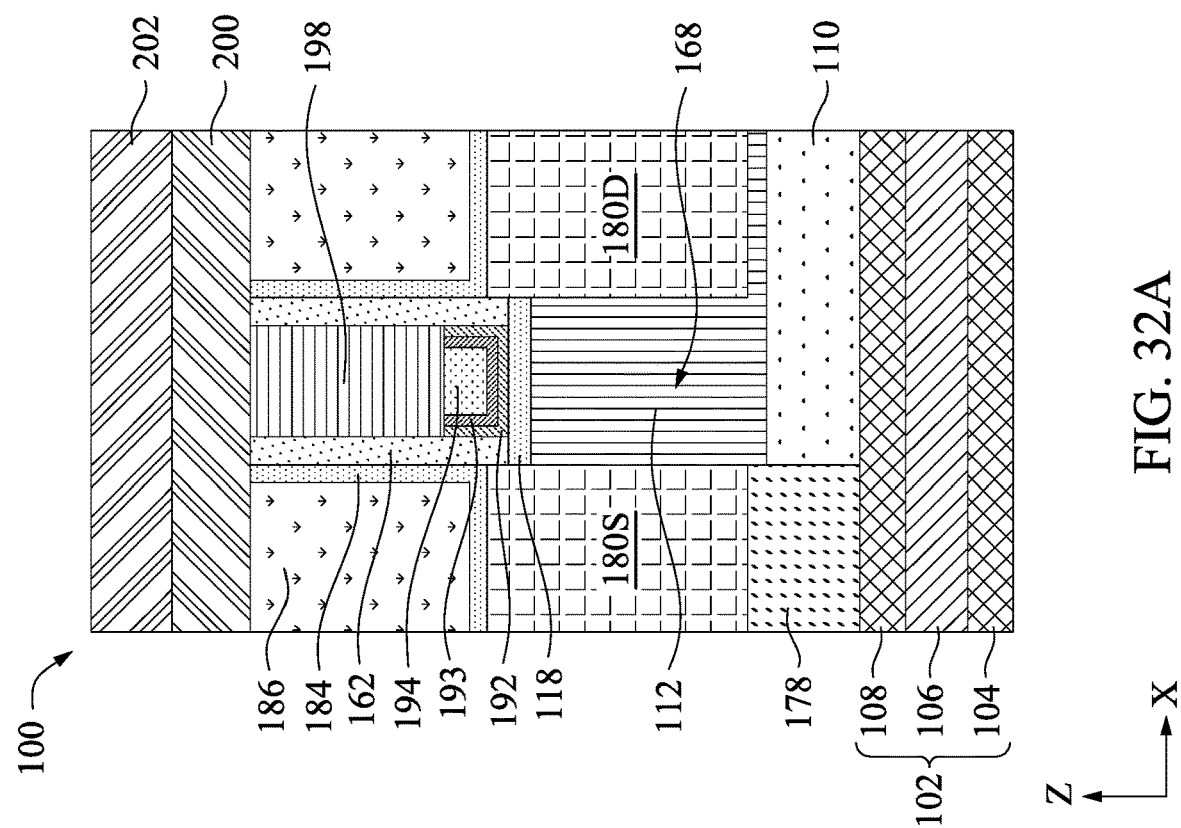
Figure 32D:
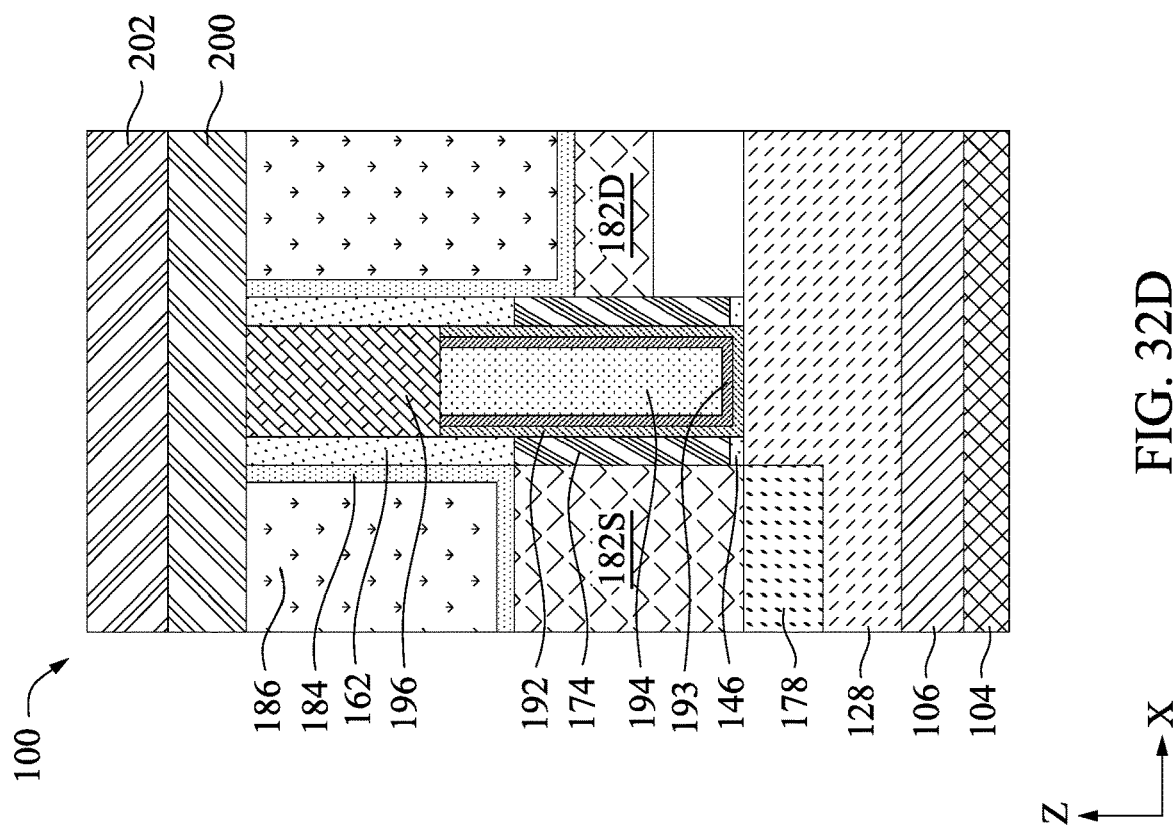
Figure 32C:
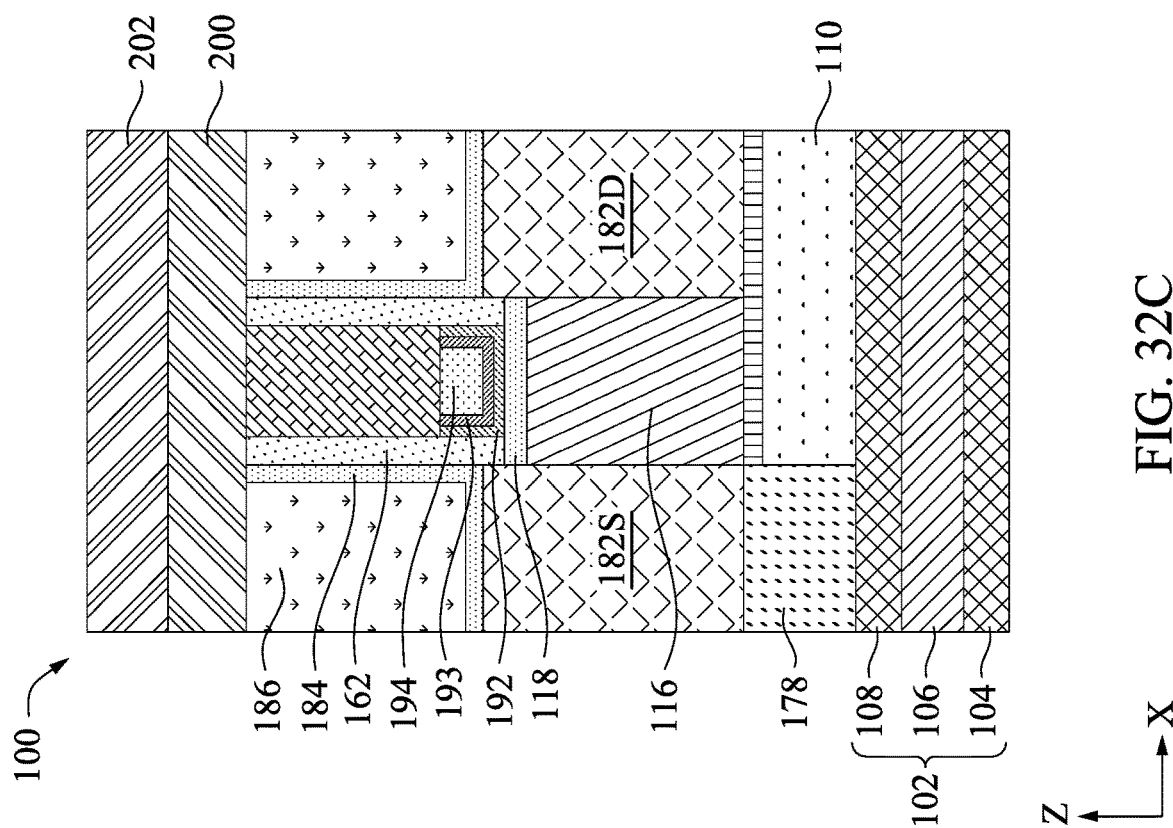

FIG. 31 is a cross-sectional side view of one of various stages of manufacturing the semiconductor device structure 100, in accordance with some embodiments. FIGS. 32A-32D are cross-sectional side views of the stage of manufacturing the semiconductor device structure 100 of FIG. 31 taken along lines A-A, B-B, C-C, D-D of FIG. 10, respectively, in accordance with some embodiments. As shown in FIGS. 31 and 32A-32D, an interconnecting structure 200 is formed on the semiconductor device structure 100. The interconnecting structure 200 includes a dielectric material having a plurality of metal lines (not shown) and vias (not shown) embedded therein. The metal lines and vias provide electrical paths to the features, such as the gate electrode layers 194 and S/D epitaxial features 180D, 182D. The semiconductor device structure 100 with the interconnecting structure 200 may be bonded to a carrier substrate 202. The carrier substrate 202 may be bonded to the interconnecting structure 200 using an adhesion. The carrier substrate 202 serves to provide mechanical support for the semiconductor device structure 100 so as to facilitate further processing.

Semiconductor devices may include multiple metal tracks, including power rails, such a positive voltage rail (VDD) and a ground rail (GND); and multiple signal lines. In some conventional semiconductor devices, the power rails and signal lines are located over the semiconductor device structure 100, such as in the interconnecting structure 200. As semiconductor device size shrinks, however, space for metal tracks, such as power rails and signal lines, decreases. Thus, one or more power rails may be formed on the back side of the semiconductor device structure 100. In some embodiments, the source region of the S/D epitaxial features 180S, 182S are connected to a power rail disposed therebelow. For example, the S/D epitaxial features 180S, 182S are connected to a power rail disposed therebelow, and the S/D epitaxial features 180D, 182D are connected to a power rail disposed thereabove.

Figure 33:
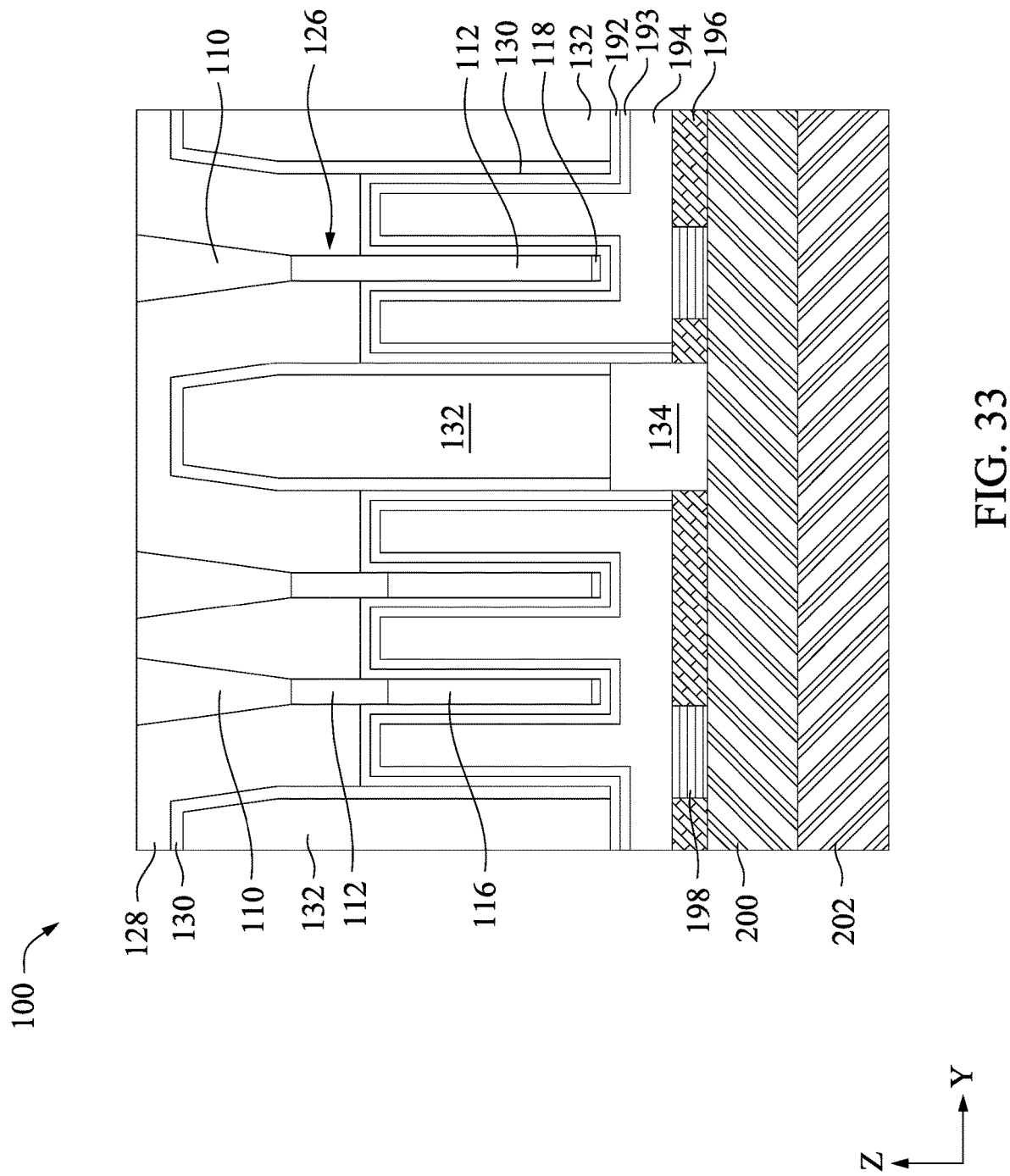
FIG. 33 is a cross-sectional side view of one of various stages of manufacturing the semiconductor device structure, in accordance with some embodiments.
Figure 34B:
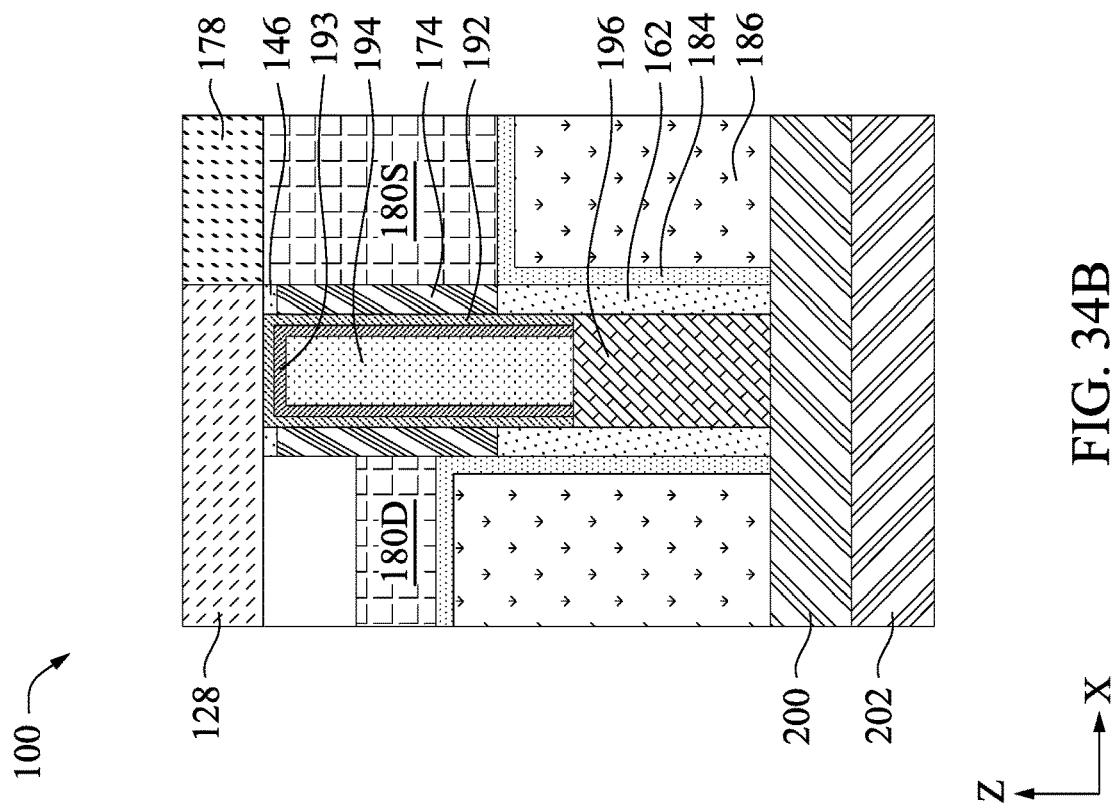
FIGS. 34A-34D are cross-sectional side views of the stage of manufacturing the semiconductor device structure of FIG. 33 taken along lines A-A, B-B, C-C, D-D of FIG. 10, respectively, in accordance with some embodiments.
Figure 34A:
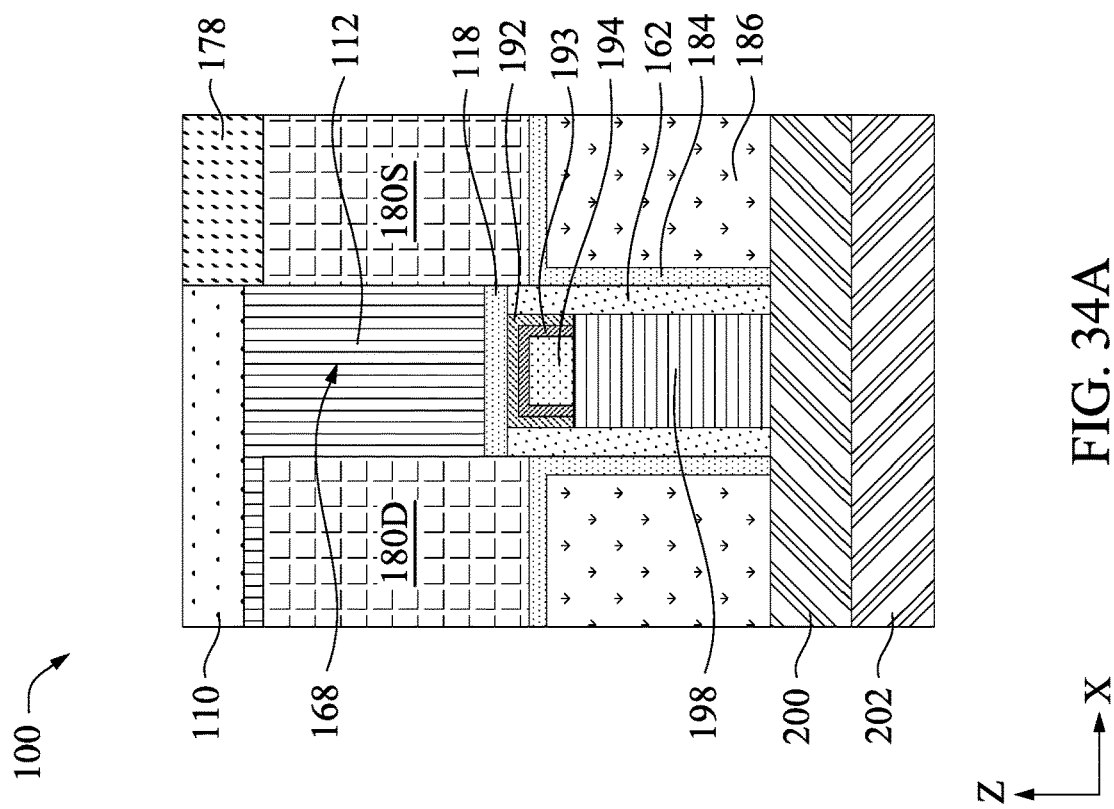
Figure 34D:
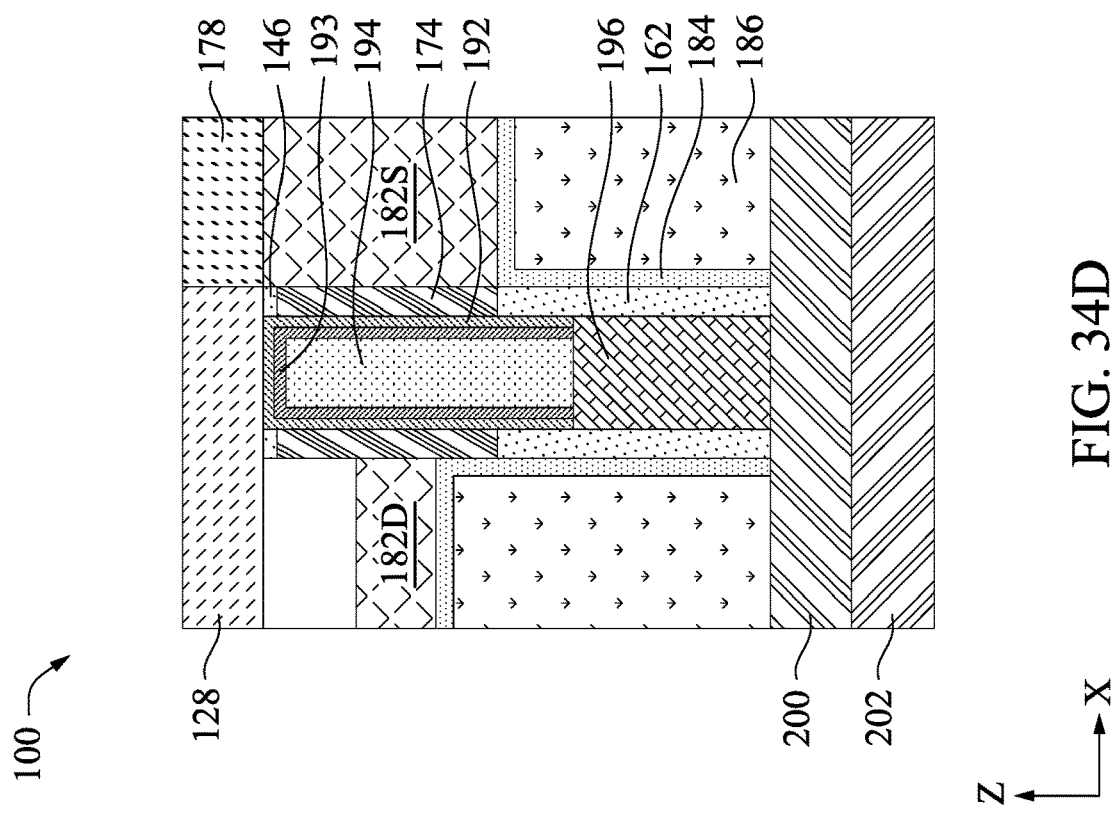
Figure 34C:
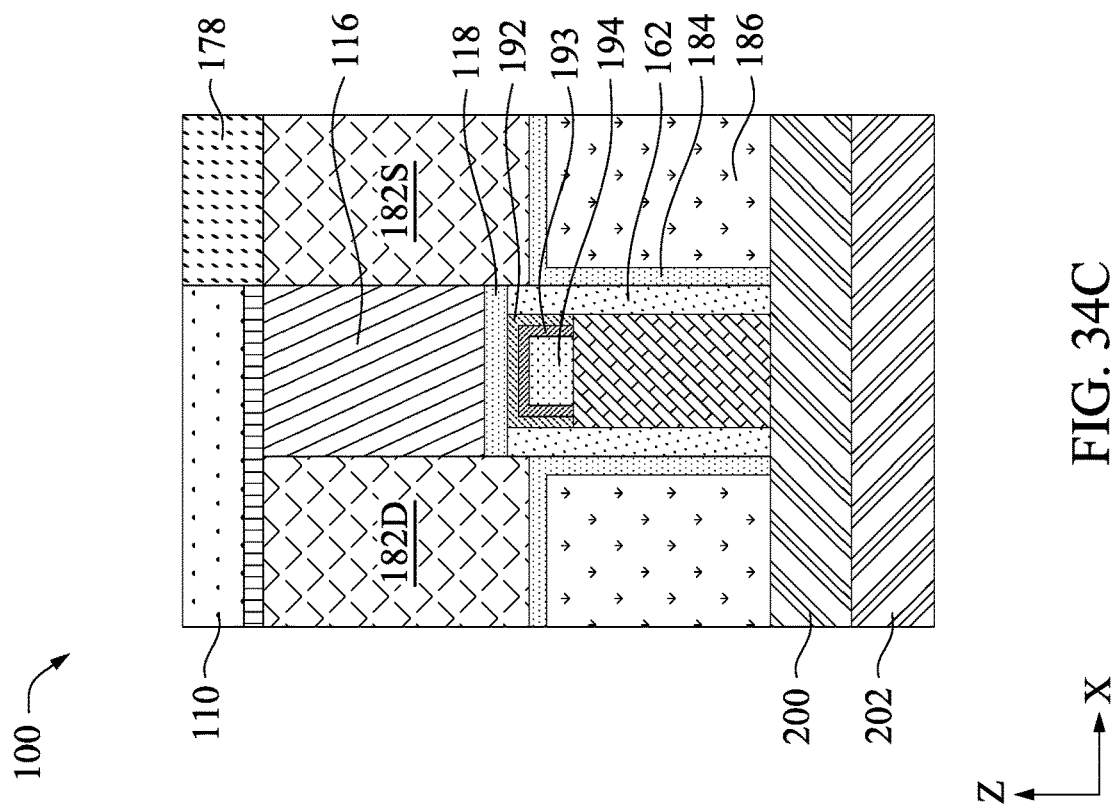

FIG. 33 is a cross-sectional side view of one of various stages of manufacturing the semiconductor device structure 100, in accordance with some embodiments. FIGS. 34A-34D are cross-sectional side views of the stage of manufacturing the semiconductor device structure 100 of FIG. 31 taken along lines A-A, B-B, C-C, D-D of FIG. 10, respectively, in accordance with some embodiments. As shown in FIGS. 31 and 32A-32D, the semiconductor device structure 100 is flipped over, and the substrate 102 is removed. The removal of the substrate 102 may be any suitable process, such as CMP, mechanical grinding, wet etch, dry etch, or combinations thereof. After the removal of the substrate 102, the spacer 128, the sacrificial semiconductor layers 110, and the sacrificial semiconductor materials 178 are exposed.

Figure 35C:
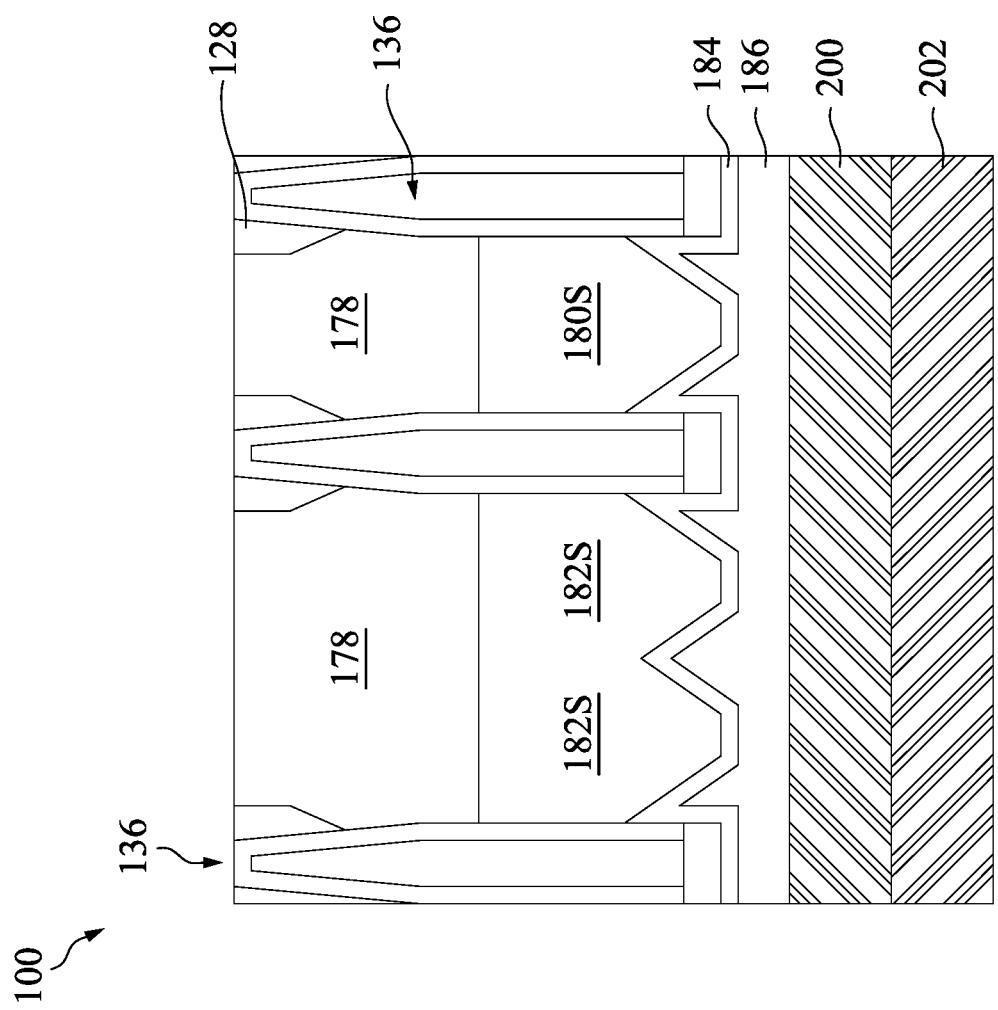
Figure 36B:
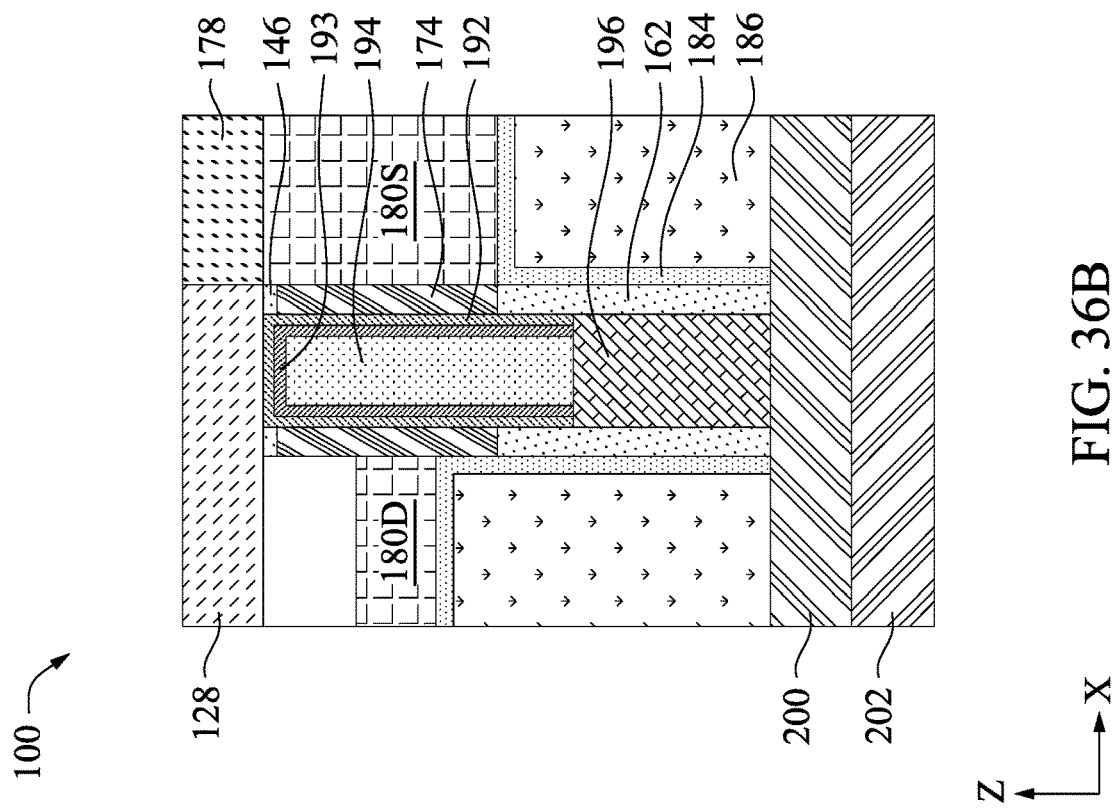
FIGS. 36A-36D are cross-sectional side views of the stage of manufacturing the semiconductor device structure of FIGS. 35A-35C taken along lines A-A, B-B, C-C, D-D of FIG. 10, respectively, in accordance with some embodiments.
Figure 36A:
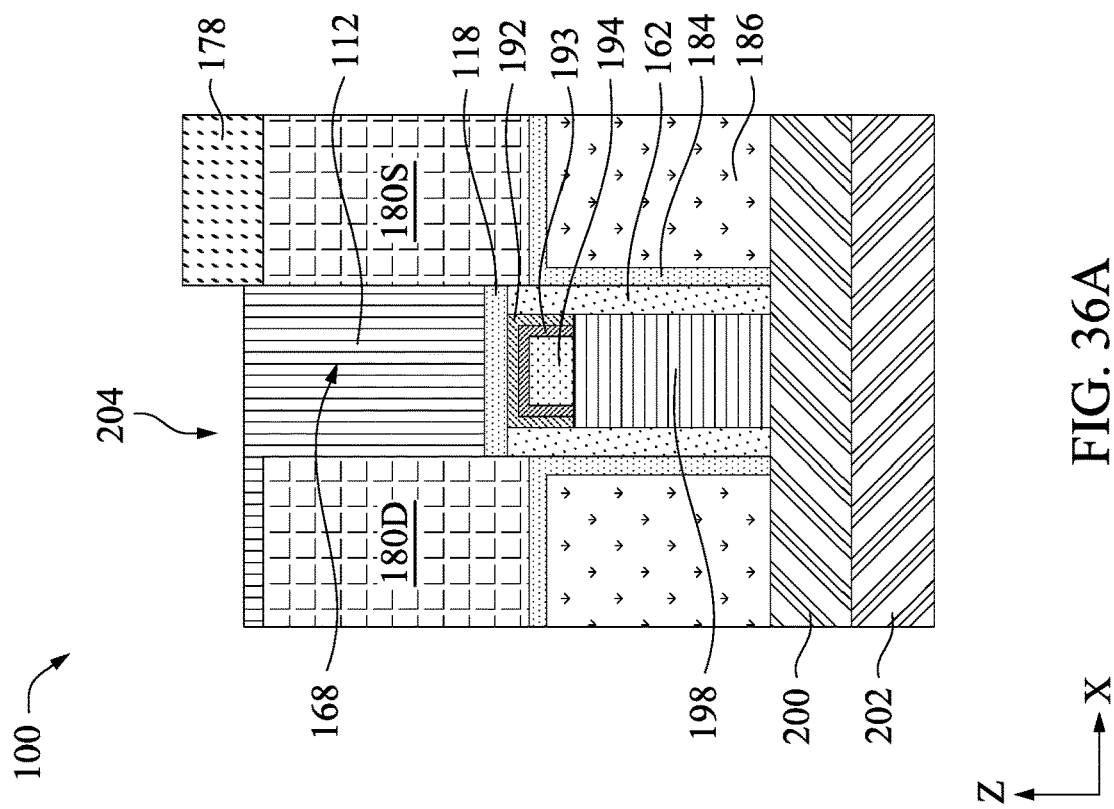
Figure 36D:
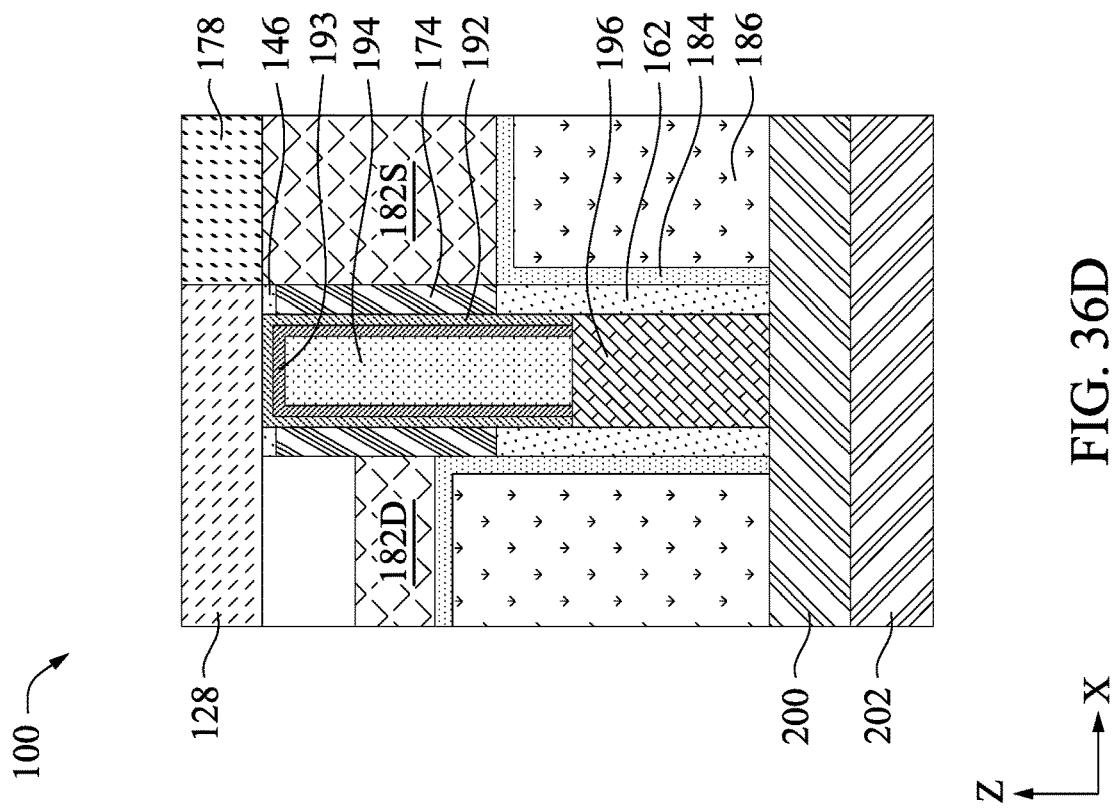
Figure 36C:
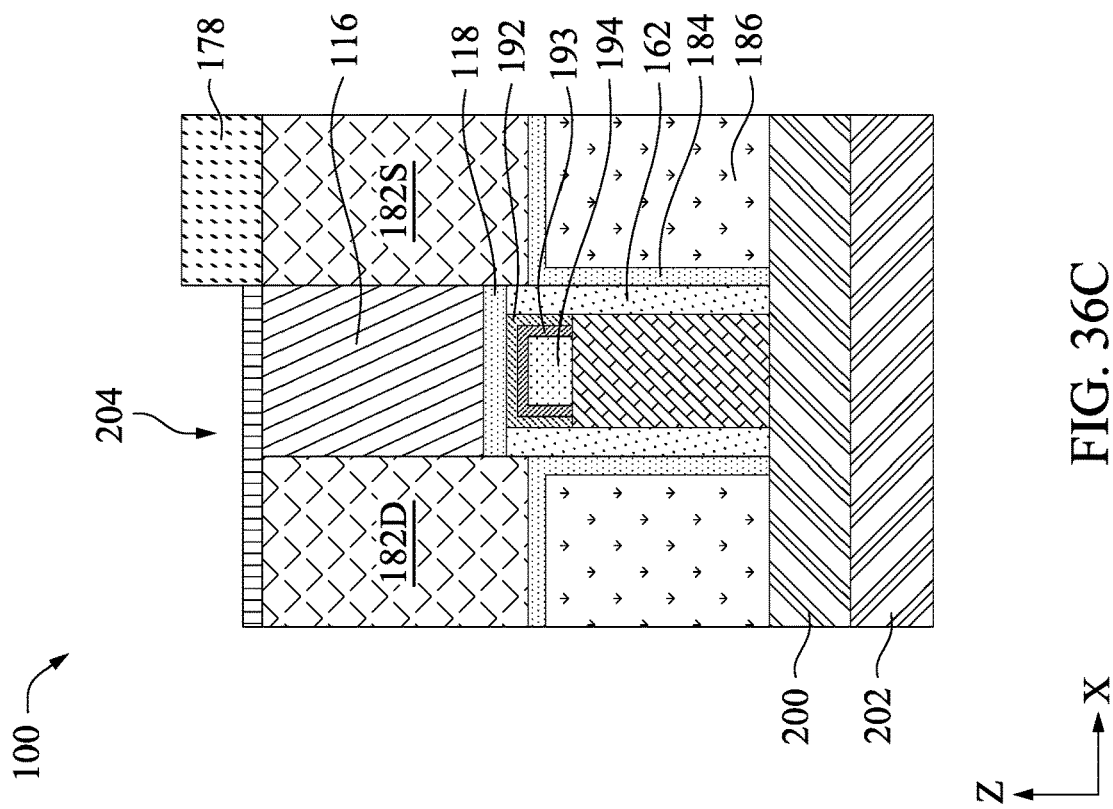

FIGS. 35A-35C are cross-sectional side views of one of various stages of manufacturing the semiconductor device structure 100, in accordance with some embodiments. FIGS. 36A-36D are cross-sectional side views of the stage of manufacturing the semiconductor device structure 100 of FIGS. 35A-35C taken along lines A-A, B-B, C-C, D-D of FIG. 10, respectively, in accordance with some embodiments. As shown in FIGS. 35A-35C and 36A-36D, the sacrificial semiconductor layers 110 are removed, exposing the semiconductor layers 112. The sacrificial semiconductor layers 110 may be removed by any suitable processes, such as dry etch, wet etch, or a combination thereof. In some embodiments, the etch process may be a selective etch process that removes the sacrificial semiconductor layers 110 but not the spacer 128, the semiconductor layers 112, and the sacrificial semiconductor materials 178. Because the removal of the sacrificial semiconductor layers 110 is selective, processes such as forming and patterning a mask are not needed. The semiconductor layers 112 protects the semiconductor layers 116 from the etchant used to remove the sacrificial semiconductor layers 110. Openings 204 are formed as the result of the removal of the sacrificial semiconductor layers 110.

Figures 37A, 37B:
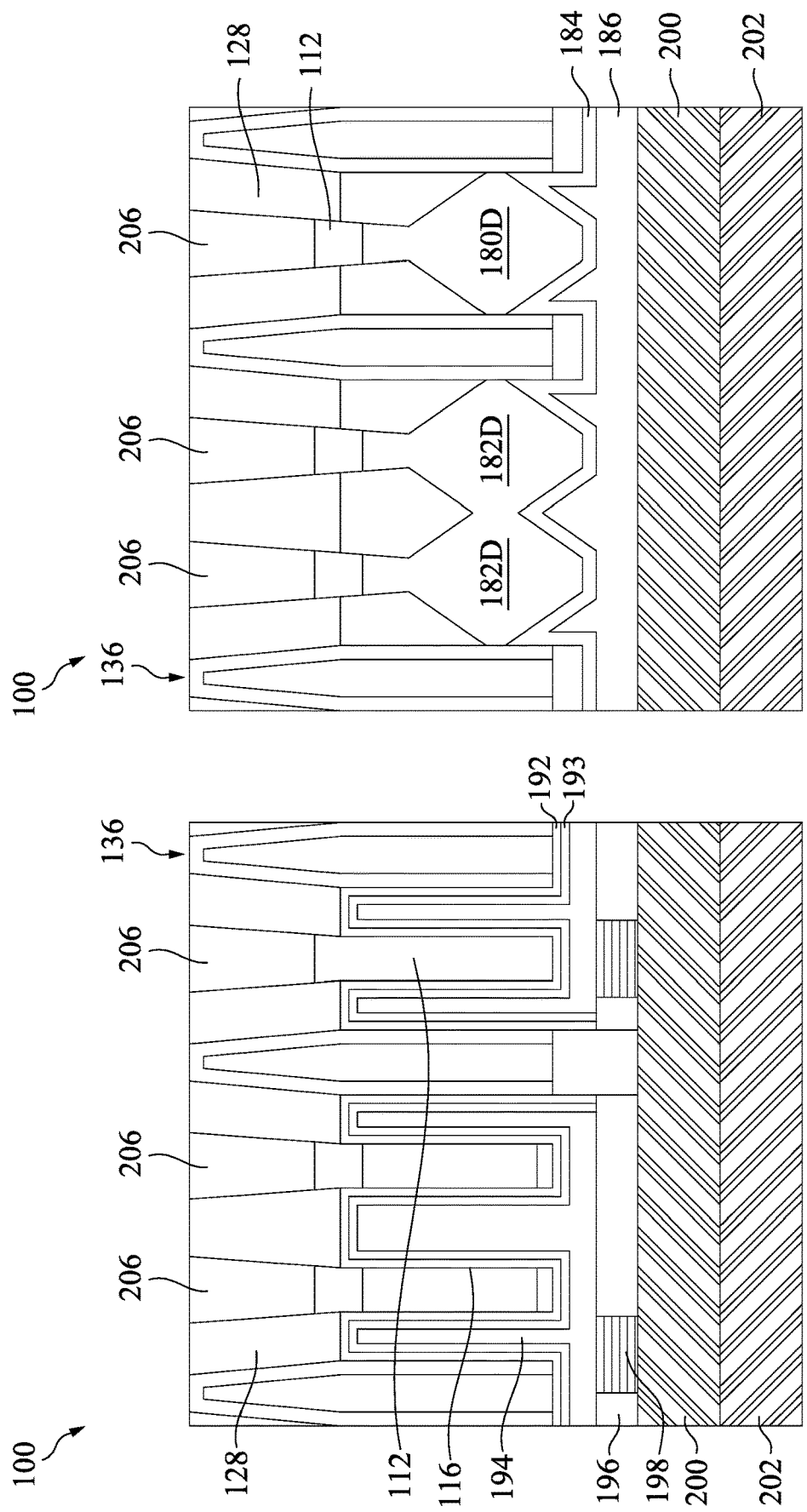
FIGS. 37A-37C are cross-sectional side views of one of various stages of manufacturing the semiconductor device structure, in accordance with some embodiments.
Figure 37C:
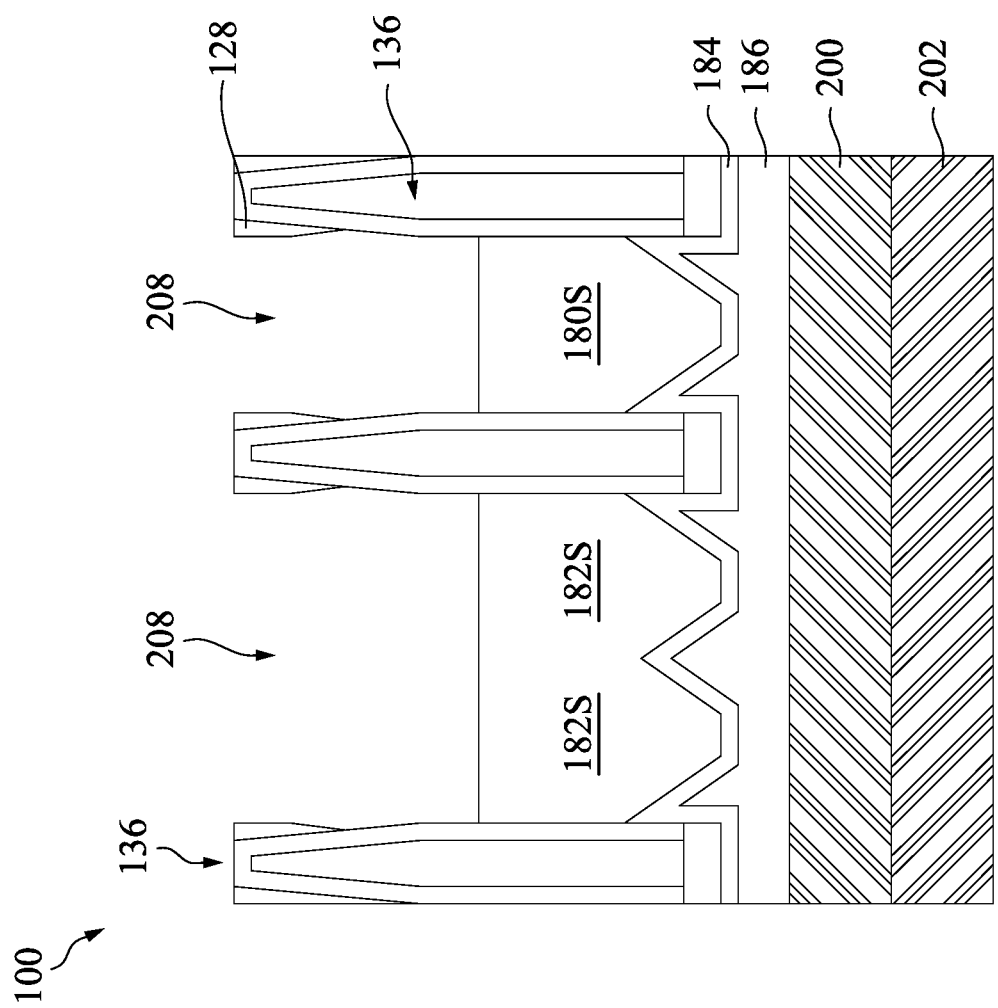
Figure 38B:
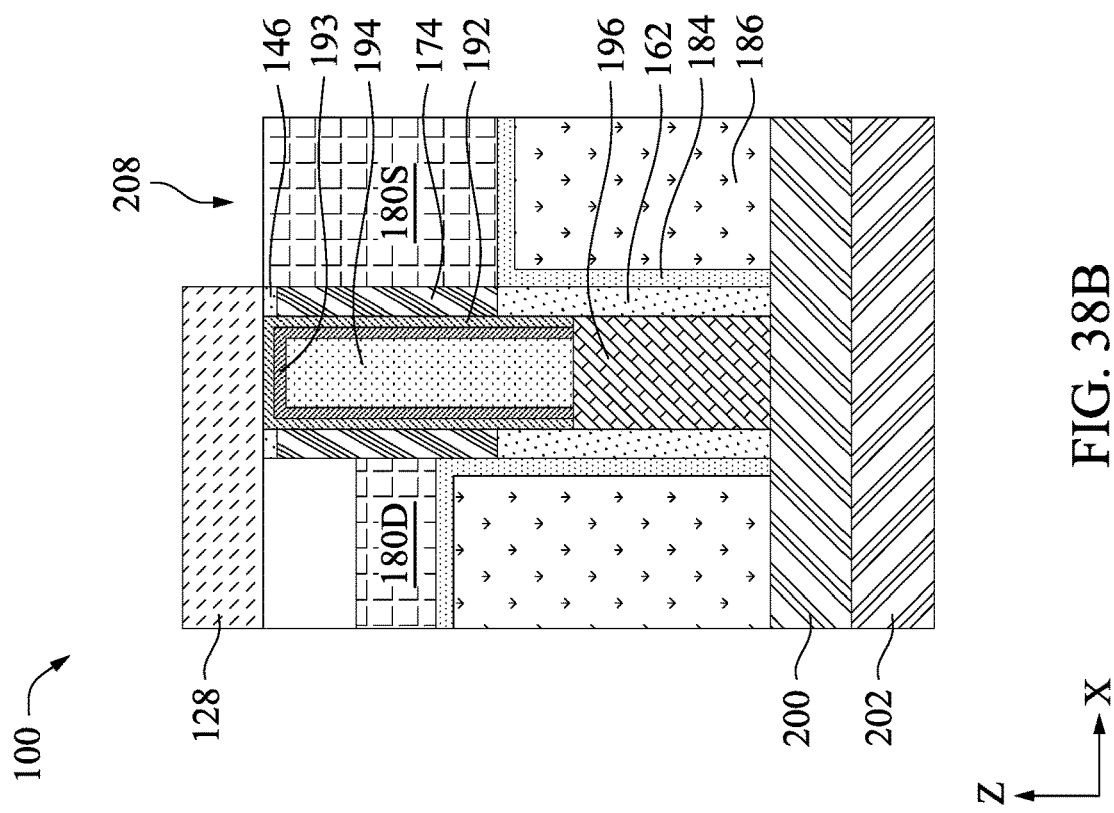
FIGS. 38A-38D are cross-sectional side views of the stage of manufacturing the semiconductor device structure of FIGS. 37A-37C taken along lines A-A, B-B, C-C, D-D of FIG. 10, respectively, in accordance with some embodiments.
Figure 38A:
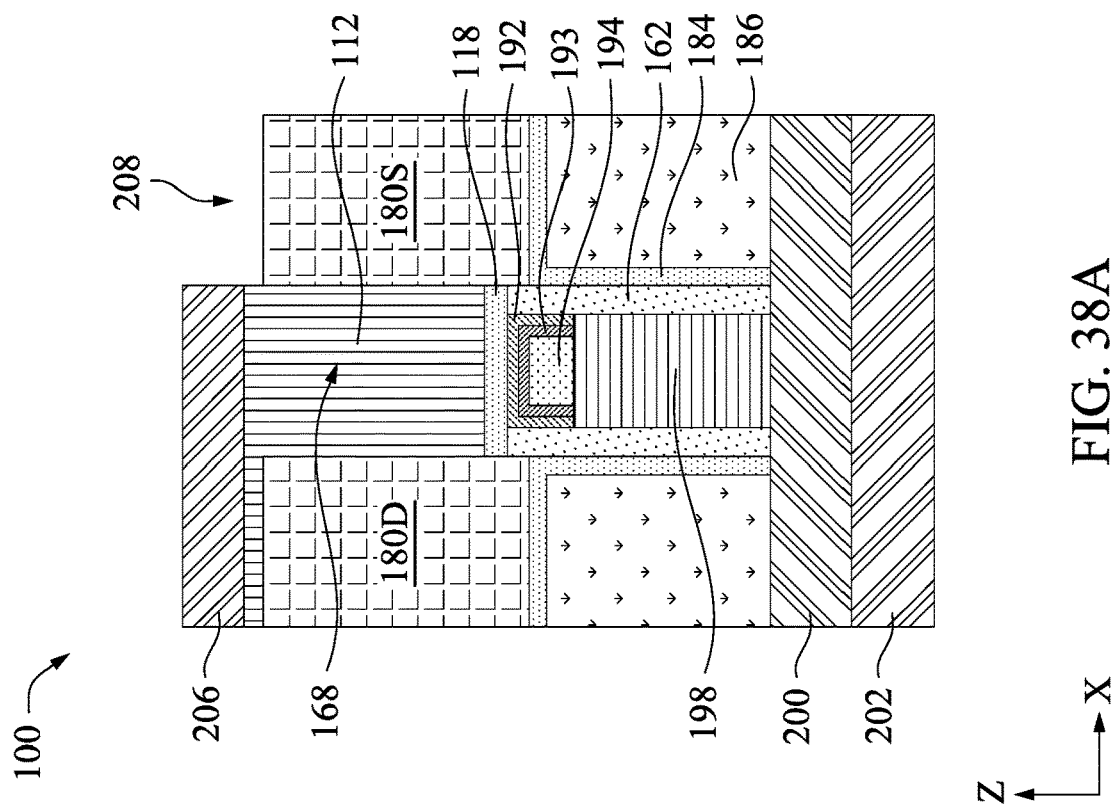
Figure 38D:
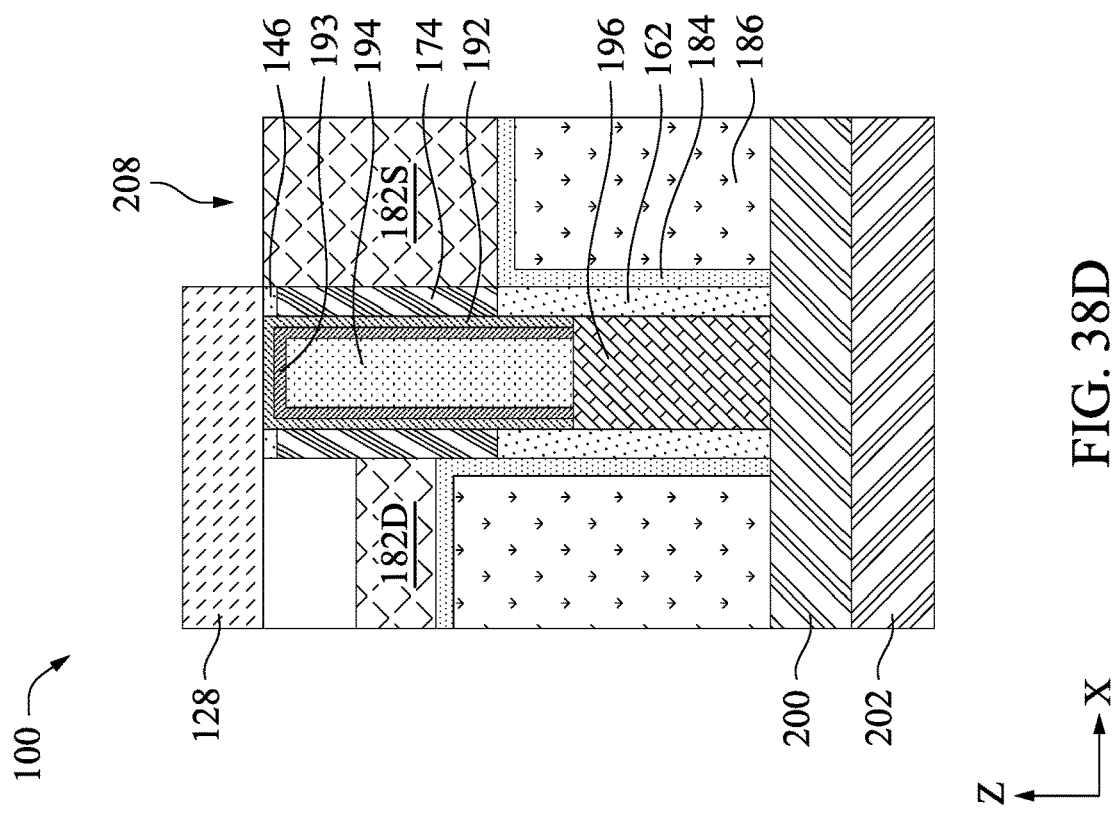
Figure 38C:
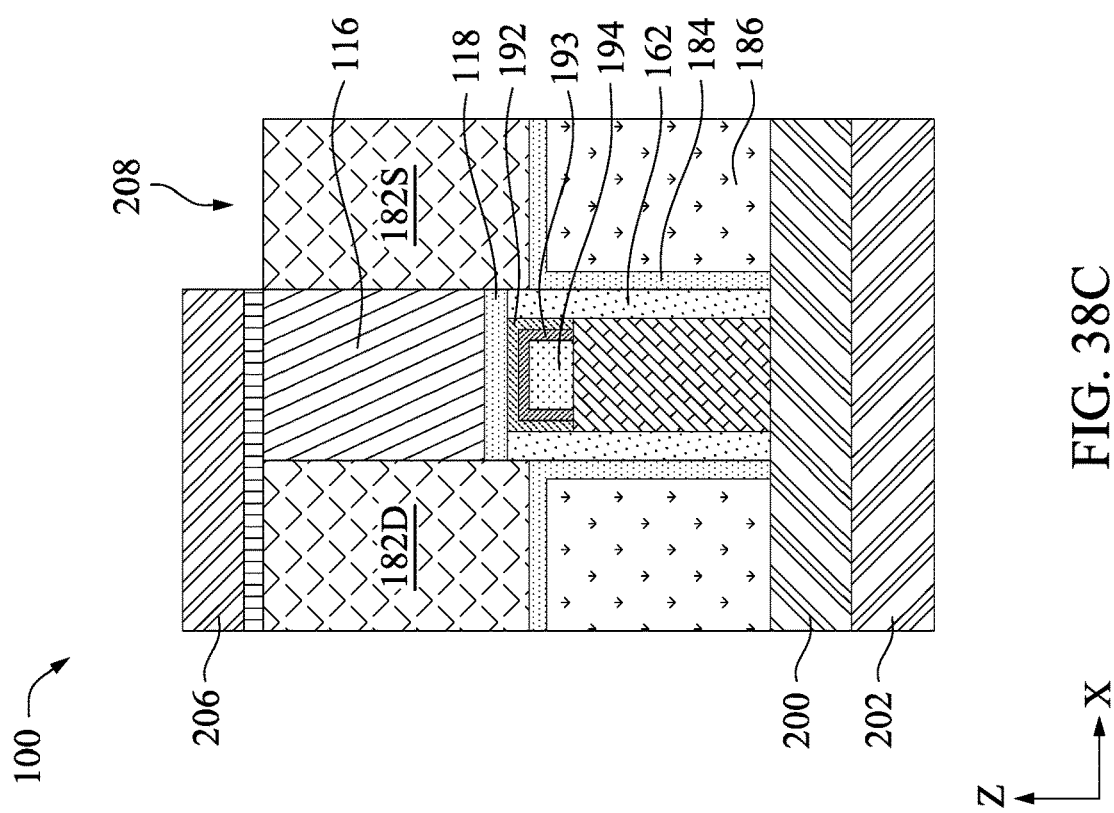

FIGS. 37A-37C are cross-sectional side views of one of various stages of manufacturing the semiconductor device structure 100, in accordance with some embodiments. FIGS. 38A-38D are cross-sectional side views of the stage of manufacturing the semiconductor device structure 100 of FIGS. 37A-37C taken along lines A-A, B-B, C-C, D-D of FIG. 10, respectively, in accordance with some embodiments. As shown in FIGS. 37A-37C and 38A-38D, a dielectric material 206 is formed in each opening 204. The dielectric material 206 may include an oxygen-containing material, such as an oxide. The dielectric material 206 may be formed by any suitable process, such as CVD, FCVD, or PECVD. A planarization process may be performed to remove the dielectric material 206 formed on the sacrificial semiconductor materials 178, and the sacrificial semiconductor materials 178 are exposed as a result of the planarization process. Next, the sacrificial semiconductor materials 178 are removed, as shown in FIGS. 37C and 38A-38D. The sacrificial semiconductor materials 178 may be removed by any suitable processes, such as dry etch, wet etch, or a combination thereof. In some embodiments, the etch process may be a selective etch process that removes the sacrificial semiconductor materials 178 but not the spacer 128 and the dielectric materials 206. In some embodiments, the S/D epitaxial features 180S, 182S may be recessed. Because the removal of the sacrificial semiconductor materials 178 is selective, processes such as forming and patterning a mask are not needed. Openings 208 are formed as the result of the removal of the sacrificial semiconductor materials 178.

Figure 39C:
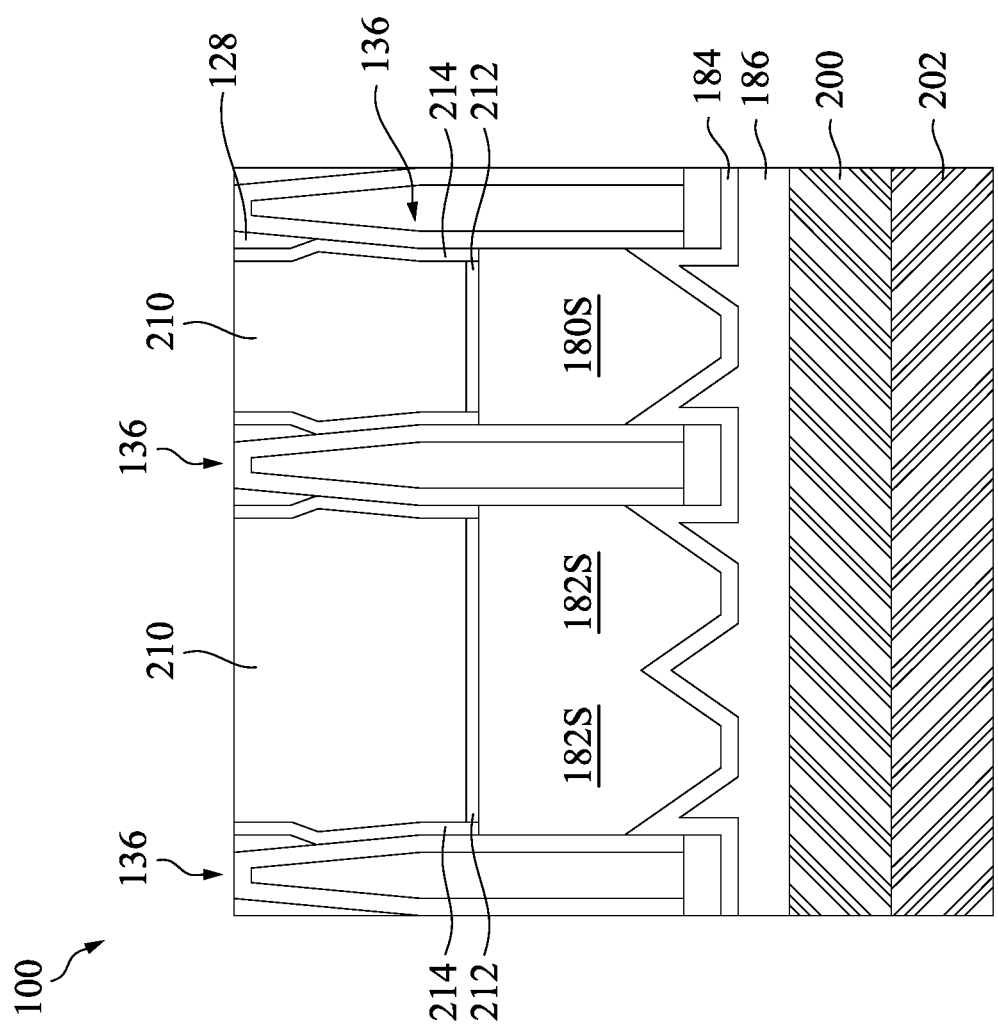
Figure 40D:
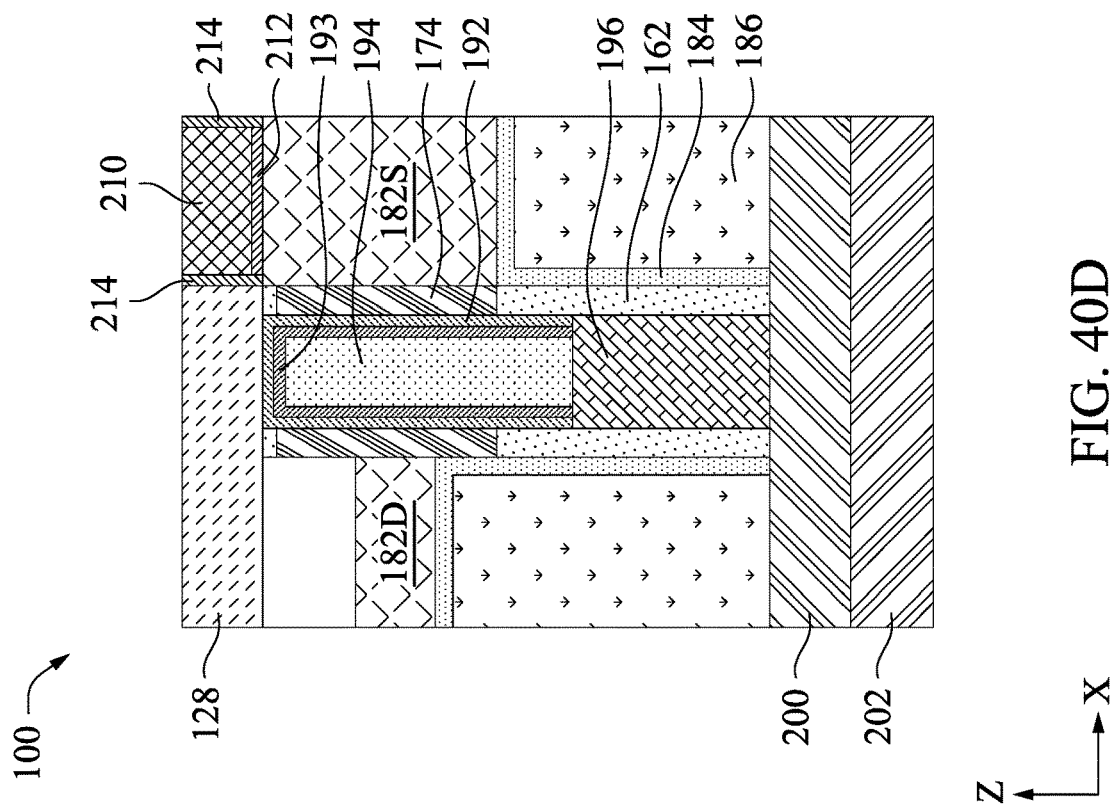
Figure 40C:
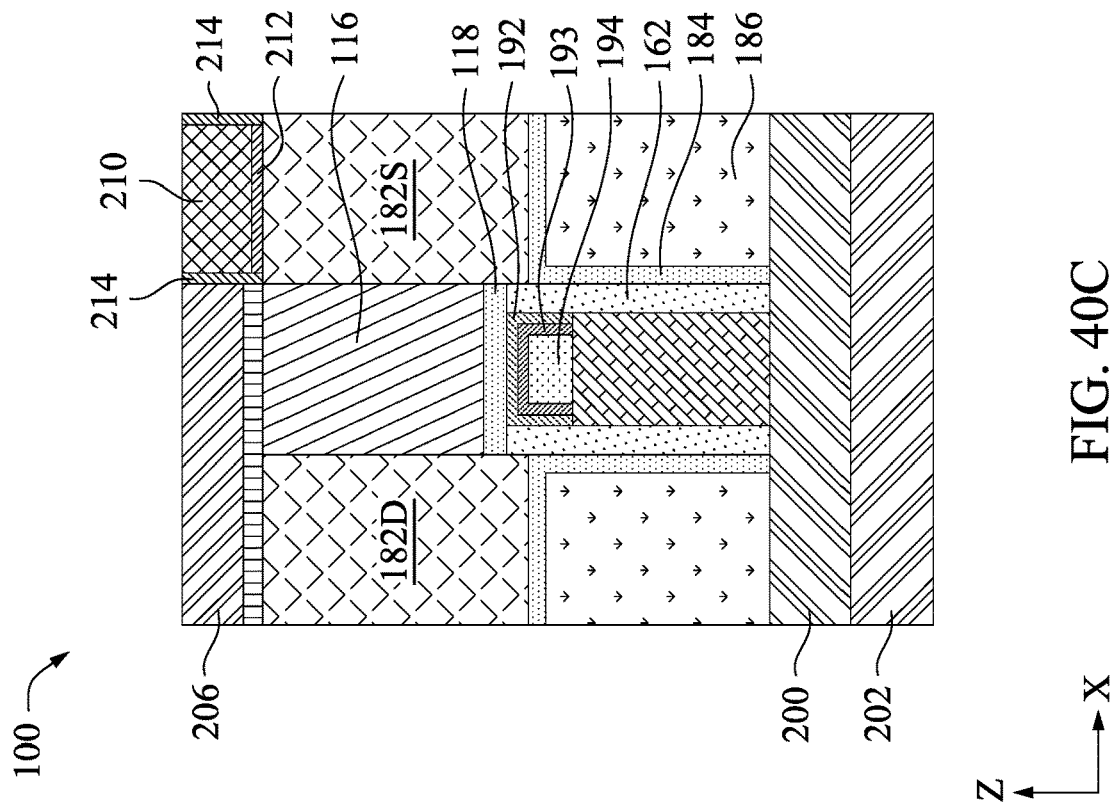
Figure 41B:
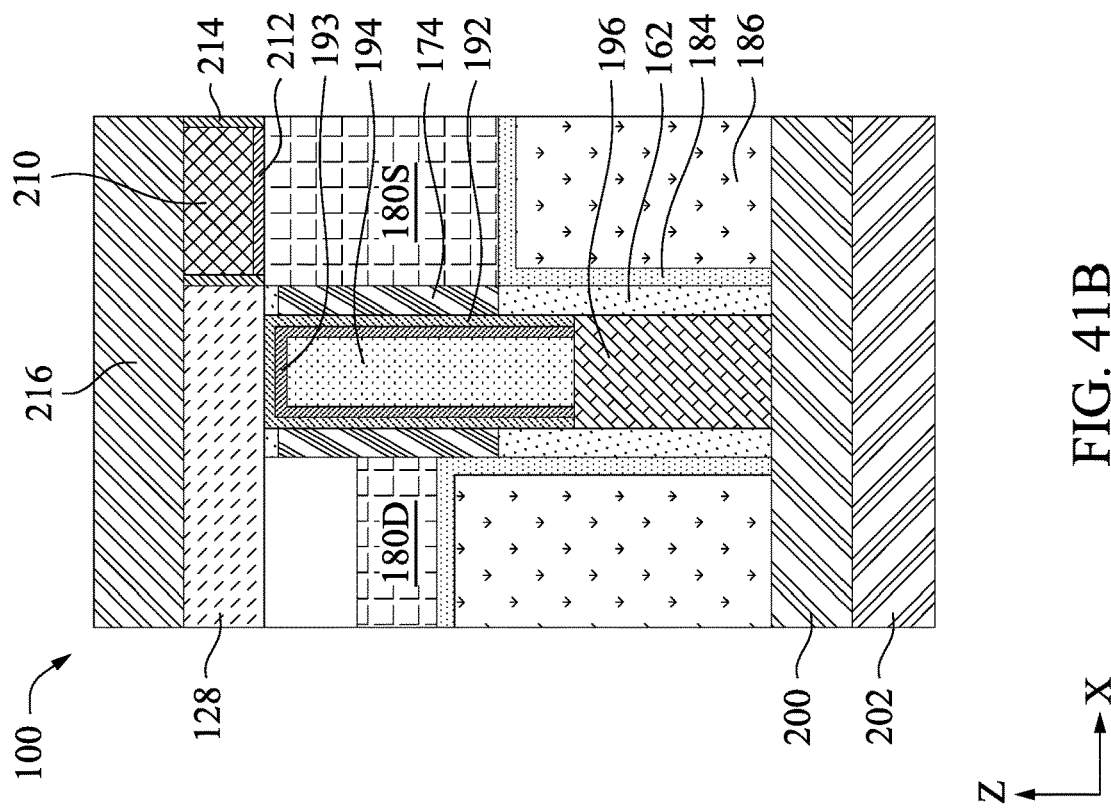
FIGS. 41A-41D are cross-sectional side views of one of various stage of manufacturing the semiconductor device structure taken along lines A-A, B-B, C-C, D-D of FIG. 10, respectively, in accordance with some embodiments.
Figure 41A:
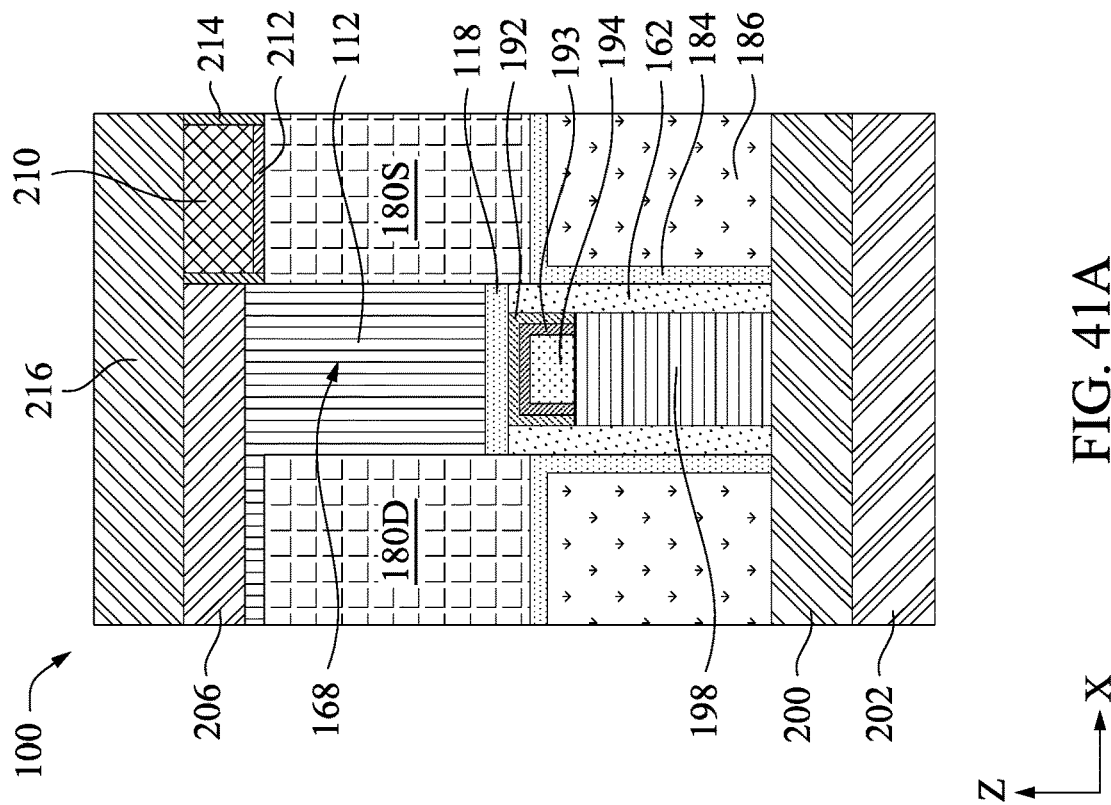
Figure 41D:
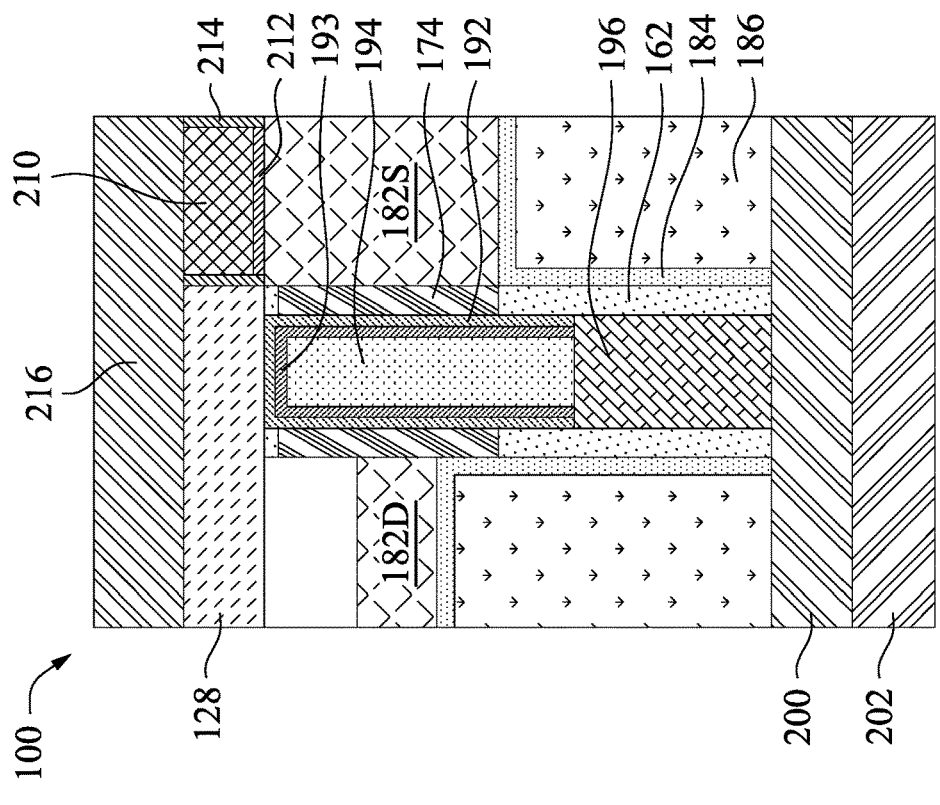
Figure 41C:
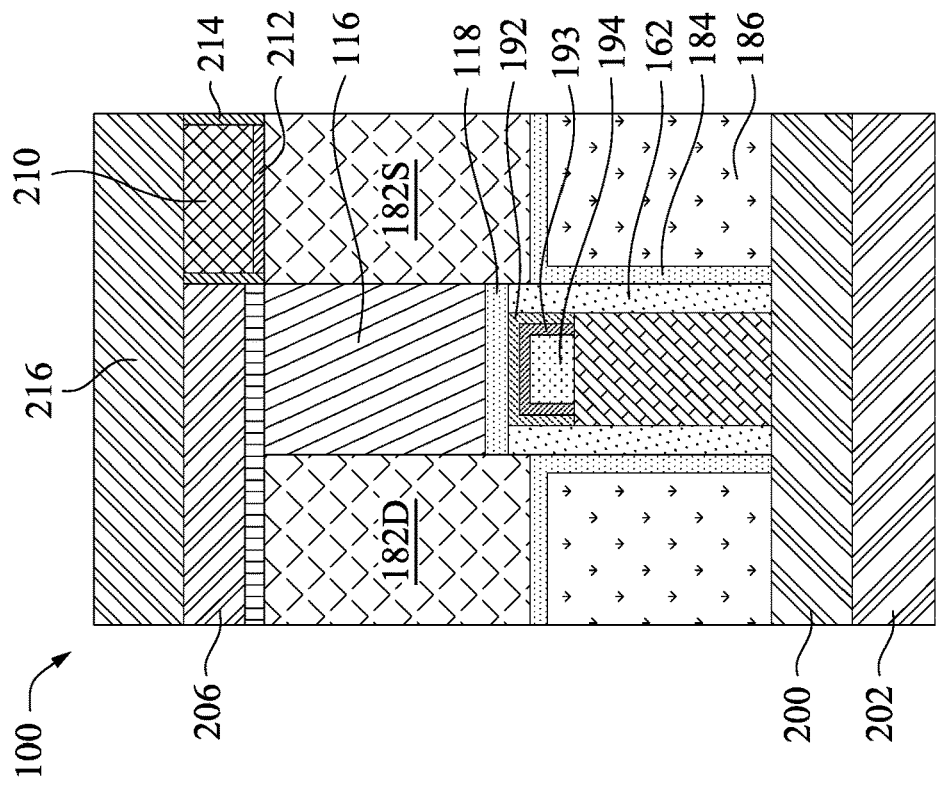

FIGS. 39A-39C are cross-sectional side views of one of various stages of manufacturing the semiconductor device structure 100, in accordance with some embodiments. FIGS. 40A-40D are cross-sectional side views of the stage of manufacturing the semiconductor device structure 100 of FIGS. 39A-39C taken along lines A-A, B-B, C-C, D-D of FIG. 10, respectively, in accordance with some embodiments. As shown in FIG. 39A, each fin 126 includes a first surface 191, a second surface 199 opposite the first surface 191, a third surface 195 connecting the first surface 191 and the second surface 199, and a fourth surface 197 opposite the third surface 195. In some embodiments, the gate electrode layer 194 is disposed adjacent the first surface 191, the third surface 195, and the fourth surface 197, and the dielectric material 206 is in contact with the second surface 199. For the fin 126 with the NFET channel region, the first surface 191 is a surface of the cap layer 118, the second surface is a surface of the semiconductor layer 112, and each third surface 195 and fourth surface 197 includes a surface of the cap layer 118 and a surface of the semiconductor layer 112. For the fin 126 with the PFET channel region, the first surface 191 is a surface of the cap layer 118, the second surface is a surface of the semiconductor layer 112, and each third surface 195 and fourth surface 197 includes a surface of the cap layer 118, a surface of the semiconductor layer 116, and a surface of the semiconductor layer 112.

As shown in FIGS. 39A-39C and 40A-40D, a liner 214 is formed on the sidewalls of each opening 208. The liner 214 may be made of a dielectric material, such as SiN. The liner 214 may be formed by a conformal process, such as an ALD process. The liner 214 may be formed by first forming a blanket conformal layer on the exposed surfaces of the semiconductor device structure 100, followed by an anisotropic etch process to remove portions of the conformal layer formed on the horizontal surfaces, leaving the liner 214 formed on the sidewalls of the openings 208.

Next, a silicide layer 212 is selectively formed on the exposed surface of the S/D epitaxial features 180S, 182S. The silicide layer 212 may include one or more of WSi, CoSi, NiSi, TiSi, MoSi and TaSi. In some embodiments, the silicide layer 212 includes a metal or metal alloy silicide, and the metal includes a noble metal, a refractory metal, a rare earth metal, alloys thereof, or combinations thereof. A conductive feature 210 is then formed in each opening 208 on the silicide layer 212. The conductive feature 210 may include a metal or metal nitride, such as W, Ru, Co, Cu, Ti, TiN, Ta, TaN, Mo, or Ni. The conductive feature 210 may be formed by any suitable process, such as PVD or electroplating. A CMP process may be formed to remove any conductive feature formed on the dielectric materials 206 and the spacer 128.

Next, a power rail 216 is formed on the conductive feature 210, the spacer 128, and the dielectric materials 206, as shown in FIGS. 41A-41D. The power rail 216 may include a conductive material, such as a metal or metal nitride. In some embodiments, the power rail 216 includes W, Ru, Co, Cu, Ti, TiN, Ta, TaN, Mo, or Ni.

Figure 42:
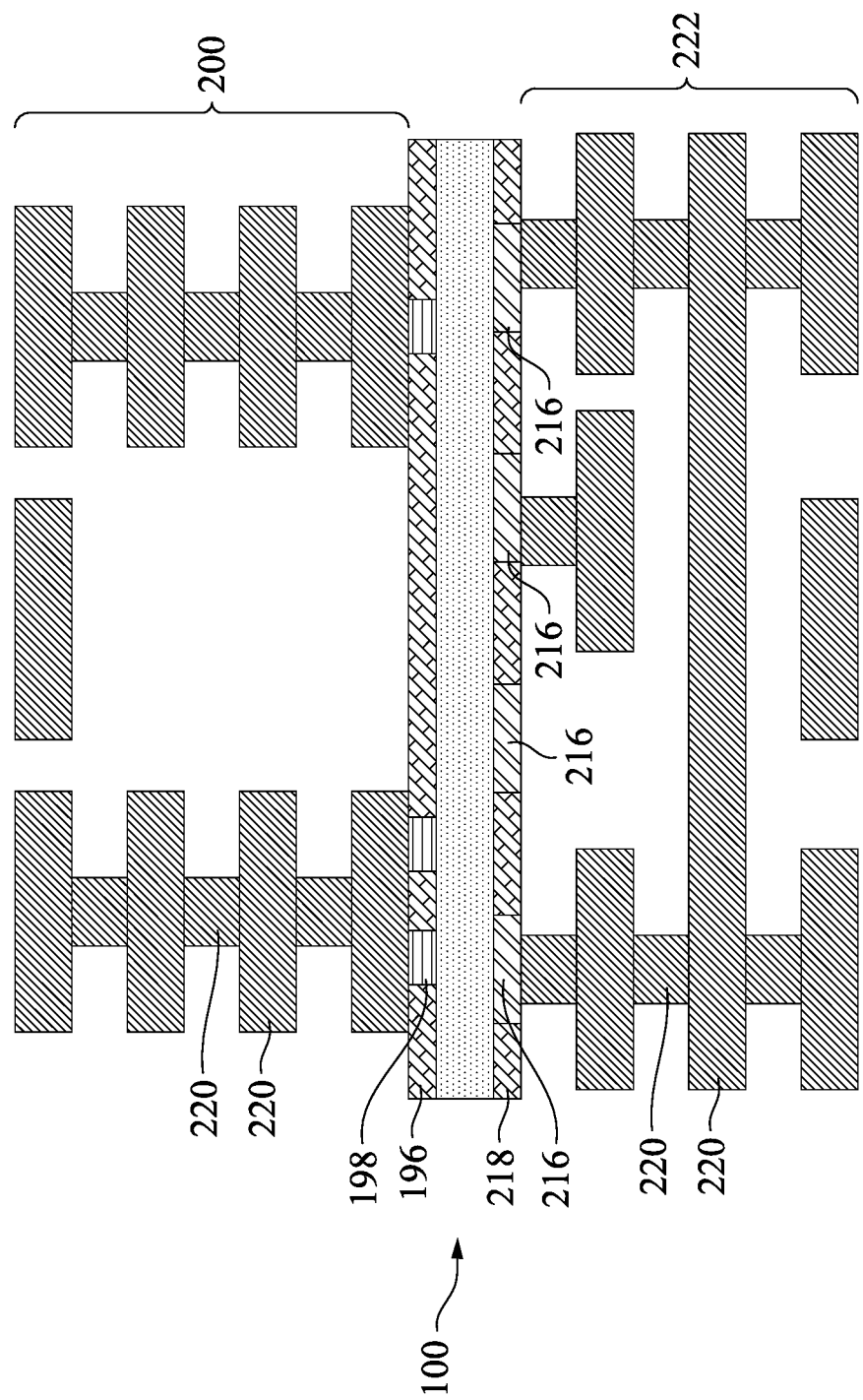
FIG. 42 is a cross-sectional side view of the semiconductor device structure connected to interconnecting structures, in accordance with some embodiments.

FIG. 42 is a cross-sectional side view of the semiconductor device structure 100 connected to interconnecting structures 200, 222, in accordance with some embodiments. As shown in FIG. 42, the semiconductor device structure 100 is connected to interconnecting structures 200, 222 on the front and back sides, respectively. For example, the interconnecting structure 200 is connected to the conductive features 198 on the front side, and the interconnecting structure 222 is connected to the power rails 216 on the back side. The power rails 216 may be formed through a dielectric material 218. Each interconnecting structure 200, 222 includes a plurality of conductive features 220, which may be conductive vias and conductive lines. When the power rails 216 are formed on the backside of the semiconductor device structure 100, conductive features 220 in the back end of line (BEOL) may be manufactured using reduced number of masks with improved performance. Furthermore, the width of gates in FinFETs can be enlarged, and the width of power rails 216 can also be increased.

The present disclosure provides a semiconductor device structure 100 including an inner spacer 174 between the gate electrode layer 194 and the S/D epitaxial feature 180S, 180D, 182S, or 182D. The inner spacer 174 is the result of having the sacrificial semiconductor material 148 formed adjacent the fins 126 instead of the conventional sacrificial gate electrode layer. The semiconductor device structure 100 further includes the power rail 216 formed on the back side of the semiconductor structure 100. The power rail may be connected to the S/D epitaxial features 180S, 182S via conductive features 210. Some embodiments may achieve advantages. For example, the dimensions of the sacrificial semiconductor material 148 are smaller than those of the conventional sacrificial gate electrode layers, leading to gate electrode layers 194 having smaller dimensions than those of the conventional gate electrode layers. With the gate electrode layers having smaller dimensions adjacent each fin, device density is increased. Furthermore, when the power rails 216 are formed on the backside of the semiconductor device structure 100, conductive features 220 in the back end of line (BEOL) may be manufactured using reduced number of masks with improved performance.

An embodiment is a semiconductor device structure. The semiconductor device structure includes a semiconductor fin including a first surface, a second surface opposite the first surface, a third surface connecting the first surface and the second surface, and a fourth surface opposite the third surface. The semiconductor device structure further includes a gate electrode layer disposed adjacent the first, third, and fourth surfaces of the semiconductor fin, a first source/drain epitaxial feature in contact with the semiconductor fin, and a first inner spacer disposed between the first source/drain epitaxial feature and the gate electrode layer. The first inner spacer is in contact with the first source/drain epitaxial feature, and the first inner spacer comprises a first material. The semiconductor device structure further includes a first spacer in contact with the first inner spacer, and the first spacer comprises a second material different from the first material.

Another embodiment is a semiconductor device structure. The semiconductor device structure includes a first semiconductor fin comprising a first surface, a second surface opposite the first surface, a third surface connecting the first surface and the second surface, and a fourth surface opposite the third surface. The semiconductor device structure further includes a first gate electrode layer disposed adjacent the first, third, and fourth surfaces of the first semiconductor fin, and a second semiconductor fin comprising a first surface, a second surface opposite the first surface, a third surface connecting the first surface and the second surface, and a fourth surface opposite the third surface. The semiconductor device structure further includes a second gate electrode layer disposed adjacent the first, third, and fourth surfaces of the second semiconductor fin, a dielectric feature disposed between the first gate electrode layer and the second gate electrode layer, a first source/drain epitaxial feature in contact with the first semiconductor fin, and a first inner spacer disposed between the first source/drain epitaxial feature and the first gate electrode layer. The first inner spacer is in contact with the first source/drain epitaxial feature, and the first inner spacer comprises a first material. The semiconductor device structure further includes a first spacer in contact with the first inner spacer, and the first spacer comprises a second material different from the first material. The semiconductor device structure further includes a second source/drain epitaxial feature in contact with the second semiconductor fin, a second inner spacer disposed between the second source/drain epitaxial feature and the second gate electrode layer, and the second inner spacer is in contact with the second source/drain epitaxial feature, and wherein the second inner spacer comprises the first material. The semiconductor device structure further includes a second spacer in contact with the second inner spacer, wherein the second spacer comprises the second material.

A further embodiment is a method. The method includes forming a semiconductor fin, forming a first spacer on the semiconductor fin, recessing the first spacer to form a first opening, forming a first sacrificial semiconductor material in the first opening, and forming a sacrificial gate stack over a first portion of the semiconductor fin and a first portion of the first sacrificial semiconductor material. A second portion of the semiconductor fin and a second portion of the first sacrificial semiconductor material are exposed. The method further includes forming second spacers on sidewalls of the sacrificial gate stack, removing end portions of the sacrificial semiconductor material to form gaps, and forming inner spacers in the gaps, wherein each inner spacer is in contact with a corresponding second spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   forming a semiconductor fin;
   forming a first spacer on the semiconductor fin;
   recessing the first spacer to form a first opening;
   forming a first sacrificial semiconductor material in the first opening;
   forming a sacrificial gate stack over a first portion of the semiconductor fin and a first portion of the first sacrificial semiconductor material, wherein a second portion of the semiconductor fin and a second portion of the first sacrificial semiconductor material are exposed;
   forming second spacers on sidewalls of the sacrificial gate stack;
   removing end portions of the sacrificial semiconductor material to form gaps; and
   forming inner spacers in the gaps, wherein each inner spacer is in contact with a corresponding second spacer.

2. The method of claim 1, further comprising:
   removing the exposed second portion of the first sacrificial semiconductor material;
   recessing the exposed second portion of the semiconductor fin to expose a semiconductor layer;
   forming a second sacrificial semiconductor material on the exposed semiconductor layer; and
   forming a source/drain epitaxial feature on the second sacrificial semiconductor material.

3. The method of claim 2, further comprising:
   removing the sacrificial gate stack;
   removing the first sacrificial semiconductor material to form a second opening; and
   forming a gate electrode layer in the second opening.

4. The method of claim 3, further comprising:
   flipping over the semiconductor device structure;
   removing a portion of the semiconductor fin to expose the second sacrificial semiconductor material;

removing the second sacrificial semiconductor material to form a third opening; and
forming a conductive feature in the third opening.

5. A method for forming a semiconductor device structure, comprising:
forming a semiconductor fin;
forming a sacrificial semiconductor material adjacent the semiconductor fin;
forming a sacrificial gate stack over a first portion of the semiconductor fin and a first portion of the sacrificial semiconductor material;
removing a second portion of the sacrificial semiconductor material;
recessing a second portion of the semiconductor fin;
removing end portions of the sacrificial semiconductor material to form first and second gaps;
forming a first inner spacer in the first gap and a second inner spacer in the second gap, wherein the first and second inner spacers are disposed on opposite sides of the sacrificial semiconductor material;
removing the sacrificial gate stack; and
removing the sacrificial semiconductor material, wherein the first and second inner spacers are exposed.

6. The method of claim 5, further comprising forming a dielectric feature adjacent the semiconductor fin prior to forming the sacrificial semiconductor material, wherein the sacrificial semiconductor material is formed between the semiconductor fin and the dielectric feature.

7. The method of claim 6, wherein the forming the dielectric feature comprises:
forming a liner;
forming a low-K dielectric material on the liner;
recessing the liner and the low-K dielectric material; and
forming a high-K dielectric material on the liner and the low-K dielectric material.

8. The method of claim 7, wherein the sacrificial gate stack is formed over a first portion of the high-K dielectric material.

9. The method of claim 8, further comprising removing a portion of a second portion of the high-K dielectric material not covered by the sacrificial gate stack.

10. The method of claim 5, further comprising forming a first source/drain epitaxial feature in contact with the first inner spacer and forming a second source/drain epitaxial feature in contact with the second inner spacer.

11. The method of claim 10, wherein the first and second source/drain epitaxial features are in contact with the first portion of the semiconductor fin.

12. A method for forming a semiconductor device structure, comprising:
forming a semiconductor fin;
forming a first spacer embedding the semiconductor fin;
recessing the first spacer;
forming a liner on the first spacer;
forming a first sacrificial semiconductor material on the first spacer adjacent the semiconductor fin;
forming a sacrificial gate stack over a first portion of the semiconductor fin and a first portion of the first sacrificial semiconductor material;
forming second spacers on sidewalls of the sacrificial gate stack;
removing a second portion of the first sacrificial semiconductor material to expose an end portion of the first sacrificial semiconductor material, wherein the end portion of the first sacrificial semiconductor material has a flat surface that is flush with a surface of a corresponding second spacer; and
removing the end portion of the sacrificial semiconductor material to form first and second gaps.

13. The method of claim 12, further comprising forming a dielectric feature on the first spacer prior to recessing the first spacer.

14. The method of claim 13, wherein the dielectric feature comprises a low-K dielectric material and a high-K dielectric material disposed on the low-K dielectric material.

15. The method of claim 14, wherein the liner and first sacrificial semiconductor material is formed between the dielectric feature and the semiconductor fin.

16. The method of claim 14, further comprising recessing the first sacrificial semiconductor material to a same level of the low-K dielectric material, wherein a top surface of the first sacrificial semiconductor material and a top surface of the low-K dielectric material are coplanar.

17. The method of claim 16, wherein the forming the sacrificial gate stack comprises:
forming a sacrificial gate dielectric layer on the top surface of the first sacrificial semiconductor material and on top and side surfaces of the high-K dielectric material; and
forming a sacrificial gate electrode layer on the sacrificial gate dielectric layer.

18. The method of claim 12, wherein the semiconductor fin comprises a second sacrificial semiconductor material.

19. The method of claim 18, further comprising removing a portion of the second sacrificial semiconductor material not covered by the sacrificial gate stack and the second spacers, wherein a portion of a semiconductor layer is exposed.

20. The method of claim 19, further comprising forming a third sacrificial semiconductor material on the exposed portion of the semiconductor layer.

* * * * *